(12) United States Patent
Yamazaki et al.

(10) Patent No.: US 8,363,452 B2
(45) Date of Patent: Jan. 29, 2013

(54) SEMICONDUCTOR DEVICE

(75) Inventors: Shunpei Yamazaki, Tokyo (JP); Jun Koyama, Kanagawa (JP); Kiyoshi Kato, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 267 days.

(21) Appl. No.: 12/917,564

(22) Filed: Nov. 2, 2010

(65) Prior Publication Data

US 2011/0134683 A1    Jun. 9, 2011

(30) Foreign Application Priority Data

Nov. 6, 2009 (JP) .................. 2009-255536
Nov. 20, 2009 (JP) .................. 2009-264572

(51) Int. Cl.
*G11C 11/24* (2006.01)
(52) U.S. Cl. ............ 365/149; 365/72; 365/63; 365/145; 365/189.09; 365/189.11; 365/230.6; 365/227
(58) Field of Classification Search .............. 365/149, 365/72, 63, 145, 189.09, 189.11, 230.06, 365/227
See application file for complete search history.

(56) References Cited

U.S. PATENT DOCUMENTS

| | | | |
|---|---|---|---|
| 4,466,081 A | 8/1984 | Masuoka | |
| 5,349,366 A | 9/1994 | Yamazaki et al. | |
| 5,428,238 A | 6/1995 | Hayashi et al. | |
| 5,506,436 A | 4/1996 | Hayashi et al. | |
| 5,576,571 A | 11/1996 | Hayashi et al. | |
| 5,578,852 A | 11/1996 | Hayashi et al. | |
| 5,578,853 A | 11/1996 | Hayashi et al. | |
| 5,581,106 A | 12/1996 | Hayashi et al. | |
| 5,712,817 A | 1/1998 | Suh | |
| 5,731,856 A | 3/1998 | Kim et al. | |

(Continued)

FOREIGN PATENT DOCUMENTS

| | | |
|---|---|---|
| EP | 0 601 590 A2 | 6/1994 |
| EP | 0 971 360 A1 | 1/2000 |
| EP | 1 737 044 A1 | 12/2006 |
| EP | 2 226 847 A2 | 9/2010 |

(Continued)

OTHER PUBLICATIONS

Ishii, T et al., "A Poly-Silicon TFT With a Sub-5-nm Thick Channel for Low-Power Gain Cell Memory in Mobile Applications," IEEE Transactions on Electron Devices, Nov. 1, 2004, vol. 51, No. 11, pp. 1805-1810.

(Continued)

*Primary Examiner* — Connie Yoha
(74) *Attorney, Agent, or Firm* — Fish & Richardson P.C.

(57) ABSTRACT

Disclosed is a semiconductor device functioning as a multi-valued memory device including: memory cells connected in series; a driver circuit selecting a memory cell and driving a second signal line and a word line; a driver circuit selecting any of writing potentials and outputting it to a first signal line; a reading circuit comparing a potential of a bit line and a reference potential; and a potential generating circuit generating the writing potential and the reference potential. One of the memory cells includes: a first transistor connected to the bit line and a source line; a second transistor connected to the first and second signal line; and a third transistor connected to the word line, bit line, and source line. The second transistor includes an oxide semiconductor layer. A gate electrode of the first transistor is connected to one of source and drain electrodes of the second transistor.

23 Claims, 32 Drawing Sheets

U.S. PATENT DOCUMENTS

| | | | |
|---|---|---|---|
| 5,744,864 A | 4/1998 | Cillessen et al. | |
| 6,127,702 A | 10/2000 | Yamazaki et al. | |
| 6,294,274 B1 | 9/2001 | Kawazoe et al. | |
| 6,563,174 B2 | 5/2003 | Kawasaki et al. | |
| 6,570,206 B1 | 5/2003 | Sakata et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,068,546 B2 * | 6/2006 | Schneider et al. | 365/189.09 |
| 7,105,868 B2 | 9/2006 | Nause et al. | |
| 7,211,825 B2 | 5/2007 | Shih et al | |
| 7,262,985 B2 * | 8/2007 | Sakai | 365/145 |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,791,074 B2 | 9/2010 | Iwasaki | |
| 7,821,329 B2 * | 10/2010 | Kwon | 327/536 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0002590 A1 | 1/2009 | Kimura | |
| 2009/0045397 A1 | 2/2009 | Iwasaki | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0097838 A1 | 4/2010 | Tanaka et al. | |
| 2010/0109002 A1 | 5/2010 | Itagaki et al. | |
| 2010/0148171 A1 | 6/2010 | Hayashi et al. | |
| 2010/0193785 A1 | 8/2010 | Kimura | |
| 2010/0276689 A1 | 11/2010 | Iwasaki | |
| 2010/0279462 A1 | 11/2010 | Iwasaki | |
| 2011/0101334 A1 | 5/2011 | Yamazaki et al. | |
| 2011/0101339 A1 | 5/2011 | Yamazaki et al. | |
| 2011/0101351 A1 | 5/2011 | Yamazaki | |
| 2011/0110145 A1 | 5/2011 | Yamazaki et al. | |
| 2011/0122670 A1 | 5/2011 | Yamazaki et al. | |

FOREIGN PATENT DOCUMENTS

| | | |
|---|---|---|
| JP | 57-105889 A | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-119298 A | 5/1993 |
| JP | 05-251705 A | 9/1993 |
| JP | 07-099251 A | 4/1995 |
| JP | 08-264794 A | 10/1996 |
| JP | 08-330445 A | 12/1996 |
| JP | 10-284696 A | 10/1998 |
| JP | 11-505377 A | 5/1999 |
| JP | 2000-044236 A | 2/2000 |
| JP | 2000-150900 A | 5/2000 |
| JP | 2001-351386 A | 12/2001 |
| JP | 2002-076356 A | 3/2002 |
| JP | 2002-093924 A | 3/2002 |
| JP | 2002-289859 A | 10/2002 |
| JP | 2002-368226 A | 12/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165532 A | 6/2006 |
| JP | 2007-042172 A | 2/2007 |
| JP | 2007-103918 A | 4/2007 |
| JP | 2007-250044 A | 9/2007 |
| JP | 2009-033145 A | 2/2009 |
| JP | 2009-182194 A | 8/2009 |
| WO | 2001/073846 A1 | 10/2001 |
| WO | 2004/114391 A1 | 12/2004 |
| WO | 2007/029844 A1 | 3/2007 |

OTHER PUBLICATIONS

Kim, W et al., "An Experimental High-Density DRAM Cell with a Built-in Gain Stage," IEEE Journal of Solid-State Circuits, Aug. 1, 1994, vol. 29, No. 8, pp. 978-981.

Shukuri, S et al., "A Complementary Gain Cell Technology for Sub-1 V Supply DRAMs," IEDM 92: Technical Digest of International Electron Devices Meeting, Dec. 13, 1992, pp. 1006-1008.

Shukuri, S et al., "A Semi-Static Complementary Gain Cell Technology for Sub-1 V Supply DRAM's," IEEE Transactions on Electron Devices, Jun. 1, 1994, vol. 41, No. 6, pp. 926-931.

International Search Report, PCT Application No. PCT/JP2010/069017, dated Feb. 8, 2011, 4 pages.

Kim, C et al., "Highly Stable Ga2O3-In2O3-ZnO TFT for Active-Matrix Organic Light-Emitting Diode Display Application," IEDM 06: Technical Digest of International Electron Devices Meeting, Dec. 1, 2006, pp. 1-4.

Written Opinion, PCT Application No. PCT/JP2010/069017, dated Feb. 8, 2011, 4 pages.

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al.. "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park. J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park. J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED" AM-FPD '08 Digest of Technical Papers, Jul. 2, 2008, pp. 275-278.

Park. S et al., "Challenge to Future Displays: Transparent AM-OLED Driven by PEALD Grown ZNO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In-Ga-Zn-Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 with Sputtered Al2O3 Gate Insulator," Appl. Phys. Lett. (Applied Physics Letters), Sep. 1, 2003, vol. 83, No. 9, pp. 1755-1757.

Van de Walle, C, "Hydrogen as a Cause of Doping in Zinc Oxide," Phys. Rev. Lett. (Physical Review Letters), Jul. 31, 2000, vol. 85, No. 5, pp. 1012-1015.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 As a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases,", Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the In2O3 and Sc2O3-A2O3-BO Systems [a; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=ln,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3-Ga2ZnO4-ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al.. "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In-Ga-Zn-Oxide TFTS With a Novel Passivation Layer," SID Digest '09 : SID International Symposium Digest of Technical Papers, May 31, 2009, pp. 284-287.

* cited by examiner

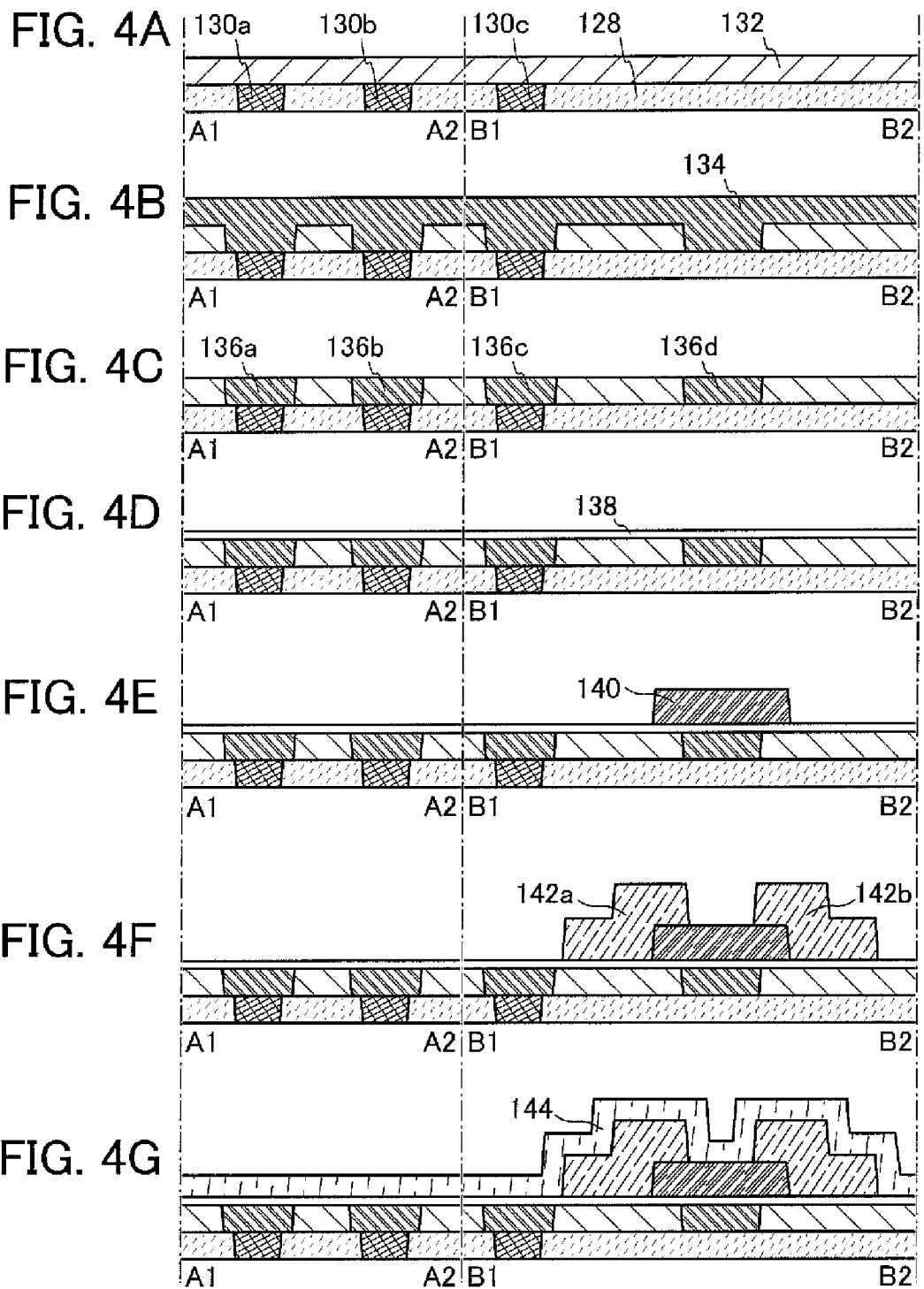

Energy band diagram of B-B'section (V_G>0)

Energy band diagram of B-B'section (V_G<0)

SEMICONDUCTOR DEVICE

TECHNICAL FIELD

The present invention relates to a semiconductor device using semiconductor elements and a manufacturing method thereof.

BACKGROUND ART

Memory devices using semiconductor elements are roughly classified into a volatile memory device that loses its stored data when power supply is stopped and a nonvolatile memory device that can hold its stored data even when power supply is stopped.

As a typical example of a volatile memory device, a dynamic random access memory (a DRAM) is given. In a DRAM, a transistor included in a memory element is selected and an electric charge is accumulated in a capacitor, so that data is stored.

Owing to the above-described principle, an electric charge in a capacitor is lost when data in a DRAM is read out; thus, it is necessary to perform writing operation whenever data is read. In addition, there is leakage current in a transistor included in a memory element and an electric charge flows into or out of the capacitor even when the transistor is not selected, whereby data holding period is short. Therefore, it is necessary to perform writing operation (refreshing operation) again in a predetermined cycle and it is difficult to reduce power consumption sufficiently. Further, since stored data is lost when the power is not supplied, another memory device using a magnetic material or an optical material is needed to hold stored data for a long time.

As another example of a volatile memory device, a static random access memory (an SRAM) is given. In an SRAM, stored data is held using a circuit such as a flip flop, so that refreshing operation is not needed. In view of this point, an SRAM is more advantageous than a DRAM. However, there is a problem in that cost per storage capacity becomes high because a circuit such as a flip flop is used. Further, in view of the point that stored data is lost when the power is stopped, an SRAM is not superior to a DRAM.

As a typical example of a nonvolatile memory device, a flash memory is given. A flash memory includes a floating gate between a gate electrode and a channel formation region in a transistor. A flash memory stores data by holding an electric charge in the floating gate, so that a data holding period is extremely long (semi-permanent), and thus has an advantage that refreshing operation which is necessary in a volatile memory device is not needed (for example, see Patent Document 1).

However, in a flash memory, there is a problem that a memory element does not function after performing writing operation a numerous number of times because a gate insulating layer included in the memory element is deteriorated due to tunnel current which occurs when writing operation is performed. In order to avoid an adverse effect of this problem, for example, a method of equalizing the number of writing operation for memory elements is employed, for example. However, a complicated peripheral circuit is needed to realize the method. Even when such a method is employed, the basic problem of lifetime is not resolved. That is, a flash memory is unsuitable for application in which data is rewritten with high frequency.

Further, high voltage is required to inject an electric charge to the floating gate or to remove the electric charge in the floating gate. Furthermore, a relatively long time is required for injecting or removing an electric charge and the speed of writing and erasing cannot be easily increased.

REFERENCE

Patent Document

[Patent Document 1] Japanese Published Patent Application No. S57-105889

DISCLOSURE OF INVENTION

In view of the above problem, one object of an embodiment of the present invention is to provide a semiconductor device which has a novel structure in which stored data is held even when power is not supplied and the number of times of writing is not limited. Another object of one embodiment of the present invention is to provide a semiconductor having a structure in which the data can be stored in the semiconductor device is easily multivalued.

An embodiment of the present invention is a semiconductor device having a stack of a transistor using an oxide semiconductor and a transistor using a material other than an oxide semiconductor. For example, the semiconductor device can employ the following structures.

An embodiment of the present invention is a semiconductor device including: a source line; a bit line; a first signal line; a plurality of second signal lines; a plurality of word lines; a plurality of memory cells connected in series between the source line and the bit line; a driver circuit for the second signal line and the word line to which an address signal is input and which drives the plurality of second signal lines and the plurality of word lines so as to select a memory cell specified by the address signal from the plurality of memory cells; a driver circuit for the first signal line selecting and outputting any of a plurality of writing potentials to the first signal line; a reading circuit to which a potential of the bit line and a plurality of reference potentials are input and which reads data by comparing the potential of the bit line and the plurality of reference potentials; and a potential generating circuit generating and supplying the plurality of writing potentials and the plurality of reference potentials to the driver circuit for the first signal line and the reading circuit. Further, one of the plurality of memory cells includes: a first transistor including a first gate electrode, a first source electrode, and a first drain electrode; a second transistor including a second gate electrode, a second source electrode, and a second drain electrode; and a third transistor including a third gate electrode, a third source electrode, and a third drain electrode. The first transistor is provided over a substrate containing a semiconductor material. The second transistor is formed so as to include an oxide semiconductor layer. The first gate electrode and one of the second source electrode and the second drain electrode are electrically connected to each other. The source line, the first source electrode, and the third source electrode are electrically connected to one another. The bit line, the first drain electrode, and the third drain electrode are electrically connected to one another. The first signal line and the other of the second source electrode and the second drain electrode are electrically connected to each other. One of the plurality of second signal lines and the second gate electrode are electrically connected to each other. One of the plurality of word lines and the third gate electrode are electrically connected to each other.

Note that a capacitor electrically connected to the first gate electrode and the one of the second source electrode and the second drain electrode is preferably included in the above structure.

Another embodiment of the present invention is a semiconductor device including: a source line; a bit line; a first signal line; a plurality of second signal lines; a plurality of word lines; a plurality of memory cells connected in series between the source line and the bit line; a driver circuit for the second line and the word line to which an address signal and a plurality of reference potentials are input and which drives the plurality of second signal lines and the plurality of word lines so as to select a memory cell specified by the address signal from the plurality of memory cells, and selects and outputs any of the plurality of reference potentials to one selected word line; a driver circuit for the first signal line selecting and outputting any of a plurality of writing potentials to the first signal line; a reading circuit connected to the bit line and reading data by reading conductance of the specified memory cell; and a potential generating circuit generating and supplying the plurality of writing potentials and the plurality of reference potentials to the driver circuit for the first signal line and the reading circuit. Further, one of the plurality of memory cells includes: a first transistor having a first gate electrode, a first source electrode, and a first drain electrode; a second transistor having a second gate electrode, a second source electrode, and a second drain electrode; and a capacitor. The first transistor is provided over a substrate containing a semiconductor material. The second transistor is formed including an oxide semiconductor layer. The first gate electrode, one of the second source electrode and the second drain electrode, and one of electrodes of the capacitor are electrically connected to one another. The source line and the first source electrode are electrically connected to each other. The bit line and the first drain electrode are electrically connected to each other. The first signal line and the other of the second source electrode and the second drain electrode are electrically connected to each other. One of the plurality of second signal lines and the second gate electrode are electrically connected to each other. One of the plurality of word lines and the other of the electrodes of the capacitor are electrically connected to each other.

The above-described semiconductor device preferably includes: a first selection line; a second selection line; a fourth transistor electrically connected to the first selection line through a gate electrode thereof; and a fifth transistor electrically connected to the second selection line through a gate electrode thereof. Further, it is preferable that the bit line be electrically connected to the first drain electrode and the third drain electrode through the fourth transistor and the source line be electrically connected to the first source electrode and the third source electrode through the fifth transistor.

In addition, it is preferable that the potential generating circuit be supplied with a potential boosted in a boosting circuit.

In the above structure, the first transistor includes: a channel formation region provided over the substrate containing a semiconductor material; impurity regions provided with the channel formation region sandwiched therebetween; a first gate insulating layer over the channel formation region; the first gate electrode over the first gate insulating layer; and the first source electrode and the first drain electrode electrically connected to the impurity regions.

Further, in the above structure, the second transistor includes: the second gate electrode over the substrate containing the semiconductor material; a second gate insulating layer over the second gate electrode; the oxide semiconductor layer over the second gate insulating layer; and the second source electrode and the second drain electrode electrically connected to the oxide semiconductor layer.

In the above structure, a single crystal semiconductor substrate or an SOI substrate is preferably used as the substrate containing a semiconductor material. It is particularly preferable that the semiconductor material be silicon.

Further, in the above structure, the oxide semiconductor layer preferably contains an In—Ga—Zn—O-based oxide semiconductor material. It is particularly preferable that the oxide semiconductor layer contain a crystal of $In_2Ga_2ZnO_7$. Hydrogen concentration of the oxide semiconductor layer is preferably less than or equal to $5\times10^{19}$ atoms/cm$^3$. In addition, off-state current of the second transistor is preferably less than or equal to $1\times10^{-13}$ A.

In addition, in the above structure, the second transistor can be provided in a region overlapping with the first transistor.

Note that in this specification, "over" and "below" do not necessarily mean "directly on" and "directly under", respectively, in the description of a physical relationship between components. For example, the expression of "a first gate electrode over a gate insulating layer" may refer to the case where another component is interposed between the gate insulating layer and the first gate electrode. In addition, the terms "over" and "below" are just used for convenience of explanations and they can be interchanged unless otherwise specified.

In this specification, the term "electrode" or "wiring" does not limit the function of components. For example, an "electrode" can be used as part of "wiring", and the "wiring" can be used as part of the "electrode". In addition, the term "electrode" or "wiring" can also mean a combination of a plurality of "electrodes" and "wirings", for example.

Further, functions of a "source" and a "drain" might be switched when transistors having different polarities are employed or a direction of current flow is changed in circuit operation, for example. Therefore, the terms "source" and "drain" can be switched in this specification.

Note that in this specification, the expression of "electrically connected" includes the case of electrical connection through "an object having any electrical function". Here, there is no particular limitation on "an object having any electrical function" as long as the object enables transmission and reception of an electrical signal between components which the object connects.

For example, in "an object having any electrical function", a switching element such as a transistor, a resistor, an inductor, a capacitor, and other elements having several functions are included, as well as an electrode and a wiring.

In general, the term "SOI substrate" means a substrate having a silicon semiconductor layer over an insulating surface. In this specification, the term "SOI substrate" also means a substrate having a semiconductor layer using a material other than silicon over an insulating surface. That is, a semiconductor layer included in the "SOI substrate" is not limited to a silicon semiconductor layer. Additionally, a substrate in an "SOI substrate" is not limited to a semiconductor substrate such as a silicon wafer, and may be a non-semiconductor substrate such as a glass substrate, a quartz substrate, a sapphire substrate, and a metal substrate. That is, an "SOI substrate" also includes a conductive substrate having an insulating surface and an insulating substrate over which a layer is formed using a semiconductor material. In addition, in this specification, a "semiconductor substrate" means a substrate of only a semiconductor material and also a general substrate of a material including a semiconductor material. In other words, in this specification, an "SOI substrate" is also included in the broad category of a "semiconductor substrate".

Moreover, in this specification, a material other than an oxide semiconductor may be any material as long as it is a material other than an oxide semiconductor. For example, silicon, germanium, silicon germanium, silicon carbide, gallium arsenide, or the like can be given. Besides, an organic semiconductor material and the like can be used. Note that in the case where a material included in a semiconductor device and the like is not particularly explained, an oxide semiconductor material or a material other than an oxide semiconductor may be used.

An embodiment of the present invention provides a semiconductor device in which a transistor using a material other than an oxide semiconductor is placed in a lower portion and a transistor using an oxide semiconductor is placed in a upper portion.

A transistor using an oxide semiconductor has extremely small off-state current; therefore, by using the transistor, stored data can be held for quite a long time. That is, refreshing operation can become unnecessary or frequency of refreshing operation can be reduced considerably, so that power consumption can be reduced sufficiently. Further, even in the case where power is not supplied, stored data can be held for a long time.

In addition, high voltage is not needed for writing data into the semiconductor device and there is no problem of deterioration of elements. For example, since there is no need to perform injection of electric charge to a floating gate and extraction of electrons from the floating gate which are needed in a conventional nonvolatile memory, deterioration of a gate insulating layer does not occur. That is, the semiconductor device according to the present invention does not have a limit on the number of times of writing which is a problem in a conventional nonvolatile memory, and reliability thereof is drastically improved. Further, data is written by switching an on state and an off state of the transistor, whereby high-speed operation can be easily realized. Additionally, there is an advantage that operation for erasing data, which is necessary in a flash memory and the like, is not needed.

Furthermore, a transistor which uses a material other than an oxide semiconductor can operate at a speed much higher than a transistor which uses an oxide semiconductor, and thus realizes high-speed reading of stored data.

Moreover, the data which is stored in the semiconductor device of the present invention can be easily multivalued by being provided with a boosting circuit, so that storage capacity can be increased.

Accordingly, a semiconductor device having an unprecedented feature can be realized by being provided with a combination of a transistor using a material other than an oxide semiconductor and a transistor using an oxide semiconductor material.

BRIEF DESCRIPTION OF DRAWINGS

In the accompanying drawings:

FIGS. 4A to 4G are cross-sectional views for illustrating a manufacturing process of a semiconductor device;

BEST MODE FOR CARRYING OUT THE INVENTION

Figure 1:
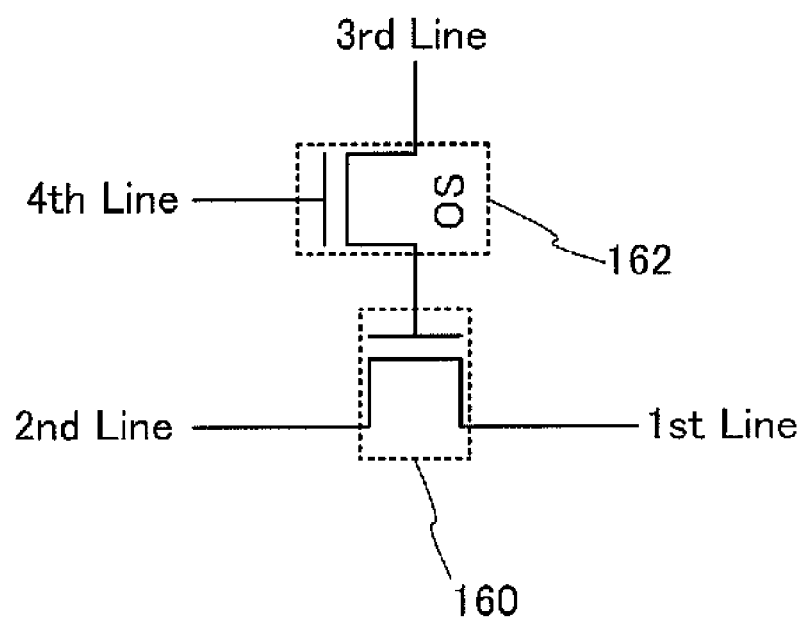
FIG. 1 is a circuit diagram for illustrating a semiconductor device.

Hereinafter, an example of embodiments of the present invention will be described with reference to the drawings. Note that the present invention is not limited to the following description and it will be readily appreciated by those skilled in the art that modes and details can be modified in various ways without departing from the spirit and the scope of the present invention. Therefore, the invention should not be interpreted as being limited to the description of the following embodiments.

Note that for the easy understanding, the position, size, range and the like of each component illustrated in the drawings and the like are not actual ones in some cases. Therefore, the present invention is not limited to the position, size, and range and the like disclosed in the drawings and the like.

Note that in this specification, ordinal numbers such as "first", "second", and "third" are used in order to avoid confusion among components, and the terms do not limit the components numerically.

Embodiment 1

In this embodiment, structures and manufacturing methods of semiconductor devices according to one embodiment of the disclosed invention are described with reference to FIG. 1, FIGS. 2A and 2B, FIGS. 3A to 3H, FIGS. 4A to 4G, FIGS. 5A to 5D, FIG. 6, FIGS. 7A and 7B, FIGS. 8A and 8B, FIG. 9, FIG. 10, FIG. 11, FIG. 12, FIGS. 13A and 13B, FIGS. 14A and 14B, and FIGS. 15A and 15B.

<Circuit Structure of Semiconductor Device>

FIG. 1 illustrates an example of a circuit structure of a semiconductor device. The semiconductor device includes a transistor 160 which uses a material other than an oxide semiconductor and a transistor 162 which uses an oxide semiconductor. Note that a mark "OS" is added to the transistor 162 in FIG. 1 to show that the transistor 162 uses an oxide semiconductor (OS). This applies also to other circuit diagrams of other embodiments.

Here, a gate electrode of the transistor 160 is electrically connected to one of a source electrode and a drain electrode of the transistor 162. A first wiring (which is denoted as "1st Line" and also called a source line SL) and a second wiring (which is denoted as "2nd Line" and also called a bit line BL) are electrically connected to a source electrode of the transistor 160 and a drain electrode of the transistor 160, respectively. Further, a third wiring (which is denoted as "3rd Line" and also called a first signal line S1) and a fourth wiring (which is denoted as "4th Line" and also called a second signal line S2) are electrically connected to the other of the source electrode and the drain electrode of the transistor 162 and a gate electrode of the transistor 162, respectively.

The transistor 160 which uses a material other than an oxide semiconductor can operate at a speed much higher than a transistor which uses an oxide semiconductor, and thus realizes high-speed reading of stored data and the like. In addition, off-state current is extremely small in the transistor 162 which uses an oxide semiconductor. Therefore, when the transistor 162 is turned off, a potential of the gate electrode of the transistor 160 can be held for an extremely long time. Further, in the transistor 162 which uses an oxide semiconductor, a short channel effect is not likely to be caused, which is advantageous.

The advantage that the potential of the gate electrode can be held for an extremely long time enables writing, holding, and reading of data to be performed as described below.

Description is made on writing and holding of data first. First, a potential of the fourth wiring is set to be a potential to make the transistor 162 be in an on state, whereby the transistor 162 is made to be in an on state. Accordingly, a potential of the third wiring is applied to the gate electrode of the transistor 160 (writing of data). After that, the potential of the fourth wiring is set to be a potential to make the transistor 162 be in an off state, whereby the transistor 162 is made to be in an off state; accordingly, the potential of the gate electrode of the transistor 160 is held (holding of the data).

Since the off-state current of the transistor 162 is extremely small, the potential of the gate electrode of the transistor 160 is held for a long time. For example, when the potential of the gate electrode of the transistor 160 is a potential to make the transistor 160 be in an on state, an on state of the transistor 160 is kept for a long time. When the potential of the gate electrode of the transistor 160 is a potential to make the transistor 160 be in an off state, an off state of the transistor 160 is kept for a long time.

Next, description is made on reading of data. When an on state or an off state of the transistor 160 is kept as described above and a given potential (a low potential) is applied to the first wiring, a value of a potential of the second wiring varies depending on a state of the transistor 160 which is an on state or an off state. For example, when the transistor 160 is in an on state, the potential of the second wiring is lowered by being affected by the potential of the first wiring. On the other hand, when the transistor 160 is in an off state, the potential of the second wiring is not changed.

In this manner, by comparing the potential of the second wiring with the given potential in a state where data is held, the data can be read.

Then, description is made on rewriting of data. Rewriting of data is performed in a manner similar to that of the writing and holding of data which are described above. That is, the potential of the fourth wiring is set to be a potential to make the transistor 162 be in an on state, whereby the transistor 162 is made to be in an on state. Accordingly, the potential of the third wiring (a potential relating to new data) is applied to the gate electrode of the transistor 160. After that, the potential of the fourth wiring is set to be a potential to make the transistor 162 be in an off state, whereby the transistor 162 is made to be in an off state; accordingly, the new data is held.

As described above, in the semiconductor device according to one embodiment of the disclosed invention, data can be directly rewritten by performing writing of data again. Erasing operation which is necessary in a flash memory and the like is thus not needed; therefore, reduction in operation speed due to erasing operation can be suppressed. In other words, high-speed operation of a semiconductor device is realized.

Note that, in the above description, an n-type transistor (an n-channel transistor) using electrons as carriers is used; however, a p-channel transistor using holes as carriers, needless to say, can be used instead of an n-channel transistor.

It is also needless to say that a capacitor may be added to the gate electrode of the transistor 160 so that the potential of the gate electrode of the transistor 160 is easily held.

<Plan Structure and Cross-Sectional Structure of Semiconductor Device>

Figure 2A:
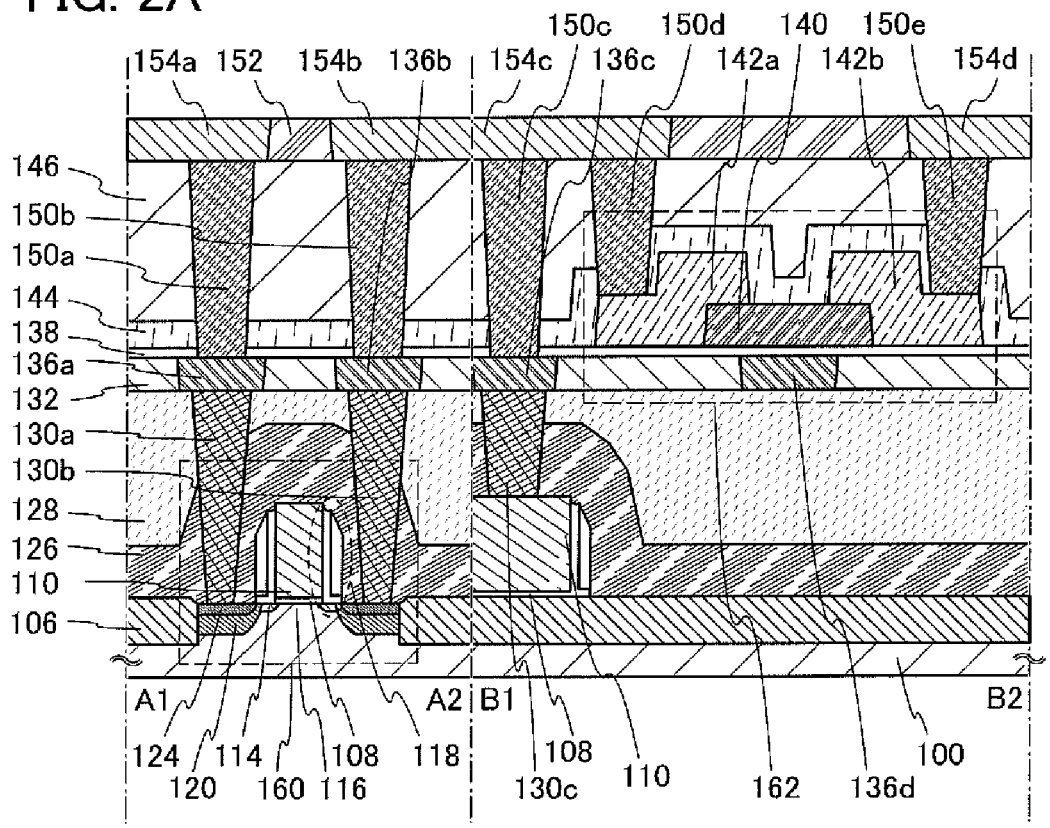
FIGS. 2A and 2B are a cross-sectional view and a plan view, respectively, for illustrating a semiconductor device.
Figure 2B:
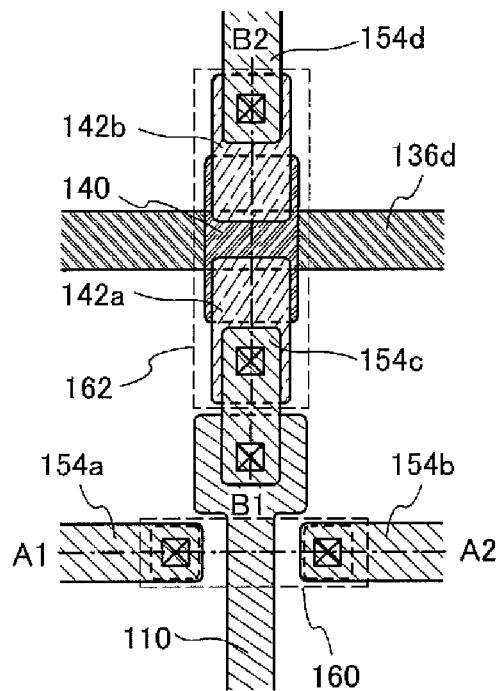

An example of a structure of the above semiconductor device is illustrated in FIGS. 2A and 2B. FIGS. 2A and 2B are a cross-sectional view of the semiconductor device and a plan view thereof, respectively. Here, FIG. 2A corresponds to a cross-section taken along line A1-A2 and line B1-B2 of FIG. 2B. The semiconductor device illustrated in FIGS. 2A and 2B includes the transistor 160 which uses a material other than an oxide semiconductor in a lower portion and the transistor 162 which uses an oxide semiconductor in an upper portion. Note that although n-channel transistors are described as the transistors 160 and 162, p-channel transistors may be employed. A p-channel transistor can be used as the transistor 160, in particular.

The transistor 160 includes: a channel formation region 116 which is provided for a substrate 100 containing a semiconductor material; impurity regions 114 between which the channel formation region 116 is sandwiched and high-concentration impurity regions 120 between which the channel formation region 116 is sandwiched (which are also collectively called impurity regions); a gate insulating layer 108 provided over the channel formation region 116: a gate electrode 110 provided over the gate insulating layer 108; and a source or drain electrode 130a and a source or drain electrode 130b which are electrically connected to the impurity regions 114.

Here, sidewall insulating layers 118 are provided for side surfaces of the gate electrode 110. Further, in regions of the substrate 100 which do not overlap with the sidewall insulating layers 118 when seen in a cross-sectional view, the high-concentration impurity regions 120 are provided. Metal compound regions 124 are over the high-concentration impurity regions 120. Over the substrate 100, an element isolation insulating layer 106 is provided so as to surround the transistor 160, and an interlayer insulating layer 126 and an interlayer insulating layer 128 are provided so as to cover the transistor 160. The source or drain electrode 130a and the source or drain electrode 130b are electrically connected to the metal compound regions 124 through openings formed in the interlayer insulating layers 126 and 128. In other words, the source or drain electrode 130a and the source or drain electrode 130b are electrically connected to the high-concentration impurity regions 120 and the impurity regions 114 via the metal compound regions 124. Further, the gate electrode 110 is electrically connected to an electrode 130c which is provided in a similar manner to the source or drain electrode 130a and the source or drain electrode 130b.

The transistor 162 includes: a gate electrode 136d provided over the interlayer insulating layer 128; a gate insulating layer 138 provided over the gate electrode 136d; an oxide semiconductor layer 140 provided over the gate insulating layer 138; and a source or drain electrode 142a and a source or drain electrode 142b which are provided over and electrically connected to the oxide semiconductor layer 140.

Here, the gate electrode 136d is provided so as to be embedded in an insulating layer 132 which is formed over the interlayer insulating layer 128. Furthermore, similarly to the gate electrode 136d, an electrode 136a, an electrode 136b, and an electrode 136c are formed in contact with the source or drain electrode 130a, the source or drain electrode 130b, and the electrode 130c, respectively.

Over the transistor 162, a protective insulating layer 144 is provided in contact with part of the oxide semiconductor layer 140. An interlayer insulating layer 146 is provided over the protective insulating layer 144. Here, in the protective insulating layer 144 and the interlayer insulating layer 146, openings reaching the source or drain electrode 142a and the source or drain electrode 142b are formed. In the openings, an electrode 150d and an electrode 150e are formed to be in contact with the source or drain electrode 142a and the source or drain electrode 142b, respectively. Similarly to the electrodes 150d and 150e, an electrode 150a, an electrode 150b, and an electrode 150c are formed to be in contact with the electrode 136a, the electrode 136b, and the electrode 136c, respectively, in openings provided in the gate insulating layer 138, the protective insulating layer 144, and the interlayer insulating layer 146.

Here, the oxide semiconductor layer 140 is preferably an oxide semiconductor layer which is highly purified by removing an impurity such as hydrogen. Specifically, hydrogen concentration in the oxide semiconductor layer 140 is less than or equal to $5 \times 10^{19}$ atoms/cm$^3$, preferably, less than or equal to $5 \times 10^{18}$ atoms/cm$^3$, or more preferably, less than or equal to $5 \times 10^{17}$ atoms/cm$^3$. In the oxide semiconductor layer 140 which is highly purified by sufficiently reducing the hydrogen concentration, carrier concentration is low enough when compared with carrier concentration (approximately $1 \times 10^{14}$/cm$^3$) in a general silicon wafer (a silicon wafer to which a slight amount of impurity elements such as phosphorus or boron is added). In other words, the carrier concentration in the oxide semiconductor layer 140 is less than or equal to $1 \times 10^{12}$/cm$^3$, preferably, less than or equal to $1 \times 10^{11}$/cm$^3$. In this manner, by using an oxide semiconductor which is highly purified by sufficiently reducing hydrogen concentration and made to be an i-type (intrinsic) oxide semiconductor or a substantially i-type oxide semiconductor, the transistor 162 which has extremely favorable off-state current characteristics can be obtained. For example, when a drain voltage $V_D$ is +1 V or +10 V and a gate voltage $V_G$ ranges from −5 V to −20 V, off-state current is less than or equal to $1 \times 10^{-13}$ A. When the oxide semiconductor layer 140 which is made to be an intrinsic oxide semiconductor layer or a substantially intrinsic oxide semiconductor layer by sufficiently reducing the hydrogen concentration is used and off-state current of the transistor 162 is reduced, a semiconductor device having a novel structure can be realized. Note that the hydrogen concentration in the oxide semiconductor layer 140 was measured by secondary ion mass spectroscopy (SIMS).

Furthermore, an insulating layer 152 is provided over the interlayer insulating layer 146. An electrode 154a, an electrode 154b, an electrode 154c, and an electrode 154d are provided so as to be embedded in the insulating layer 152. Here, the electrode 154a is in contact with the electrode 150a; the electrode 154b, the electrode 150b; the electrode 154c, the electrodes 150c and 150d; and the electrode 154d, the electrode 150e.

That is, in the semiconductor device illustrated in FIGS. 2A and 2B, the gate electrode 110 of the transistor 160 is electrically connected to the source or drain electrode 142a of the transistor 162 via the electrodes 130c, 136c, 150c, 154c, and 150d.

<Method for Manufacturing Semiconductor Device>

Next, an example of a method for manufacturing the above-described semiconductor device will be described. First, a method for manufacturing the transistor 160 in the lower portion will be described with reference to FIGS. 3A to 3H, and then, a method for manufacturing the transistor 162 in the upper portion will be described with reference to FIGS. 4A to 4G and FIGS. 5A to 5D.

<Method for Manufacturing Transistor in Lower Portion>

Figure 3A:
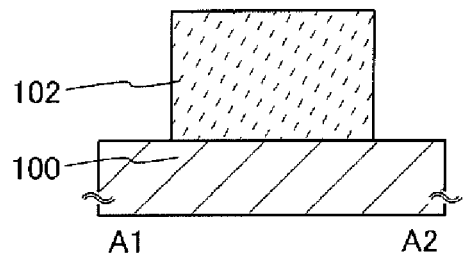
FIGS. 3A to 3H are cross-sectional views for illustrating a manufacturing process of a semiconductor device.

First, the substrate 100 which contains a semiconductor material is prepared (see FIG. 3A). As the substrate 100 which contains a semiconductor material, a single crystal semiconductor substrate or a polycrystalline semiconductor substrate containing silicon, silicon carbide, or the like, a compound semiconductor substrate containing silicon germanium or the like, an SOI substrate, or the like can be used. Here, an example in which a single crystal silicon substrate is used as the substrate 100 which contains a semiconductor material is described.

Over the substrate 100, a protective layer 102 which functions as a mask for forming an element isolation insulating layer (see FIG. 3A). As the protective layer 102, for example, an insulating layer formed using silicon oxide, silicon nitride, silicon nitride oxide, or the like can be used. Note that an impurity element giving n-type conductivity or an impurity element giving p-type conductivity may be added to the substrate 100 before or after the above step so that the threshold voltage of the transistor is controlled. As the impurity giving n-type conductivity, phosphorus, arsenic, or the like can be used when the semiconductor material contained in the substrate 100 is silicon. As the impurity giving p-type conductivity, boron, aluminum, gallium, or the like can be used, for example.

Next, with the use of the above protective layer 102 as a mask, part of the substrate 100 in a region which is not covered with the protective layer 102 (an exposed region) is removed by etching. Thus, a semiconductor region 104 which is separated is formed (see FIG. 3B). For the etching, dry etching is preferably performed, but wet etching can be performed. An etching gas and an etchant can be selected as appropriate depending on a material of the object to be etched.

Figure 3B:
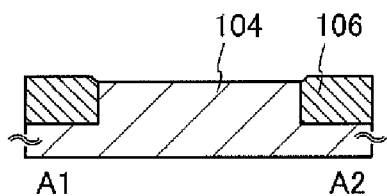

Next, an insulating layer is formed so as to cover the semiconductor region 104 and is selectively removed in a region which overlaps with the semiconductor region 104, whereby the element isolation insulating layer 106 is formed (see FIG. 3B). The insulating layer is formed using silicon oxide, silicon nitride, silicon nitride oxide, or the like. As a method for removing the insulating layer, there are etching treatment and polishing treatment such as CMP, and any of them can be employed. Note that the protective layer 102 is removed either after the semiconductor region 104 is formed or after the element isolation insulating layer 106 is formed.

Then, an insulating layer is formed over the semiconductor region 104 and a layer containing a conductive material is formed over the insulating layer.

The insulating layer serves as a gate insulating layer later and preferably has a single-layer structure or a stacked-layer structure using a film containing silicon oxide, silicon nitride oxide, silicon nitride, hafnium oxide, aluminum oxide, tantalum oxide, or the like which is obtained by a CVD method, a sputtering method, or the like. Alternatively, the above insulating layer may be obtained by oxidizing or nitriding a surface of the semiconductor region 104 by high-density plasma treatment or thermal oxidation treatment. The high-density plasma treatment can be performed using, for example, a mixed gas of a rare gas such as He, Ar, Kr, or Xe and a gas such as oxygen, nitrogen oxide, ammonia, nitrogen, or hydrogen. There is no particular limitation on the thickness of the insulating layer, but the thickness can be greater than or equal to 1 nm and less than or equal to 100 nm, for example.

The layer containing a conductive material can be formed using a metal material such as aluminum, copper, titanium, tantalum, or tungsten. Alternatively, the layer containing a conductive material may be formed using a semiconductor material such as polycrystalline silicon containing a conductive material. There is also no particular limitation on a method for forming the layer containing a conductive material, and any of a variety of film formation methods such as an evaporation method, a CVD method, a sputtering method, and a spin coating method is applicable. Note that in this embodiment, an example of the case where the layer containing a conductive material is formed using a metal material is described.

Figure 3C:
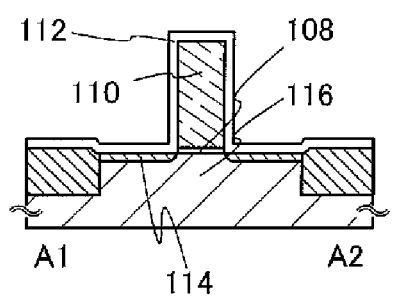

After that, by selectively etching the insulating layer and the layer containing a conductive material, the gate insulating layer 108 and the gate electrode 110 are formed (see FIG. 3C).

Next, an insulating layer 112 which covers the gate electrode 110 is formed (see FIG. 3C). Phosphorus (P), arsenic (As), or the like is then added to the semiconductor region 104, whereby the impurity regions 114 with a shallow junction depth, i.e., the impurity regions 114 whose interfaces with the substrate 100 are at a shallow region are formed (see FIG. 3C). Note that although phosphorus or arsenic is added here so that an n-channel transistor is formed, an impurity element such as boron (B) or aluminum (Al) may be added in the case of forming a p-channel transistor. Note also that the channel formation region 116 is formed in the semiconductor region 104 under the gate insulating layer 108 by formation of the impurity regions 114 (see FIG. 3C). Here, the concentration of the added impurity can be set as appropriate; in the case where a semiconductor element is highly miniaturized, the concentration is preferably set to be high. Further, a process in which the insulating layer 112 is formed after formation of the impurity regions 114 may be employed instead of the process employed here in which the impurity regions 114 are formed after formation of the insulating layer 112.

Figure 3D:
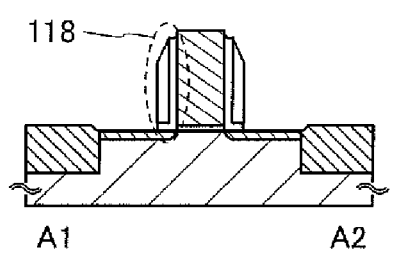
Figure 3E:
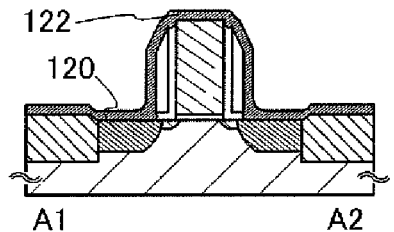
Figure 3F:
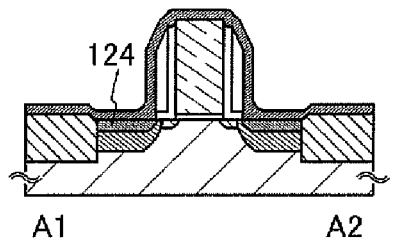

Then, the sidewall insulating layers 118 are formed (see FIG. 3D). An insulating layer is formed so as to cover the insulating layer 112 and then is subjected to highly anisotropic etching treatment, whereby the sidewall insulating layers 118 can be formed in a self-aligned manner. It is preferable that the insulating layer 112 be partly etched at this time so that a top surface of the gate electrode 110 and top surfaces of the impurity regions 114 are exposed.

After that, an insulating layer is formed so as to cover the gate electrode 110, the impurity regions 114, the side wall insulating layers 118, and the like. Phosphorus (P), arsenic (As), or the like is then added to part of the impurity regions 114 which are in contact with the insulating layer, whereby the high-concentration impurity regions 120 are formed (see FIG. 3E). Next, the above insulating layer is removed and a metal layer 122 is formed so as to cover the gate electrode 110, the sidewall insulating layers 118, the high-concentration impurity regions 120, and the like (see FIG. 3E). Any of a variety of methods such as a vacuum evaporation method, a sputtering method, and a spin coating method is applicable to formation of the metal layer 122. It is preferable that the metal layer 122 be formed using a metal material that reacts with a semiconductor material contained in the semiconductor region 104 so as to form a metal compound having low resistance. Examples of such a metal material include titanium, tantalum, tungsten, nickel, cobalt, and platinum.

Next, heat treatment is performed, whereby the metal layer 122 reacts with the semiconductor material. Accordingly, the metal compound regions 124 which are in contact with the high-concentration impurity regions 120 are formed (see FIG. 3F). Note that, in the case of using polycrystalline silicon for the gate electrode 110, a portion of the gate electrode 110 which is in contact with the metal layer 122 also has the metal compound region.

As the heat treatment, irradiation with a flash lamp can be employed. Although it is needless to say that another heat treatment method may be used, a method by which heat treatment for an extremely short time can be achieved is preferably used in order to improve the controllability of chemical reaction in formation of the metal compound. Note that the above metal compound regions are formed through reaction of the metal material with the semiconductor material and have conductivity which is sufficiently increased. By formation of the metal compound regions, electric resistance can be sufficiently reduced and element characteristics can be improved. The metal layer 122 is removed after formation of the metal compound regions 124.

Figure 3G:
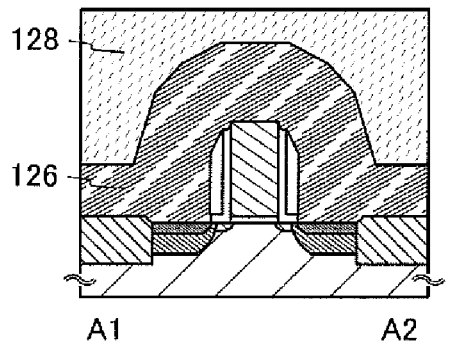

The interlayer insulating layers 126 and 128 are formed so as to cover the components formed in the above steps (see FIG. 3G). The interlayer insulating layers 126 and 128 can be formed using a material containing an inorganic insulating material such as silicon oxide, silicon nitride oxide, silicon nitride, hafnium oxide, aluminum oxide, or tantalum oxide. Alternatively, an organic insulating material such as polyimide or acrylic can be used. Note that although the interlayer insulating layer 126 and the interlayer insulating layer 128 form a two-layer structure here, the structure of the interlayer insulating layers is not limited to this. Note also that a surface of the interlayer insulating layer 128 is preferably subjected to CMP, etching treatment, or the like so as to be flattened after the interlayer insulating layer 128 is formed.

Figure 3H:
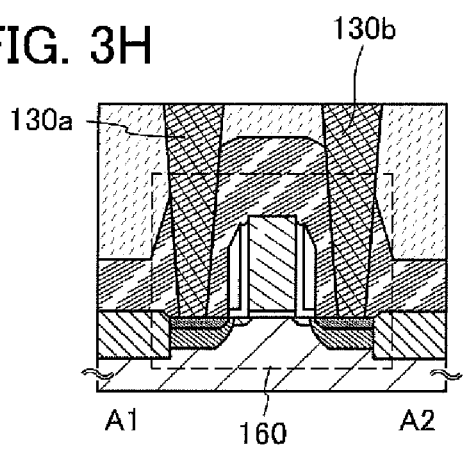

After that, openings reaching the metal compound regions 124 are formed in the interlayer insulating layers, and then the source or drain electrode 130a and the source or drain electrode 130b are formed in the openings (see FIG. 3H). For example, the source or drain electrode 130a and the source or drain electrode 130b can be formed as follows: a conductive layer is formed in a region including the openings by a PVD method, a CVD method, or the like; and then, part of the conductive layer is removed by etching treatment, CMP, or the like.

Note that in the step of forming the source or drain electrode 130a and the source or drain electrode 130b by removing part of the conductive layer, surfaces thereof are preferably processed to be flat. For example, in the case where a titanium film, a titanium nitride film, or the like is formed to have a small thickness in the region including the openings and a tungsten film is then formed so as to be embedded in the openings, CMP which is performed after that can remove an unnecessary portion of the tungsten film, titanium film, titanium nitride film, or the like, and improve the flatness of the surfaces. By flattening surfaces including the surfaces of the source or drain electrode 130a and the source or drain electrode 130b as described above, favorable electrodes, wirings, insulating layers, semiconductor layers, or the like can be formed in a later step.

Note that although only the source or drain electrode 130a and the source or drain electrode 130b which are in contact with the metal compound regions 124 are described, an electrode which is in contact with the gate electrode 110 (e.g., the electrode 130c of FIG. 2A) and the like can be formed in the same step. There is no particular limitation on a material used for the source or drain electrode 130a and the source or drain electrode 130b and any of a variety of conductive materials can be used. For example, a conductive material such as molybdenum, titanium, chromium, tantalum, tungsten, aluminum, copper, neodymium, or scandium can be used.

Through the above process, the transistor 160 which uses the substrate 100 containing a semiconductor material is formed. Note that electrodes, wirings, insulating layers, or the like may be formed as well after the above process is performed. When a multilayer wiring structure in which an interlayer insulating layer and a conductive layer are stacked is employed as a wiring structure, a highly-integrated semiconductor device can be provided.

<Method for Manufacturing Transistor in Upper Portion>

Then, a process through which the transistor 162 is manufactured over the interlayer insulating layer 128 is described with reference to FIGS. 4A to 4G and FIGS. 5A to 5D. Note that the transistor 160 and the like below the transistor 162 are omitted in FIGS. 4A to 4G and FIGS. 5A to 5D, which illustrate a manufacturing process of a variety of electrodes over the interlayer insulating layer 128, the transistor 162, and the like.

First, the insulating layer 132 is formed over the interlayer insulating layer 128, the source or drain electrode 130a, the source or drain electrode 130b, and the electrode 130c (see FIG. 4A). The insulating layer 132 can be formed by a PVD method, a CVD method, or the like. A material containing an inorganic insulating material such as silicon oxide, silicon nitride oxide, silicon nitride, hafnium oxide, aluminum oxide, or tantalum oxide can be used for the insulating layer 132.

Next, openings reaching the source or drain electrode 130a, the source or drain electrode 130b, and the electrode 130c are formed in the insulating layer 132. At this time, another opening is formed in a region where the gate electrode 136d is to be formed. A conductive layer 134 is formed so as to be embedded in the openings (see FIG. 4B). The above openings can be formed by etching with the use of a mask, for example. The mask can be formed by exposure using a photomask, for example. For the etching, either wet etching or dry etching may be performed but dry etching is preferable in view of the fine patterning. The conductive layer 134 can be formed by a deposition method such as a PVD method or a CVD method. Examples of a material for the conductive layer 134 include a conductive material such as molybdenum, titanium, chromium, tantalum, tungsten, aluminum, copper, neodymium, and scandium, an alloy of any of these, and a compound containing any of these (e.g., nitride of any of these).

Specifically, for example, the conductive layer 134 can be formed as follows: a titanium film is formed to have a small thickness by a PVD method in a region including the openings and a titanium nitride film is then formed to have a small thickness by a CVD method; and then, a tungsten film is formed so as to be embedded in the openings. Here, the titanium film formed by a PVD method has a function of reducing an oxide film formed at a surface of a lower electrode (here, the source or drain electrode 130a, the source or drain electrode 130b, the electrode 130c, or the like) so that contact resistance with the lower electrode is reduced. In addition, the subsequently formed titanium nitride film has a barrier property such that diffusion of a conductive material is prevented. Further, after a barrier film is formed using titanium, titanium nitride, or the like, a copper film may be formed by a plating method.

After the conductive layer 134 is formed, part of the conductive layer 134 is removed by etching treatment, CMP, or the like so that the insulating layer 132 is exposed and the electrodes 136a, 136b, and 136c, and the gate electrode 136d are formed (see FIG. 4C). Note that when the electrodes 136a, 136b, and 136c, and the gate electrode 136d are formed by removing part of the above conductive layer 134, processing is preferably performed so that flattened surfaces are obtained. By flattening surfaces of the insulating layer 132, the electrodes 136a, 136b, and 136c, and the gate electrode 136d, favorable electrodes, wirings, insulating layers, semiconductor layers and the like can be formed in a later step.

After that, the gate insulating layer 138 is formed so as to cover the insulating layer 132, the electrodes 136a, 136b, and 136c, and the gate electrode 136d (see FIG. 4D). The gate insulating layer 138 can be formed by a sputtering method, a CVD method, or the like. The gate insulating layer 138 preferably contains silicon oxide, silicon nitride, silicon oxynitride, silicon nitride oxide, aluminum oxide, hafnium oxide, tantalum oxide, or the like. Note that the gate insulating layer 138 may have a single-layer structure or a stacked-layer structure. For example, the gate insulating layer 138 of silicon oxynitride can be formed by a plasma CVD method using silane ($SiH_4$), oxygen, and nitrogen as source gases. There is no particular limitation on the thickness of the gate insulating layer 138, but the thickness can be greater than or equal to 10 nm and less than or equal to 500 nm, for example. When a stacked-layer structure is employed, the gate insulating layer 138 is preferably formed by stacking a first gate insulating layer with a thickness greater than or equal to 50 nm and less than or equal to 200 nm and a second gate insulating layer with a thickness greater than or equal to 5 nm and less than or equal to 300 nm over the first gate insulating layer.

Note that an oxide semiconductor which is made to be an i-type oxide semiconductor or a substantially i-type oxide semiconductor by removing an impurity (an oxide semiconductor which is highly purified) is extremely sensitive to an interface state or an interface electric charge; therefore, when such an oxide semiconductor is used for an oxide semiconductor layer, an interface between the oxide semiconductor layer and a gate insulating layer is important. In other words, the gate insulating layer 138 which is to be in contact with the highly purified oxide semiconductor layer needs to have high quality.

For example, a high-density plasma CVD method using microwave (2.45 GHz) is favorable because the dense and high-quality gate insulating layer 138 having high withstand voltage can be formed thereby. In this manner, an interface state can be reduced and interface characteristics can be favorable when the highly purified oxide semiconductor layer and the high quality gate insulating layer are in contact with each other.

Needless to say, even when such a highly purified oxide semiconductor layer is used, another method such as a sputtering method or a plasma CVD method can be employed as long as an insulating layer having good quality can be formed as the gate insulating layer. Alternatively, an insulating layer whose film quality and interface characteristics with the oxide semiconductor layer are modified by heat treatment after being formed may be applied. In any case, a layer is acceptable which is of good quality as the gate insulating layer 138, and which reduces interface state density between the gate insulating layer and the oxide semiconductor layer so that a good interface is formed.

When an impurity is contained in an oxide semiconductor, a combination between the impurity and the main component of the oxide semiconductor is cut by stresses such as a strong electric field and a high temperature, and a generated dangling bond leads to a shift in the threshold voltage ($V_{th}$).

On the other hand, according to one embodiment of the disclosed invention, a transistor which is stable even under the stresses such as a strong electric field and a high temperature, can be provided by removing an impurity in the oxide semiconductor, especially hydrogen or water, and realizing good interface characteristics between the gate insulating layer and the oxide semiconductor layer as described above.

Then, an oxide semiconductor layer is formed over the gate insulating layer 138 and processed by a method such as etching using a mask so that the oxide semiconductor layer 140 having an island-shape is formed (see FIG. 4E).

As the oxide semiconductor layer, an oxide semiconductor layer formed using any of the following materials can be applied: four-component metal oxide such as In—Sn—Ga—Zn—O-based metal oxide; three-component metal oxide such as In—Ga—Zn—O-based metal oxide, In—Sn—Zn—O-based metal oxide, In—Al—Zn—O-based metal oxide, Sn—Ga—Zn—O-based metal oxide, Al—Ga—Zn—O-based metal oxide, and Sn—Al—Zn—O-based metal oxide; two-component metal oxide such as In—Zn—O-based metal oxide, Sn—Zn—O-based metal oxide, Al—Zn—O-based metal oxide, Zn—Mg—O-based metal oxide, Sn—Mg—O-based metal oxide, and In—Mg—O-based metal oxide; In—O-based metal oxide; Sn—O-based metal oxide; and Zn—O-based metal oxide. In addition, the above oxide semiconductor materials may contain $SiO_2$.

As the oxide semiconductor layer, a thin film represented by $InMO_3(ZnO)_m$, (m>0) can be used. Here, M represents one or more metal elements selected from Ga, Al, Mn, and Co. For example, M can be Ga, Ga and Al, Ga and Mn, Ga and Co, or the like. An oxide semiconductor film which represented by $InMO_3(ZnO)_m$, (m>0), which includes Ga as M, is referred to as an In—Ga—Zn—O-based oxide semiconductor, and a thin film of the In—Ga—Zn—O-based oxide semiconductor is referred to as an In—Ga—Zn—O-based oxide semiconductor film (an In—Ga—Zn—O-based amorphous film).

In this embodiment, as the oxide semiconductor layer, an amorphous oxide semiconductor layer is formed by a sputtering method with the use of an In—Ga—Zn—O-based oxide semiconductor target for film formation. Note that by adding silicon to the amorphous oxide semiconductor layer, crystallization can be suppressed; therefore, the oxide semiconductor layer may be formed using a target which contains $SiO_2$ at greater than or equal to 2 wt. % and less than or equal to 10 wt. %.

As a target for forming the oxide semiconductor layer by a sputtering method, an oxide semiconductor target for film formation containing zinc oxide as a main component can be used, for example. As the In—Ga—Zn—O-based oxide semiconductor target for film formation, a target having a composition ratio of $In_2O_3:Ga_2O_3:ZnO=1:1:1$ (molar ratio) or the like can also be used. Alternatively, as the In—Ga—Zn—O-based oxide semiconductor target for film formation, a target having a composition ratio of $In_2O_3:Ga_2O_3:ZnO=1:1:2$ (molar ratio) or a target having a composition ratio of $In_2O_3:Ga_2O_3:ZnO=1:1:4$ (molar ratio) can be used. The filling rate of the oxide semiconductor target for film formation is greater than or equal to 90% and less than or equal to 100%, preferably greater than or equal to 95% (e.g., 99.9%). By using an oxide semiconductor target for film formation whose filling rate is high, a dense oxide semiconductor layer is formed.

An atmosphere for formation of the oxide semiconductor layer is preferably a rare gas (typically argon) atmosphere, an oxygen atmosphere, or a mixed atmosphere of a rare gas (typically argon) and oxygen. Specifically, a high-purity gas is preferable in which the concentration of impurities such as hydrogen, water, a compound including hydroxyl, and hydride is reduced to approximately several parts per million (preferably several parts per billion).

At the time of forming the oxide semiconductor layer, the substrate is fixed in a treatment chamber which is kept in a reduced-pressure state and the substrate temperature is higher than or equal to 100° C. and lower than or equal to 600° C., preferably, higher than or equal to 200° C. and lower than or equal to 400° C. When the oxide semiconductor layer is formed while the substrate is heated, the concentration of impurities contained in the oxide semiconductor layer can be reduced. In addition, damage of the oxide semiconductor layer due to sputtering is reduced. While moisture remaining in the treatment chamber is removed, a sputtering gas from which hydrogen and moisture are removed is introduced, and the oxide semiconductor layer is formed with use of metal oxide as a target. In order to remove remaining moisture in the treatment chamber, an entrapment vacuum pump is preferably used. For example, a cryopump, an ion pump, or a titanium sublimation pump can be used. The evacuation unit may be a turbo pump provided with a cold trap. A hydrogen atom, a compound containing a hydrogen atom, such as water ($H_2O$), a compound containing a carbon atom, or the like is removed from the deposition chamber which is evacuated with the cryopump, thereby reducing the concentration of impurities contained in the oxide semiconductor layer formed in the deposition chamber.

For example, the deposition conditions can be set as follows: the distance between a substrate and a target is 100 mm; the pressure is 0.6 Pa; the direct-current (DC) power is 0.5 kW; and the atmosphere is an oxygen atmosphere (the proportion of the oxygen flow rate is 100%). It is preferable that a pulsed direct-current (DC) power supply be used because powder substances (also referred to as particles or dust) can be reduced and the film thickness distribution can be small. The thickness of the oxide semiconductor layer is greater than or equal to 2 nm and less than or equal to 200 nm, preferably greater than or equal to 5 nm and less than or equal to 30 nm. Note that an appropriate thickness depends on an applied oxide semiconductor material, and the thickness of the oxide semiconductor layer may be set as appropriate depending on the material.

Note that before the oxide semiconductor layer is formed by a sputtering method, dust attached to a surface of the gate insulating layer 138 is preferably removed by reverse sputtering in which an argon gas is introduced and plasma is generated. Here, the reverse sputtering means a method for improving the quality of a surface of the object to be processed by ions striking on the surface, while general sputtering is achieved by ions striking on a sputtering target. Methods for making ions strike the surface of the object to be processed include a method in which a high frequency voltage is applied on the surface in an argon atmosphere and plasma is generated in the vicinity of the substrate. Note that a nitrogen atmosphere, a helium atmosphere, an oxygen atmosphere, or the like may be used instead of the argon atmosphere.

For the etching of the oxide semiconductor layer, either dry etching or wet etching may be used. Needless to say, a combination of dry etching and wet etching may be employed. The etching conditions (an etching gas, etching solution, etching time, temperature, or the like) are set as appropriate, depending on the material, so that the oxide semiconductor layer can be etched into a desired shape.

Examples of the etching gas for dry etching are a gas containing chlorine (a chlorine-based gas such as chlorine ($Cl_2$), boron trichloride ($BCl_3$), silicon tetrachloride ($SiCl_4$), or carbon tetrachloride ($CCl_4$)) and the like. Alternatively, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)); hydrogen bromide (HBr); oxygen ($O_2$); any of these gases to which a rare gas such as helium (He) or argon (Ar) is added; or the like may be used.

As a dry etching method, a parallel plate reactive ion etching (RIE) method or an inductively coupled plasma (ICP) etching method can be used. In order to etch the layer into a desired shape, the etching conditions (the amount of electric power applied to a coil-shaped electrode, the amount of electric power applied to an electrode on a substrate side, the temperature of the electrode on the substrate side, or the like) are set as appropriate.

As an etchant used for wet etching, a mixed solution of phosphoric acid, acetic acid, and nitric acid, or the like can be used. Alternatively, ITO07N (manufactured by Kanto Chemical Co., Inc.) or the like may be used.

Then, the oxide semiconductor layer is preferably subjected to first heat treatment. By this first heat treatment, the oxide semiconductor layer can be dehydrated or dehydrogenated. The first heat treatment is performed at a temperature higher than or equal to 300° C. and lower than or equal to 750° C., preferably, higher than or equal to 400° C. and lower than the strain point of the substrate. For example, the substrate is introduced into an electric furnace in which a resistance heating element or the like is used and the oxide semiconductor layer 140 is subjected to heat treatment in a nitrogen atmosphere at a temperature of 450° C. for one hour. At this time, the oxide semiconductor layer 140 is prevented from being exposed to the air so that entry of water or hydrogen is prevented.

Note that a heat treatment apparatus is not limited to an electrical furnace, and may include a device for heating an object to be processed by heat conduction or heat radiation given by a medium such as a heated gas or the like. For example, a rapid thermal anneal (RTA) apparatus such as a gas rapid thermal anneal (GRTA) apparatus or a lamp rapid thermal anneal (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object to be processed by heat treatment, such as nitrogen or a rare gas such as argon is used.

For example, as the first heat treatment, GRTA may be performed as follows. The substrate is placed in an inert gas which has been heated to a high temperature of 650° C. to 700° C., heated for several minutes, and taken out from the inert gas. GRTA enables high-temperature heat treatment for a short time. In addition, such heat treatment is applicable even when a temperature exceeds the strain point of the substrate because it takes only short time.

Note that the first heat treatment is preferably performed in an atmosphere which contains nitrogen or a rare gas (e.g., helium, neon, or argon) as its main component and does not contain water, hydrogen, or the like. For example, the purity of nitrogen or a rare gas (e.g., helium, neon, or argon) introduced into the heat treatment apparatus is greater than or equal to 6 N (99.9999%), preferably greater than or equal to 7 N (99.99999%) (that is, the concentration of impurities is less than or equal to 1 ppm, preferably less than or equal to 0.1 ppm).

In some cases, the oxide semiconductor layer might be crystallized to be a microcrystalline layer or a polycrystalline layer depending on the condition of the first heat treatment or the material of the oxide semiconductor layer. For example, the oxide semiconductor layer may be crystallized to become a microcrystalline oxide semiconductor layer having a degree of crystallization of greater than or equal to 90%, or greater than or equal to 80%. Further, depending on the condition of the first heat treatment or the material of the oxide semiconductor layer, the oxide semiconductor layer may become an amorphous oxide semiconductor layer containing no crystalline component.

The oxide semiconductor layer might become an oxide semiconductor layer in which a crystal (with a grain diameter greater than or equal to 1 nm and less than or equal to 20 nm, typically greater than or equal to 2 nm and less than or equal to 4 nm) is mixed in an amorphous oxide semiconductor (e.g. a surface of the oxide semiconductor layer).

In addition, electric characteristics of the oxide semiconductor layer can be changed by providing a crystal layer over the surface of the amorphous region of the oxide semiconductor layer. For example, in the case of forming the oxide semiconductor layer with the use of an In—Ga—Zn—O-based oxide semiconductor target for film formation, the electric characteristics of the oxide semiconductor layer can be changed by forming a crystal portion in which a crystal grain represented by $In_2Ga_2ZnO_7$ which has electrical anisotropy is aligned in the certain direction.

More specifically, for example, by aligning the crystal grain in such a manner that c-axis of $In_2Ga_2ZnO_7$ is oriented in a direction perpendicular to a surface of the oxide semiconductor layer, conductivity in a direction parallel to the surface of the oxide semiconductor layer is improved, whereby an insulating property in the direction perpendicular to the surface of the oxide semiconductor layer can be increased. Further, such a crystal portion has a function of suppressing entry of an impurity such as water or hydrogen to the oxide semiconductor layer.

Note that the above oxide semiconductor layer which includes the crystal portion can be formed by heating a surface of the oxide semiconductor layer by GRTA. When a sputtering target in which the amount of Zn is smaller than that of In or Ga is used, more favorable formation can be achieved.

The first heat treatment performed on the oxide semiconductor layer 140 can be performed on the oxide semiconductor layer which has not yet been processed into the island-shaped layer. In that case, after the first heat treatment, the substrate is taken out of the heating apparatus and a photolithography step is performed.

Note that the above first heat treatment can dehydrate or dehydrogenate the oxide semiconductor layer 140 and thus can be called dehydration treatment or dehydrogenation treatment. It is possible to perform such dehydration treatment or dehydrogenation treatment at any timing, for example, after the oxide semiconductor layer is formed, after the source and drain electrodes are stacked over the oxide semiconductor layer 140, or after a protective insulating layer is formed over the source and drain electrodes. Such dehydration treatment or dehydrogenation treatment may be performed more than once.

Next, the source or drain electrode 142a and the source or drain electrode 142b are formed in contact with the oxide semiconductor layer 140 (see FIG. 4F). The source or drain electrode 142a and the source or drain electrode 142b can be formed in such a manner that a conductive layer is formed so as to cover the oxide semiconductor layer 140 and then selectively etched.

The conductive layer can be formed by a PVD method such as a sputtering method, a CVD method such as a plasma CVD method. As a material of the conductive layer, an element selected from aluminum, chromium, copper, tantalum, titanium, molybdenum, and tungsten, an alloy containing any of the above elements as its component, or the like can be used. Further, one or more materials selected from manganese, magnesium, zirconium, beryllium, and thorium may be used. A material in which aluminum and one or more elements selected from titanium, tantalum, tungsten, molybdenum, chromium, neodymium, and scandium are combined is also applicable to the material of the conductive layer.

Alternatively, the conductive layer may be formed using conductive metal oxide. As conductive metal oxide, indium oxide ($In_2O_3$), tin oxide ($SnO_2$), zinc oxide ($ZnO$), indium oxide-tin oxide alloy ($In_2O_3$—$SnO_2$, which is abbreviated to ITO in some cases), indium oxide-zinc oxide alloy ($In_2O_3$—$ZnO$), or any of these metal oxide materials in which silicon or silicon oxide is contained can be used.

The conductive layer may have either a single-layer structure or a stacked-layer structure of two or more layers. For example, a single-layer structure of an aluminum film containing silicon, a two-layer structure of an aluminum film and a titanium film stacked thereover, a three-layer structure in which a titanium film, an aluminum film, and a titanium film are stacked in this order, and the like can be given.

Here, ultraviolet rays, a KrF laser beam, or an ArF laser beam is preferably used for exposure for forming an etching mask.

The channel length (L) of the transistor is determined by a distance between a lower edge portion of the source or drain electrode 142a and a lower edge portion of the source or drain electrode 142b. In the case where the channel length (L) is less than 25 nm, exposure for making a mask is performed in the extreme ultraviolet range of several nanometers to several tens of nanometers which is extremely short wavelength. In the exposure using extreme ultraviolet light, the resolution is high and the focus depth is large. Therefore, the channel length (L) of the transistor to be formed later can be greater than or equal to 10 nm and less than or equal to 1000 nm, whereby operation speed of a circuit can be increased. Further, off-state current of the transistor is extremely small, which prevents increase in power consumption.

Materials of the layers and etching conditions are adjusted as appropriate so that the oxide semiconductor layer 140 is not removed in etching of the conductive layer. Note that the oxide semiconductor layer 140 is partly etched in this step so as to be an oxide semiconductor layer having a groove (a depressed portion) in some cases depending on the materials and etching conditions.

An oxide conductive layer may be formed between the oxide semiconductor layer 140 and the source or drain electrode 142a, and between the oxide semiconductor layer 140 and the source or drain electrode 142b. An oxide conductive layer and the conductive layer for forming the source or drain electrode 142a and the source or drain electrode 142b can be successively formed (successive deposition). The oxide conductive layer can function as a source region or a drain region. By providing such an oxide conductive layer, resistance of the source and drain regions can be reduced and high-speed operation of the transistor can be realized.

In order to reduce the number of the masks and steps, etching may be performed with the use of a resist mask formed using a multi-tone mask which is a light-exposure mask through which light is transmitted so as to have a plurality of intensities. A resist mask formed with the use of a multi-tone mask has a shape with a plurality of thicknesses (a step-like shape) and further can be changed in shape by ashing; therefore, the resist mask can be used in a plurality of etching steps for processing into different patterns. That is, a resist mask corresponding to at least two or more kinds of different patterns can be formed by one multi-tone mask. Thus, the number of light-exposure masks can be reduced and the number of corresponding photolithography steps can be also reduced, whereby simplification of a process can be realized.

Note that plasma treatment using a gas such as $N_2O$, $N_2$, or Ar is preferably performed after the above step. By this plasma treatment, water attached to a surface of the oxide semiconductor layer which is exposed is removed. Alternatively, plasma treatment may be performed using a gas containing oxygen, such as a mixed gas of oxygen and argon, or the like. In this manner, the oxide semiconductor layer is supplied with oxygen and defects resulted from oxygen deficiency can be reduced.

After that, the protective insulating layer 144 which is in contact with part of the oxide semiconductor layer 140 is formed without exposure to the air (see FIG. 4G).

The protective insulating layer 144 can be formed by appropriately employing a method such as a sputtering method, by which an impurity such as water or hydrogen is prevented from entering the protective insulating layer 144. The protective insulating layer 144 is formed to a thickness greater than or equal to 1 nm. As a material which can be used for the protective insulating layer 144, there are silicon oxide, silicon nitride, silicon oxynitride, silicon nitride oxide, and the like. The protective insulating layer 144 may have a single-layer structure or a stacked-layer structure. The substrate temperature for formation of the protective insulating layer 144 is preferably higher than or equal to room temperature and lower than or equal to 300° C. The atmosphere for formation of the protective insulating layer 144 is preferably a rare gas (typically argon) atmosphere, an oxygen atmosphere, or a mixed atmosphere of a rare gas (typically argon) and oxygen.

When hydrogen is contained in the protective insulating layer 144, entry of the hydrogen to the oxide semiconductor layer, extraction of oxygen in the oxide semiconductor layer by the hydrogen, or the like is caused, and the resistance of the backchannel side of the oxide semiconductor layer is made low, which may form a parasitic channel. Therefore, it is important that a formation method in which hydrogen is not used is employed so that the protective insulating layer 144 contains hydrogen as less as possible.

In addition, it is preferable that the protective insulating layer 144 be formed while remaining moisture in the treatment chamber is removed. This is for preventing hydrogen, hydroxyl, or water from being contained in the oxide semiconductor layer 140 and the protective insulating layer 144.

In order to remove remaining moisture in the treatment chamber, an entrapment vacuum pump is preferably used. For example, a cryopump, an ion pump, or a titanium sublimation pump is preferably used. The evacuation unit may be a turbo pump provided with a cold trap. A hydrogen atom, a compound containing a hydrogen atom, such as water ($H_2O$), or the like is removed from the deposition chamber which is evacuated with the cryopump, thereby reducing the concentration of impurities contained in the protective insulating layer 144 formed in the deposition chamber.

As a sputtering gas used in formation of the protective insulating layer 144, a high-purity gas from which an impurity such as hydrogen, water, compound including hydroxyl, or hydride is reduced to approximately several parts per million (preferably several parts per billion) is preferably used.

Then, second heat treatment (preferably at a temperature higher than or equal to 200° C. and lower than or equal to 400° C., for example, higher than or equal to 250° C. and lower than or equal to 350° C.) in an inert gas atmosphere or an oxygen atmosphere is preferably performed. For example, the second heat treatment is performed in a nitrogen atmosphere at 250° C. for one hour. The second heat treatment can reduce variation in the electric characteristics of the transistor. Further, the oxide semiconductor layer can be supplied with oxygen by the second heat treatment. In addition, the above atmosphere may be switched; the oxide semiconductor layer can be supplied with oxygen also by being subjected to a temperature decreasing process in an oxygen atmosphere or an atmosphere from which hydrogen or water is sufficiently removed, successively after the second heat treatment.

Further, heat treatment may be performed at a temperature higher than or equal to 100° C. and lower than or equal to 200° C. for greater than or equal to one hour and less than or equal to 30 hours in the air. This heat treatment may be performed at a fixed heating temperature. Alternatively, the following temperature cycle may be applied plural times repeatedly: the temperature is increased from room temperature to a temperature higher than or equal to 100° C. and lower than or equal to 200° C. and then decreased to room temperature. Further, this heat treatment may be performed under a reduced pressure before formation of the protective insulating layer. The reduced pressure enables the heat treatment time to be short. Note that this heat treatment may be performed instead of the second heat treatment; alternatively, this heat treatment may be performed in addition to the second heat treatment before or after the second heat treatment.

Figure 5A:
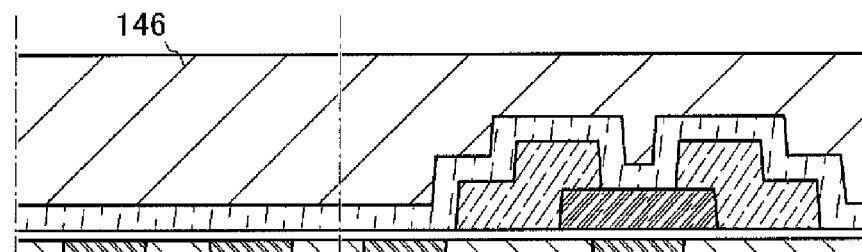
FIGS. 5A to 5D are cross-sectional views for illustrating a manufacturing process of a semiconductor device.

Then, the interlayer insulating layer 146 is formed over the protective insulating layer 144 (see FIG. 5A). The interlayer insulating layer 146 can be formed by a PVD method, a CVD method, or the like. A material containing an inorganic insulating material such as silicon oxide, silicon nitride oxide, silicon nitride, hafnium oxide, aluminum oxide, or tantalum oxide can be used for the interlayer insulating layer 146. Further, a surface of the interlayer insulating layer 146 is preferably subjected to CMP, etching treatment, or the like so as to be flattened after the interlayer insulating layer 146 is formed.

Figure 5B:
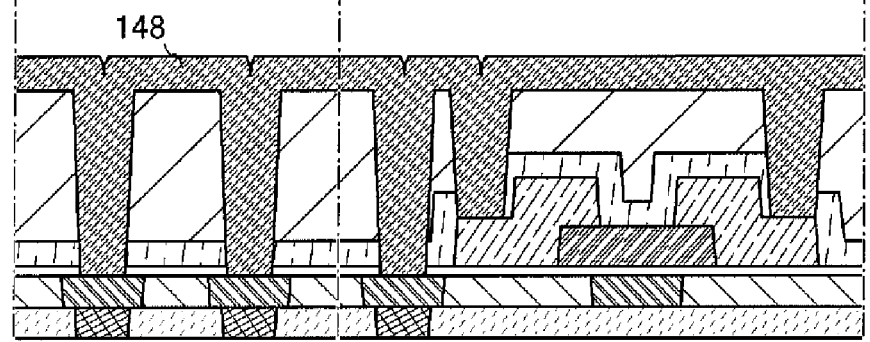

Next, openings reaching the electrodes 136a, 136b, and 136c, the source or drain electrode 142a, and the source or drain electrode 142b are formed in the interlayer insulating layer 146, the protective insulating layer 144, and the gate insulating layer 138; then, a conductive layer 148 is formed so as to be embedded in the openings (see FIG. 5B). The above openings can be formed by etching with the use of a mask, for example. The mask can be formed by exposure using a photomask, for example. For the etching, either wet etching or dry etching may be performed but dry etching is preferable in view of the fine patterning. The conductive layer 148 can be formed by a deposition method such as a PVD method or a CVD method. Examples of a material for the conductive layer 148 include a conductive material such as molybdenum, titanium, chromium, tantalum, tungsten, aluminum, copper, neodymium, and scandium, an alloy of any of these, and a compound containing any of these (e.g., nitride of any of these).

Specifically, for example, the conductive layer 148 can be formed as follows: a titanium film is formed to have a small thickness by a PVD method in a region including the openings and a titanium nitride film is then formed to have a small thickness by a CVD method; and then, a tungsten film is formed so as to be embedded in the openings. Here, the titanium film formed by a PVD method has a function of reducing an oxide film formed at a surface of a lower electrode (here, the electrodes 136a, 136b, and 136c, the source or drain electrode 142a, the source or drain electrode 142b, or the like), so that contact resistance with the lower electrode is reduced. In addition, the subsequently formed titanium nitride film has a barrier property such that diffusion of a conductive material is prevented. Further, after a barrier film is formed using titanium, titanium nitride, or the like, a copper film may be formed by a plating method.

Figure 5C:
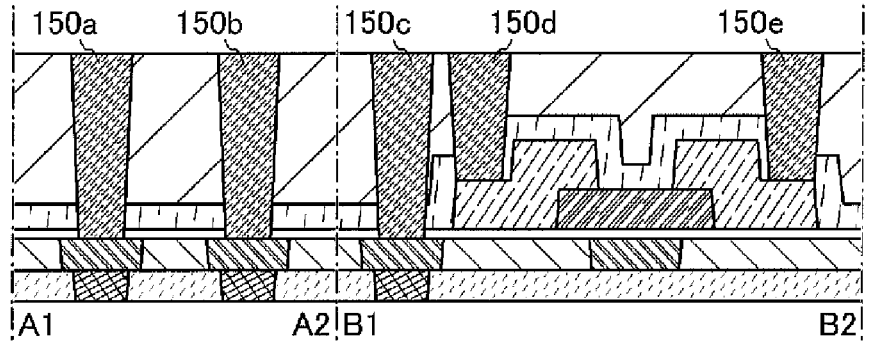
Figure 5D:
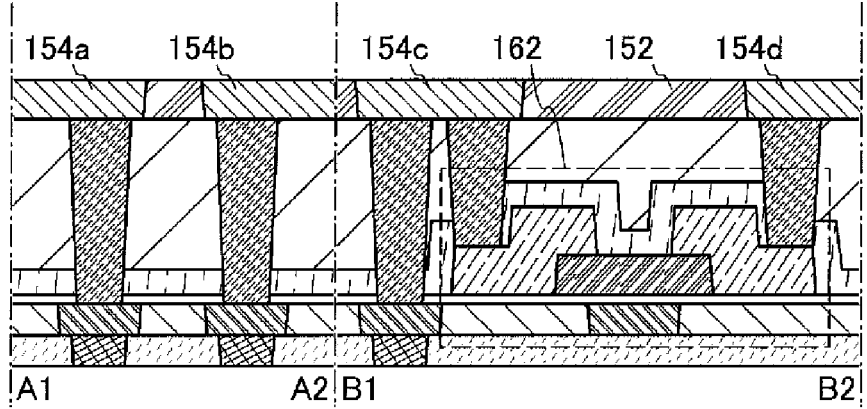

After the conductive layer 148 is formed, part of the conductive layer 148 is removed by etching treatment, CMP, or the like so that the interlayer insulating layer 146 is exposed and the electrodes 150a, 150b, 150c, 150d and 150e are formed (see FIG. 5C). Note that when the electrodes 150a, 150b, 150c, 150d and 150e are formed by removing part of the above conductive layer 148, processing is preferably performed so that flattened surfaces are obtained. By flattening surfaces of the interlayer insulating layer 146 and the electrodes 150a, 150b, 150c, 150d and 150e, favorable electrodes, wirings, insulating layers, and the like can be formed in a later step.

Further, the insulating layer 152 is formed and openings reaching the electrodes 150a, 150b, 150c, 150d and 150e are formed in the insulating layer 152; then, a conductive layer is formed so as to be embedded in the openings. After that, part of the conductive layer is removed by etching, CMP, or the like so that the insulating layer 152 is exposed and the electrodes 154a, 154b, 154c, and 154d are formed (see FIG. 5D).

This step is similar to that of forming the electrode 150a and the like; therefore, detailed description is omitted here.

When the transistor 162 is manufactured in the above-described manner, the hydrogen concentration of the oxide semiconductor layer 140 is less than or equal to $5 \times 10^{19}$ atoms/cm$^3$ and off-state current of the transistor 162 is less than or equal to $1 \times 10^{-13}$ A, i.e., the detection limit. The off-state current of the transistor 162 (here, current per micrometer of channel width) is less than or equal to 100 zA/μm. Thus, the transistor 162 having excellent characteristics can be obtained by employing the highly purified oxide semiconductor layer 140 in which the hydrogen concentration is sufficiently reduced and defects resulted from oxygen deficiency are reduced. In addition, a semiconductor device having excellent characteristics which includes the transistor 160 which uses a material other than an oxide semiconductor in a lower portion and the transistor 162 which uses an oxide semiconductor in an upper portion can be manufactured.

Note that although many researches on a physical property of an oxide semiconductor are conducted, they do not suggest an idea of sufficiently reducing localized states in an energy gap. In one embodiment of the disclosed invention, water or hydrogen which can induce localized states is removed from an oxide semiconductor, whereby a highly purified oxide semiconductor is manufactured. This is based on an idea of sufficiently reducing localized states in an energy gap and realizes manufacture of excellent industrial products.

Note that when hydrogen, water, or the like is removed, oxygen is also removed in some cases. Therefore, it is favorable that the oxide semiconductor be further purified (made to be an i-type oxide semiconductor) by supplying oxygen to dangling bonds of metal which are generated by oxygen deficiency so that localized states resulted from oxygen deficiency are reduced. For example, localized states resulted from oxygen deficiency can be reduced in the following manner: an oxide film having excessive oxygen is formed in a close contact with a channel formation region; and heat treatment at 200° C. to 400° C., typically, approximately 250° C., is performed so that oxygen is supplied to an oxide semiconductor from the oxide film.

It can be considered that a factor of deterioration of characteristics of an oxide semiconductor is a shallow level due to excessive hydrogen at 0.1 eV to 0.2 eV below the conduction band, a deep level resulted from oxygen deficiency, or the like. In order to correct these defects, hydrogen is thoroughly removed and oxygen is sufficiently supplied.

In the disclosed invention, since an oxide semiconductor is highly purified, carrier concentration of the oxide semiconductor is sufficiently low.

With the use of Fermi-Dirac distribution function at normal temperature, intrinsic carrier density of an oxide semiconductor having an energy gap at 3.05 eV to 3.15 eV is $1 \times 10^{-7}$/cm$^3$, which is much lower than intrinsic carrier density of $1.45 \times 10^{10}$/cm$^3$ of silicon.

Accordingly, the number of holes that are minority carriers is extremely small. Leakage current of an insulated gate field effect transistor (IGFET) in an off-state is expected to be less than or equal to 100 aA/μm at normal temperature, preferably, less than or equal to 10 aA/μm, or more preferably less than or equal to 1 aA/μm. Note that "1 aA/μm" means that flowing current per micrometer of channel width of a transistor is 1 aA ($1 \times 10^{-18}$ A).

In fact, 4H—SiC (3.26 eV), GaN (3.42 eV), and the like are known as a semiconductor having a wide gap which has an energy gap greater than or equal to 3 eV. Transistor characteristics similar to the above described characteristics are expected to be obtained with the use of these semiconductors. However, it is substantially impossible to form a thin film of these semiconductor materials because they need process temperature higher than or equal to 1500° C. In addition, the process temperature is so high that these materials cannot be stacked in three dimensions over a silicon integrated circuit. On the other hand, an oxide semiconductor can be deposited as a thin film by sputtering at room temperature to 400° C. and can be dehydrated or dehydrogenated (removal of hydrogen or water) and supplied with oxygen at 450° C. to 700° C.; thus, an oxide semiconductor can be stacked in three dimensions over a silicon integrated circuit.

Note that although an oxide semiconductor generally has an n-type conductivity, in one embodiment of the disclosed invention, an oxide semiconductor is made to be an i-type oxide semiconductor by removing an impurity such as water or hydrogen and supplying oxygen that is a component of an oxide semiconductor. From this aspect, different from the case of silicon which is made to be an i-type silicon by adding an impurity, one embodiment of the disclosed invention includes a novel technical idea.

<Electrical Conduction Mechanism of Transistor Using Oxide Semiconductor>

An electrical conduction mechanism of a transistor including an oxide semiconductor will be described with reference to FIG. 6, FIG. 7, FIGS. 8A and 8B, and FIG. 9. Note that the following description is based on the assumption of an ideal situation for easy understanding and does not necessarily reflect a real situation. Note also that the following description is just a consideration and does not affect the validity of the invention.

Figure 6:
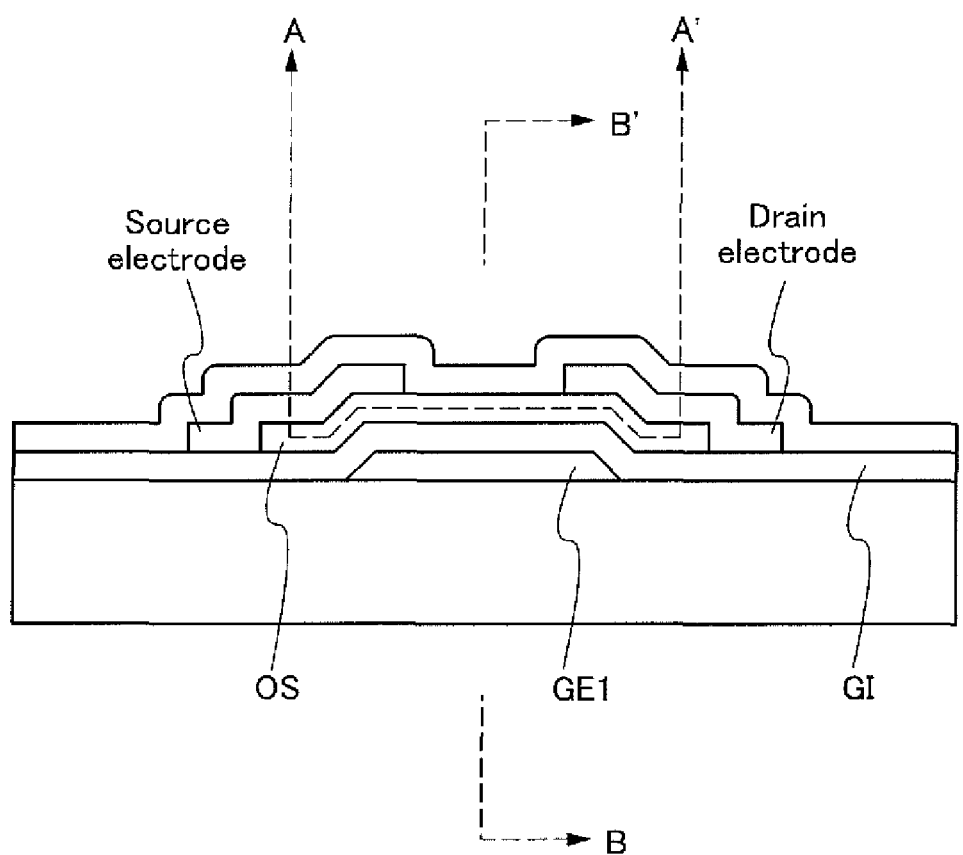
FIG. 6 is a cross-sectional view of a transistor including an oxide semiconductor.

FIG. 6 is a cross-sectional view of a transistor (thin film transistor) including an oxide semiconductor. An oxide semiconductor layer (OS) is provided over a gate electrode (GE1) with a gate insulating layer (GI) interposed therebetween, and a source electrode (S) and a drain electrode (D) are provided thereover. An insulating layer is provided so as to cover the source electrode (S) and the drain electrode (D).

Figure 7:
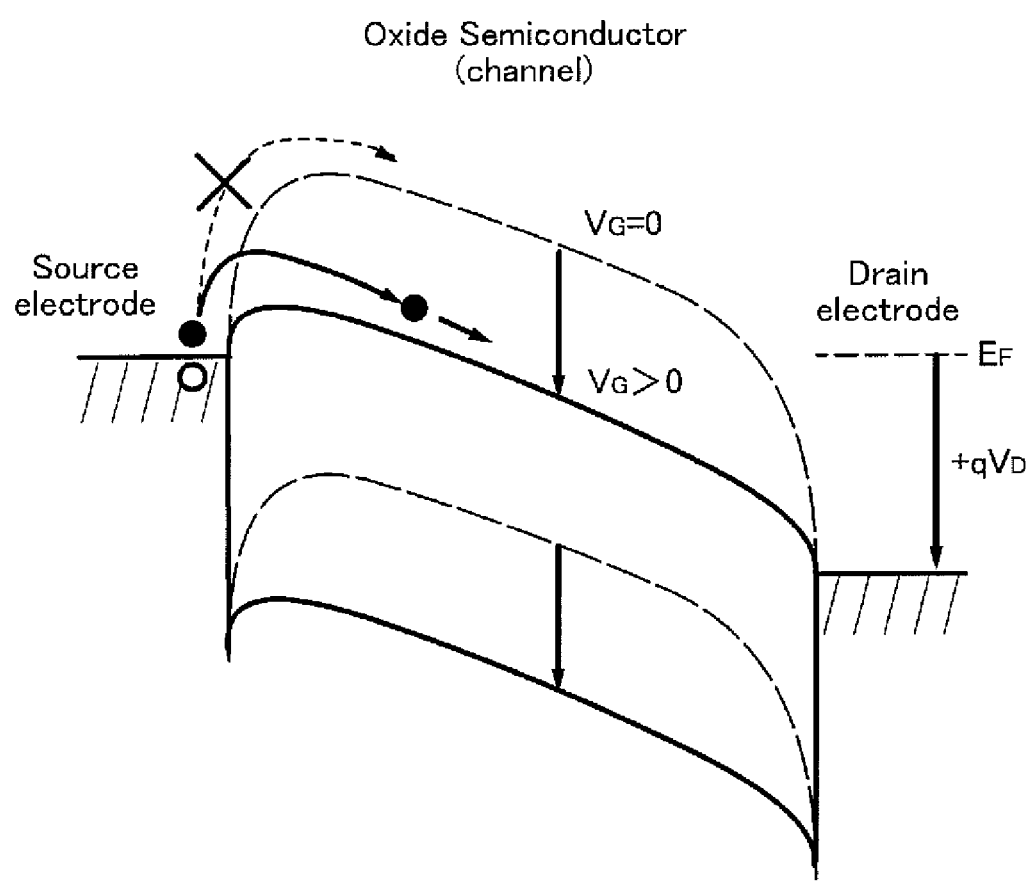
FIG. 7 is an energy band diagram (schematic diagram) along an A-A' section in FIG. 6.

FIG. 7 is an energy band diagram (schematic diagram) of the A-A' section in FIG. 6. In FIG. 7, a black circle (●) and a white circle (○) represent an electron and a hole and have electric charges (−q, +q), respectively. With a positive voltage ($V_D > 0$) applied to the drain electrode, the dashed line shows the case where no voltage is applied to the gate electrode ($V_G = 0$) and the solid line shows the case where a positive voltage is applied to the gate electrode ($V_G > 0$). In the case where no voltage is applied to the gate electrode, carriers (electrons) are not injected to the oxide semiconductor side from an electrode because of high potential barrier, so that a current does not flow, which means an off state. On the other hand, when a positive voltage is applied to the gate electrode, potential barrier is lowered, and thus a current flows, which means an on state.

Figure 8A:
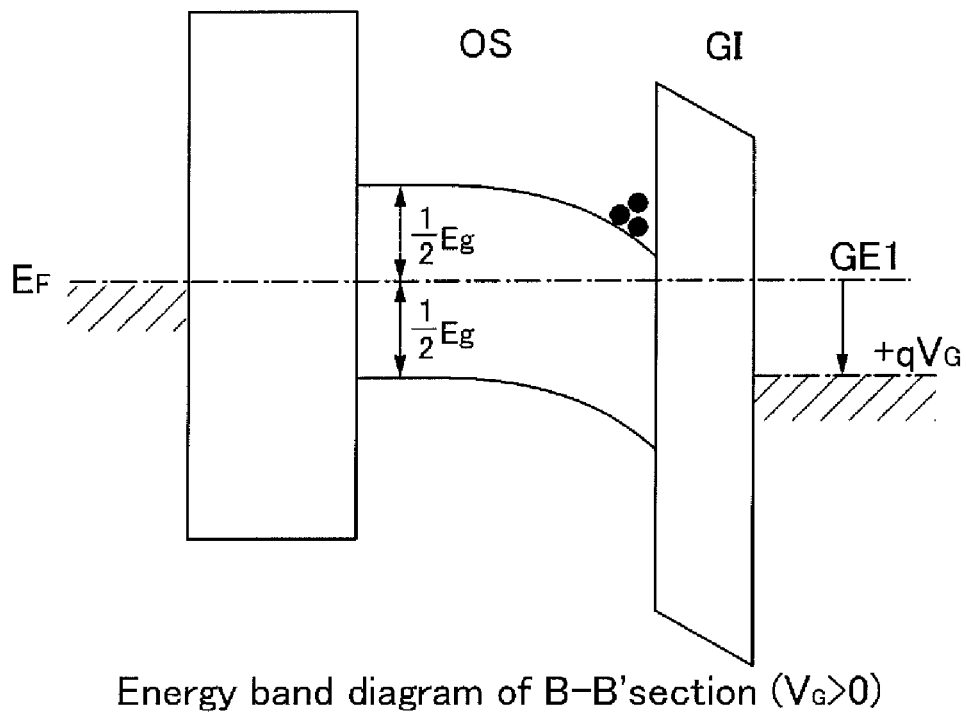
FIG. 8A is a diagram illustrating a state where a positive voltage ($V_G > 0$) is applied to a gate (GE1) and FIG. 8B is a diagram illustrating a state where a negative voltage ($V_G < 0$) is applied to the gate (GE1).
Figure 8B:
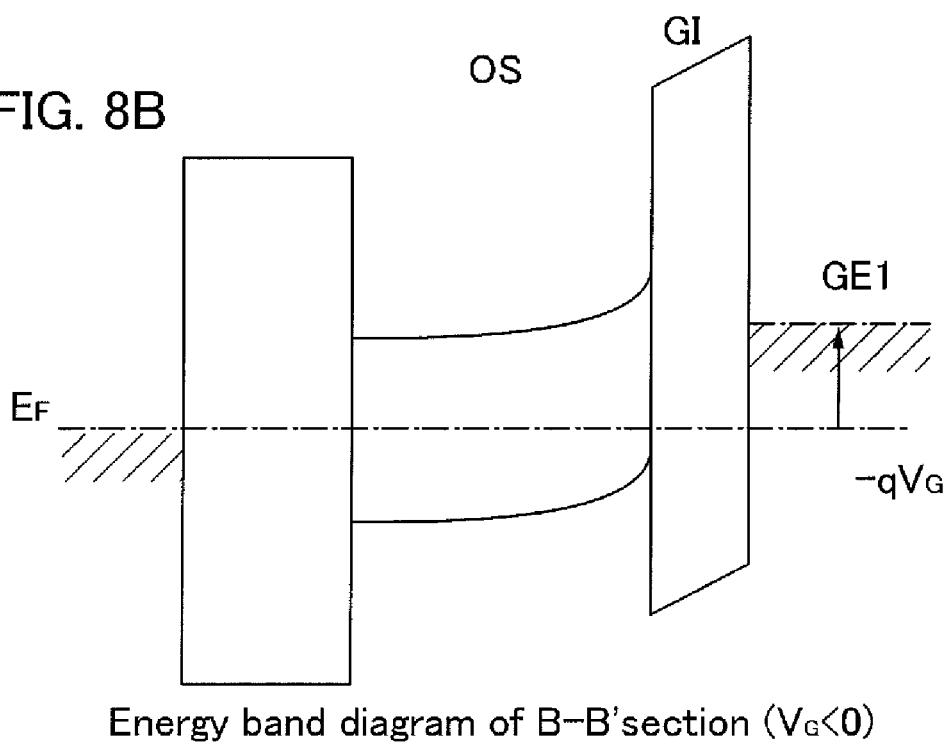

FIGS. 8A and 8B are energy band diagrams (schematic diagrams) of the B-B' section in FIG. 6. FIG. 8A illustrates an on state in which a positive voltage ($V_G > 0$) is applied to the gate electrode (GE1) and carriers (electrons) flow between the source electrode and the drain electrode. FIG. 6B illustrates an off state in which a negative voltage ($V_G < 0$) is applied to the gate electrode (GE1) and minority carriers do not flow.

Figure 9:
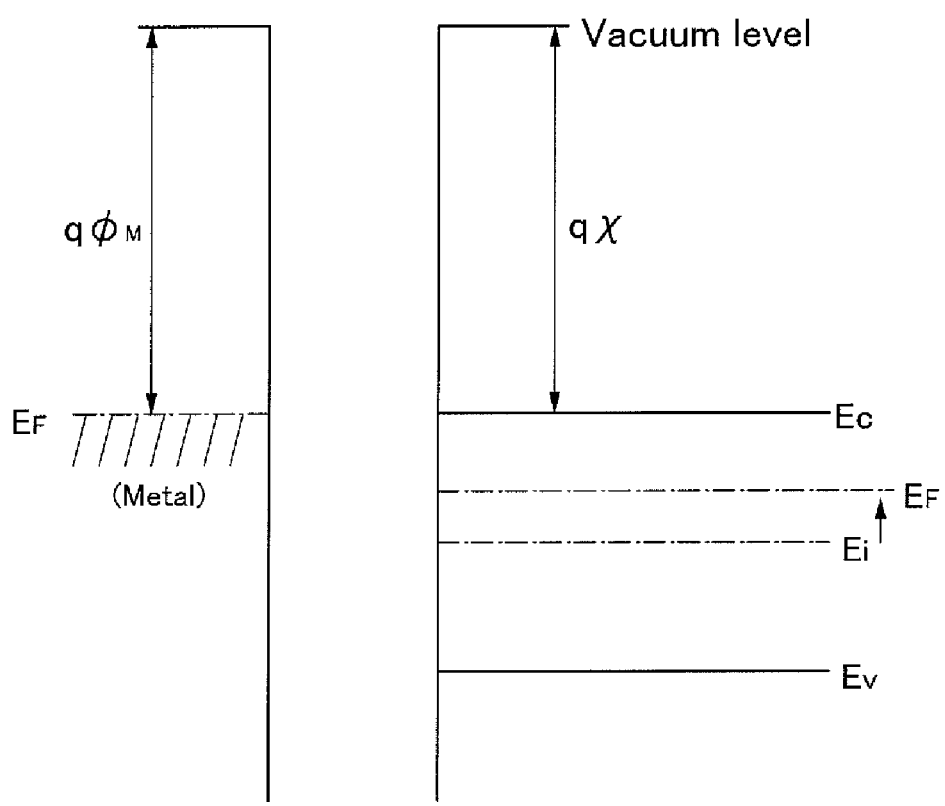
FIG. 9 is a diagram illustrating the relationships between the vacuum level and the work function of a metal ($\phi_M$) and between the vacuum level and the electron affinity ($\chi$) of an oxide semiconductor.

FIG. 9 illustrates the relationships between the vacuum level and the work function of a metal ($\phi_M$) and between the vacuum level and the electron affinity ($\chi$) of an oxide semiconductor.

At normal temperature, electrons in the metal are degenerated and the Fermi level is located in the conduction band. On the other hand, a conventional oxide semiconductor is an n-type semiconductor, in which the Fermi level ($E_F$) is away from the intrinsic Fermi level ($E_i$) located in the middle of a band gap and is located closer to the conduction band. Note that it is known that part of hydrogen is a donor in an oxide semiconductor and is one factor causing an oxide semiconductor to be an n-type semiconductor.

On the other hand, an oxide semiconductor according to one embodiment of the disclosed invention is an intrinsic (i-type) or a substantially intrinsic oxide semiconductor which is obtained by removing hydrogen that is a factor for an n-type semiconductor from an oxide semiconductor and purifying the oxide semiconductor such that an element other than a main component of the oxide semiconductor (i.e., an impurity element) is prevented from being contained therein as much as possible. In other words, a feature is that a purified i-type (intrinsic) semiconductor, or a semiconductor close thereto, is obtained not by adding an impurity element but by removing an impurity such as hydrogen or water as much as possible. Thus, the Fermi level ($E_F$) can be comparable with the intrinsic Fermi level ($E_i$).

It is said that the band gap ($E_g$) of an oxide semiconductor is 3.15 eV and the electron affinity ($\chi$) is 4.3 V. The work function of titanium (Ti) included in the source electrode and the drain electrode is substantially equal to the electron affinity ($\chi$) of the oxide semiconductor. In that case, a Schottky barrier for electrons is not formed at an interface between the metal and the oxide semiconductor.

At that time, the electron moves in the vicinity of the interface between the gate insulating layer and the purified oxide semiconductor (the lowest portion of the oxide semiconductor which is stable in terms of energy) as illustrated in FIG. 8A.

In addition, as illustrated in FIG. 8B, when a negative potential is applied to the gate electrode (GE1), the value of current is extremely close to zero because holes that are minority carriers are substantially zero.

In such a manner, an intrinsic (i-type) or substantially intrinsic oxide semiconductor is obtained by being purified such that an element other than its main element (i.e., an impurity element) is contained as little as possible. Thus, characteristics of the interface between the oxide semiconductor and the gate insulating layer become obvious. For that reason, the gate insulating layer needs to be able to form a favorable interface with the oxide semiconductor. Specifically, it is preferable to use, for example, an insulating layer formed by a CVD method using high-density plasma generated with a power supply frequency in the range of the VHF band to the microwave band, an insulating layer formed by a sputtering method, or the like.

When the oxide semiconductor is purified and the interface between the oxide semiconductor and the gate insulating layer is made favorable, in the case where the transistor has a channel width (W) of $1\times10^4$ μm and a channel length (L) of 3 μm, for example, it is possible to realize an off-state current of $10^{-13}$ A or less and a subthreshold swing (S value) of 0.1 V/dec (with a 100-nm-thick gate insulating layer).

The oxide semiconductor is purified as described above so as to contain an element other than its main element (i.e., an impurity element) as little as possible, so that the thin film transistor can operate in a favorable manner.

<Carrier Concentration>

In a technical idea according to the disclosed invention, an oxide semiconductor layer is made as close as possible to an intrinsic (i-type) oxide semiconductor layer by sufficiently reducing carrier concentration thereof. Hereinafter, a method for calculating the carrier concentration and carrier concentration actually measured are described with reference to FIG. 10 and FIG. 11.

First, a method for calculating the carrier concentration is briefly explained. The carrier concentration can be calculated in such a manner that a MOS capacitor is manufactured and results of C-V measurement (C-V characteristics) of the MOS capacitor are evaluated.

Specifically, carrier concentration $N_d$ is calculated in the following manner: a graph of C-V characteristics are obtained by plotting relations between a gate voltage ($V_G$) and a capacitance (C) of a MOS capacitor; a graph of a relation between the gate voltage $V_G$ and $(1/C)^2$ is obtained with the use of the C-V characteristics; a differential value of $(1/C)^2$ in a weak inversion region of the graph is found; and the differential value is substituted into Formula 1. Note that e, $\epsilon_0$, and $\epsilon$ in Formula 1 represent elementary electric charge, vacuum permittivity, and relative permittivity of an oxide semiconductor, respectively.

[Equation 1]

$$N_d = -\left(\frac{2}{e\epsilon_0\epsilon}\right) \bigg/ \frac{d(1/C)^2}{dV} \quad (1)$$

Next, carrier concentration actually measured by the above method is described. For the measurement, a sample (a MOS capacitor) which was formed as follows was used: a titanium film was formed to a thickness of 300 nm over a glass substrate; a titanium nitride film was formed to a thickness of 100 nm over the titanium film; an oxide semiconductor layer using an In—Ga—Zn—O-based oxide semiconductor was formed to a thickness of 2 μm over the titanium nitride film; and a silver film was formed to a thickness of 300 nm over the oxide semiconductor layer. Note that the oxide semiconductor layer was formed using an In—Ga—Zn—O-based oxide semiconductor target for film formation ($In_2O_3:Ga_2O_3$: ZnO=1:1:1 (molar ratio)) by a sputtering method. Further, a formation atmosphere of the oxide semiconductor layer was a mixed atmosphere of argon and oxygen (a flow ratio was Ar:$O_2$=30 (sccm):15 (sccm)).

Figure 10:
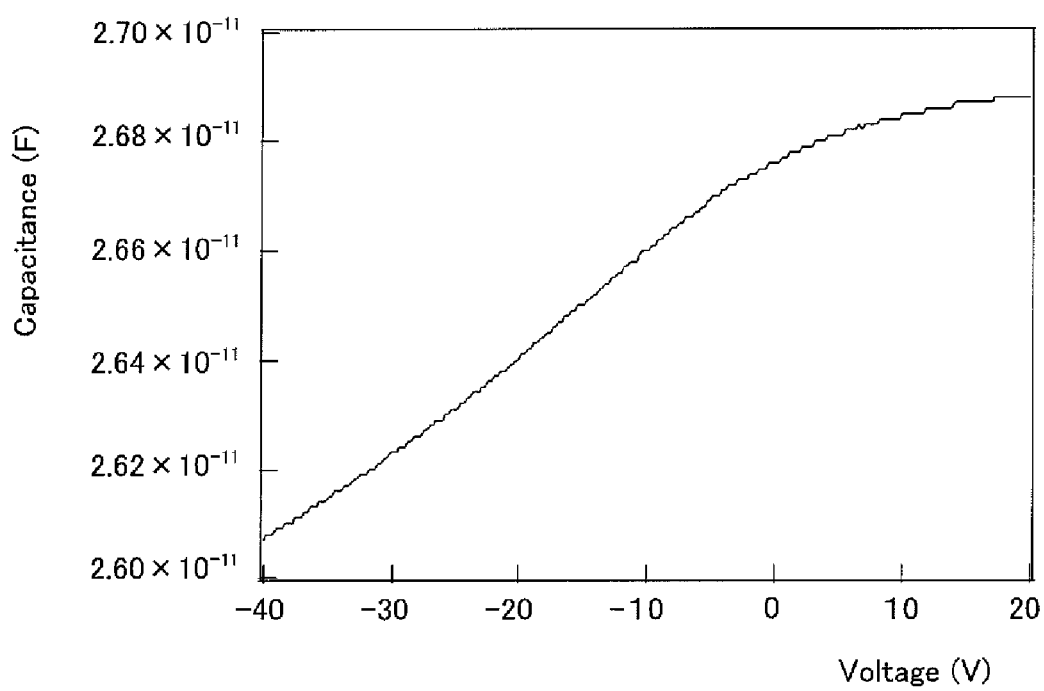
FIG. 10 illustrates C-V characteristics.
Figure 11:
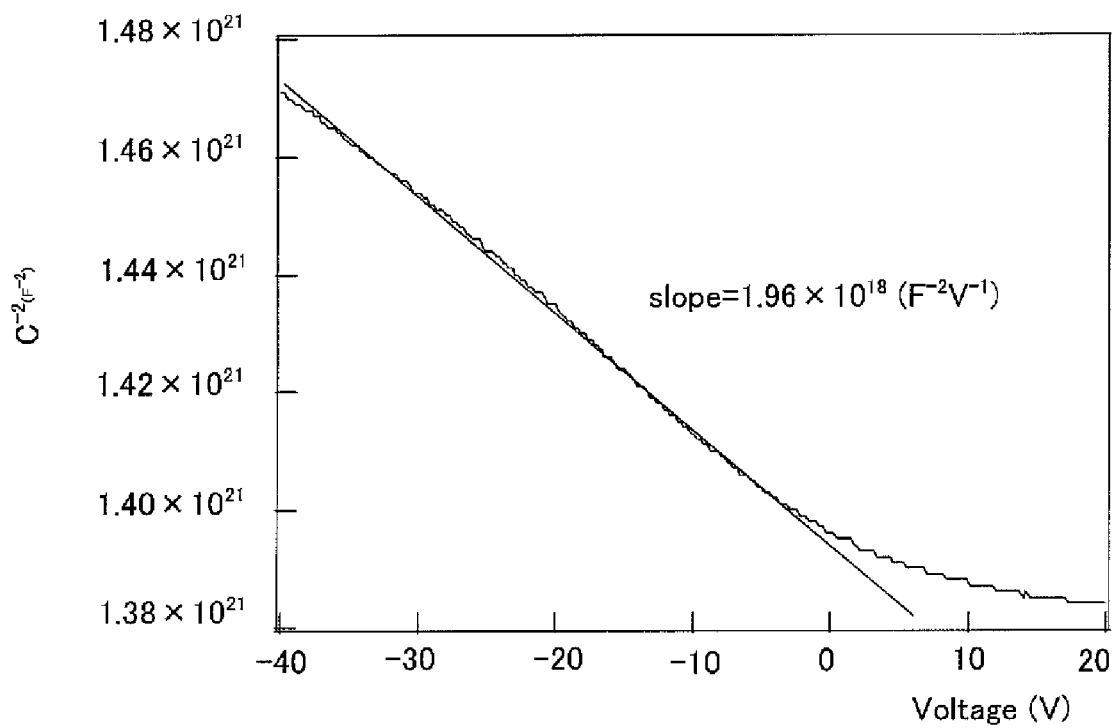
FIG. 11 illustrates a relation between $V_G$ and $(1/C)^2$.

The C-V characteristics and the relation between the gate voltage ($V_G$) and $(1/C)^2$ are illustrated in FIG. 10 and FIG. 11, respectively. The carrier concentration calculated using Formula 1 from the differential value of $(1/C)^2$ in a weak inversion region shown in the graph of FIG. 11 was $6.0\times10^{10}$/cm$^3$.

As described above, by using an oxide semiconductor which is made to be an i-type or substantially i-type oxide semiconductor (for example, carrier concentration is less than or equal to $1\times10^{12}$/cm$^3$, preferably, less than or equal to $1\times10^{11}$/cm$^3$), a transistor which has extremely favorable off-state current characteristics can be obtained.

Modification Example

Modification examples of a structure of a semiconductor device are described with reference to FIG. 12, FIGS. 13A and 13B, FIGS. 14A and 14B, and FIGS. 15A and 15B. Note that in the following modification examples, the structure of the transistor 162 is different from that already described. In other words, the structure of the transistor 160 is similar to that already described.

Figure 12:
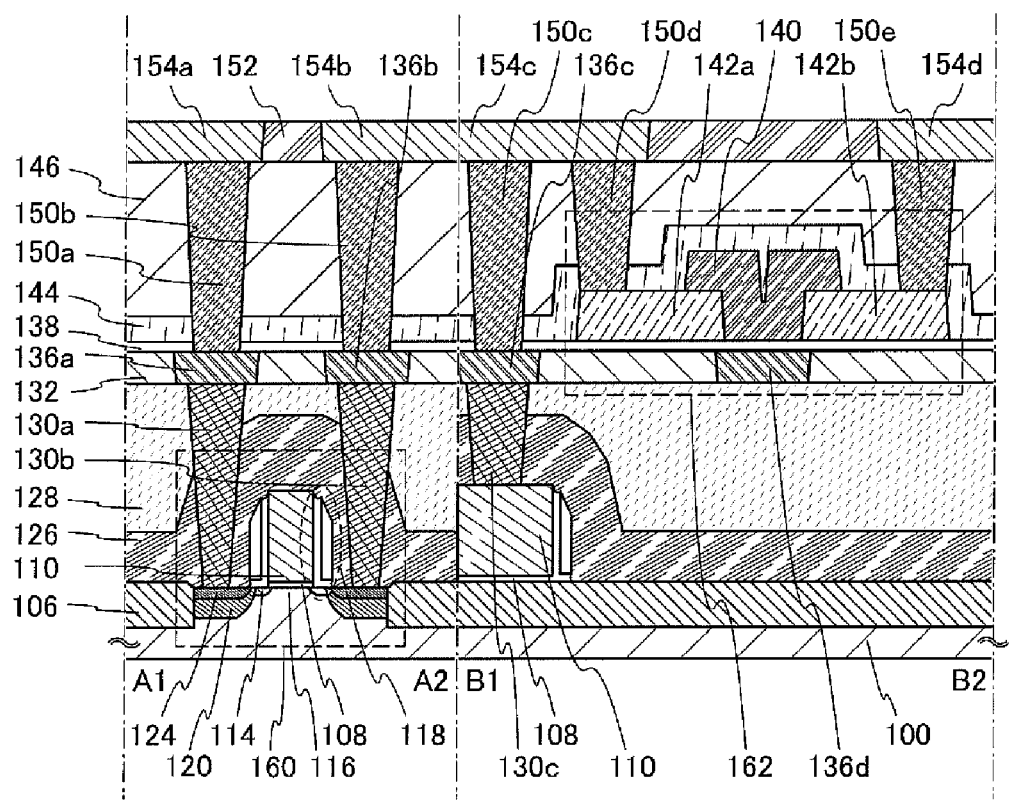
FIG. 12 is a cross-sectional view for illustrating a semiconductor device.

In an example illustrated in FIG. 12, the transistor 162 includes the gate electrode 136d under the oxide semiconductor layer 140 and the source or drain electrode 142a and the source or drain electrode 142*b* which are in contact with the oxide semiconductor layer 140 at a bottom surface of the oxide semiconductor layer 140. Since a plan structure may be appropriately changed corresponding to a cross-sectional structure, only the cross-sectional structure is described here.

A large difference between the structure illustrated in FIG. 12 and that illustrated in FIGS. 2A and 2B is that connection positions where the source or drain electrode 142*a* and the source or drain electrode 142*b* are connected to the oxide semiconductor layer 140. That is, in the structure illustrated in FIGS. 2A and 2B, the source or drain electrode 142*a* and the source or drain electrode 142*b* are in contact with the oxide semiconductor layer 140 at a top surface of the oxide semiconductor layer 140; on the other hand, in the structure illustrated in FIG. 12, the source or drain electrode 142*a* and the source or drain electrode 142*b* are in contact with the oxide semiconductor layer 140 at the bottom surface of the oxide semiconductor layer 140. In addition, resulting from this difference in contact, a position of another electrode, another insulating layer, or the like is changed. As for details of each component, FIGS. 2A and 2B can be referred to.

Specifically, the transistor 162 includes: the gate electrode 136*d* provided over the interlayer insulating layer 128; the gate insulating layer 138 provided over the gate electrode 136*d*; the source or drain electrode 142*a* and the source or drain electrode 142*b* which are provided over the gate insulating layer 138; and the oxide semiconductor layer 140 in contact with top surfaces of the source or drain electrode 142*a* and the source or drain electrode 142*b*.

Here, the gate electrode 136*d* is provided so as to be embedded in the insulating layer 132 which is formed over the interlayer insulating layer 128. Furthermore, similarly to the gate electrode 136*d*, an electrode 136*a*, an electrode 136*b*, and an electrode 136*c* are formed in contact with the source or drain electrode 130*a*, the source or drain electrode 130*b*, and the electrode 130*c*, respectively.

Over the transistor 162, a protective insulating layer 144 is provided in contact with part of the oxide semiconductor layer 140. An interlayer insulating layer 146 is provided over the protective insulating layer 144. Here, in the protective insulating layer 144 and the interlayer insulating layer 146, openings reaching the source or drain electrode 142*a* and the source or drain electrode 142*b* are formed. In the openings, the electrode 150*d* and the electrode 150*e* are formed to be in contact with the source or drain electrode 142*a* and the source or drain electrode 142*b*, respectively. Similarly to the electrodes 150*d* and 150*e*, the electrode 150*a*, the electrode 150*b*, and the electrode 150*c* are formed to be in contact with the electrode 136*a*, the electrode 136*b*, and the electrode 136*c*, respectively, in openings provided in the gate insulating layer 138, the protective insulating layer 144, and the interlayer insulating layer 146.

Furthermore, the insulating layer 152 is provided over the interlayer insulating layer 146. The electrode 154*a*, the electrode 154*b*, the electrode 154*c*, and the electrode 154*d* are provided so as to be embedded in the insulating layer 152. Here, the electrode 154*a* is in contact with the electrode 150*a*; the electrode 154*b*, the electrode 150*b*; the electrode 154*c*, the electrodes 150*c* and 150*d*; and the electrode 154*d*, the electrode 150*e*.

Figure 13A:
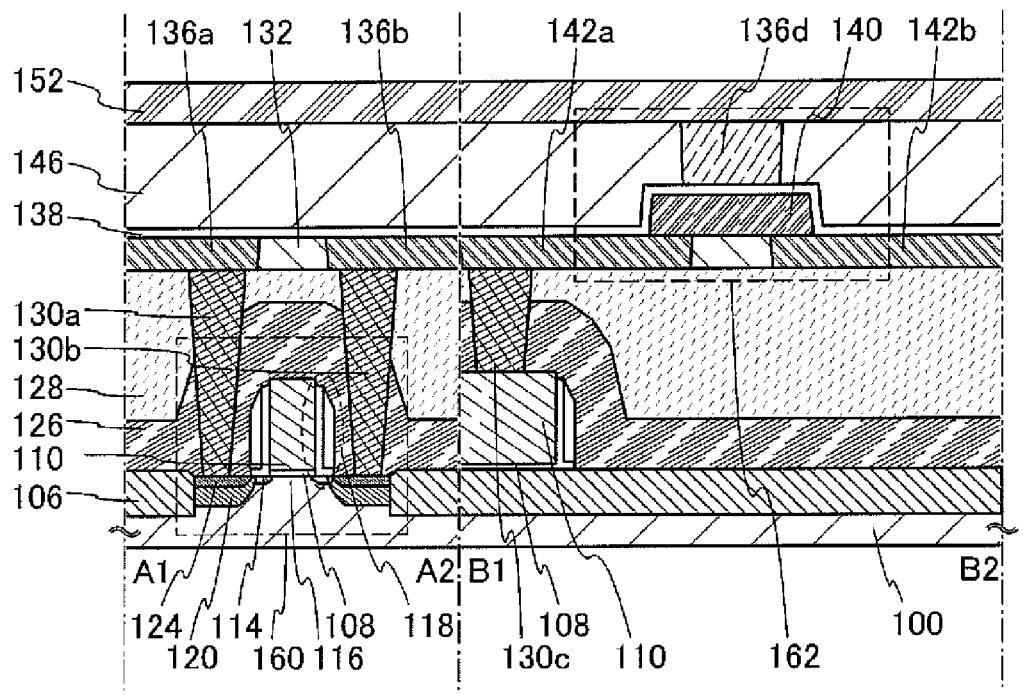
FIGS. 13A and 13B are each a cross-sectional view for illustrating a semiconductor device.
Figure 13B:
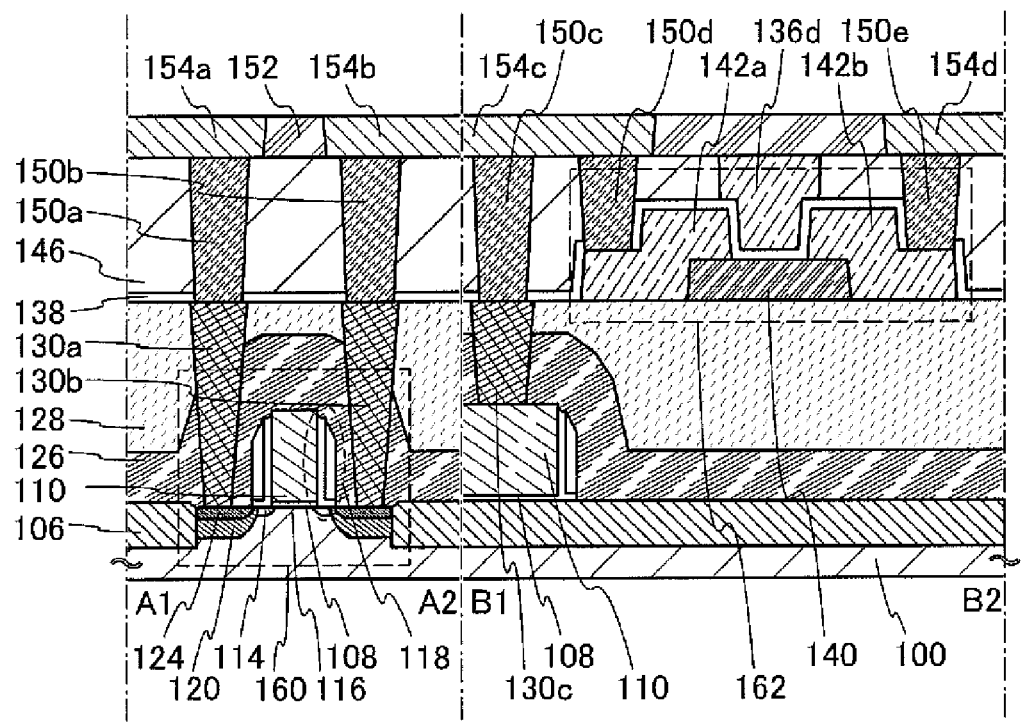

FIGS. 13A and 13B each illustrate an example in which the gate electrode 136*d* is provided over the oxide semiconductor layer 140. Here, FIG. 13A illustrates an example in which the source or drain electrode 142*a* and the source or drain electrode 142*b* are in contact with the oxide semiconductor layer 140 at the bottom surface of the oxide semiconductor layer 140; and FIG. 13B illustrates an example in which the source or drain electrode 142*a* and the source or drain electrode 142*b* are in contact with the oxide semiconductor layer 140 at the top surface of the oxide semiconductor layer 140.

The structures of FIGS. 13A and 13B are largely different from those of FIGS. 2A and 2B and FIG. 12 in that the gate electrode 136*d* is provided over the oxide semiconductor layer 140. In addition, a large difference between the structure illustrated in FIG. 13A and that illustrated in FIG. 13B is the surface at which the source or drain electrode 142*a* and the source or drain electrode 142*b* are in contact with the oxide semiconductor layer 140, which is either the top surface or the bottom surface of the oxide semiconductor layer 140. In addition, resulting from these differences, a position of another electrode, another insulating layer, or the like is changed. As for details of each component, FIGS. 2A and 2B or other drawings can be referred to.

Specifically, in FIG. 13A, the transistor 162 includes: the source or drain electrode 142*a* and the source or drain electrode 142*b* which are provided over the interlayer insulating layer 128; the oxide semiconductor layer 140 which is in contact with the top surfaces of the source or drain electrode 142*a* and the source or drain electrode 142*b*; the gate insulating layer 138 provided over the oxide semiconductor layer 140; and the gate electrode 136*d* over the gate insulating layer 138 which is in a region overlapping with the oxide semiconductor layer 140.

In FIG. 13B, the transistor 162 includes: the oxide semiconductor layer 140 provided over the interlayer insulating layer 128; the source or drain electrode 142*a* and the source or drain electrode 142*b* which are provided in contact with the top surface of the oxide semiconductor layer 140; the gate insulating layer 138 provided over the oxide semiconductor layer 140, the source or drain electrode 142*a*, and the source or drain electrode 142*b*; and the gate electrode 136*d* over the gate insulating layer 138 which is provided in a region overlapping with the oxide semiconductor layer 140.

Note that in the structures illustrated in FIGS. 13A and 13B, a component (e.g., the electrode 150*a*, the electrode 154*a*, or the like) which the structure illustrated in FIGS. 2A and 2B or the like has can be omitted in some cases. In such a case, simplification of the manufacturing process can be achieved secondarily. Needless to say, a component which is not essential can be omitted also in the structure illustrated in FIGS. 2A and 2B or the like.

Figure 14A:
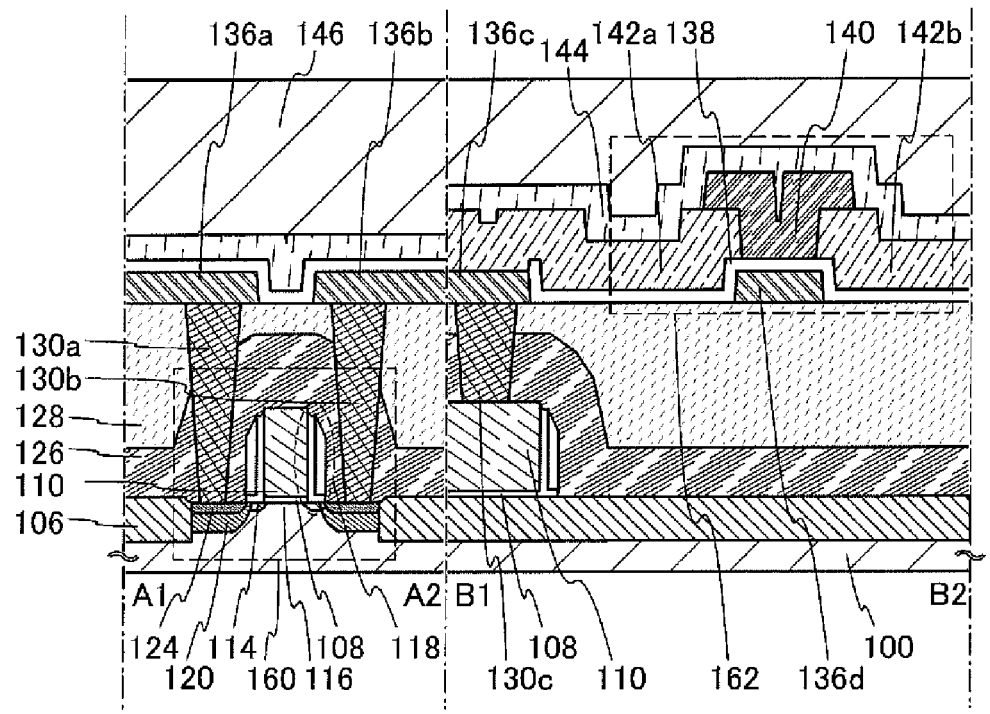
FIGS. 14A and 14B are each a cross-sectional view for illustrating a semiconductor device.
Figure 14B:
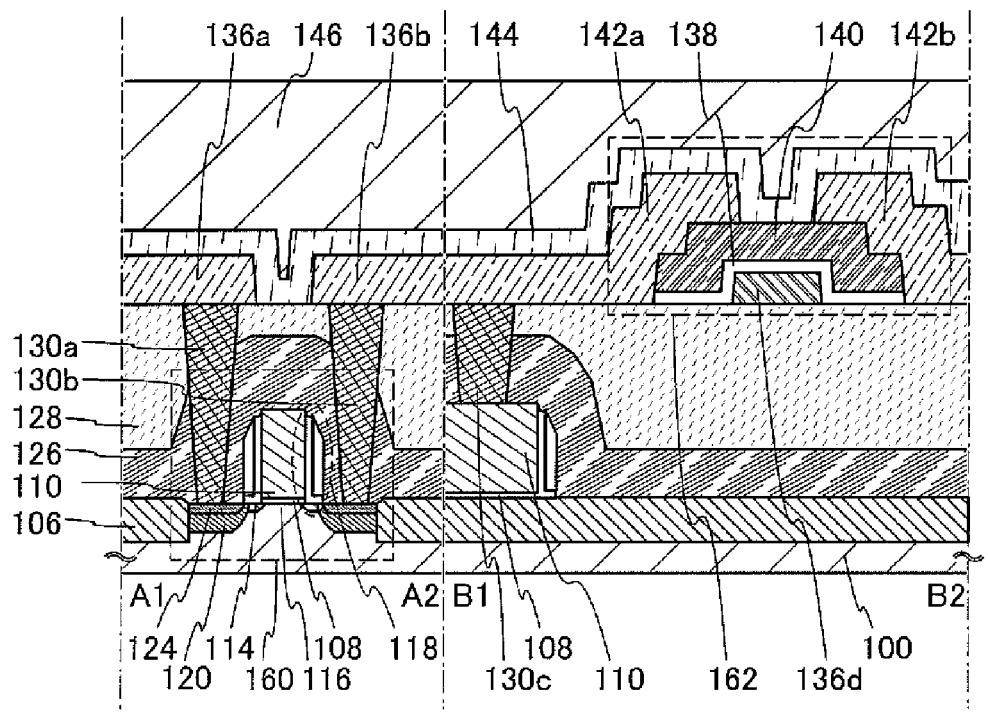

FIGS. 14A and 14B each illustrate an example of a structure in which the element has a relatively large size and the gate electrode 136*d* is provided under the oxide semiconductor layer 140. In this case, a wiring, an electrode, or the like does not need to be formed so as to be embedded in the insulating layer because flatness or coverage of a surface is not needed to be extremely high. For example, the gate electrode 136*d* and the like can be formed in such a manner that a conductive layer is formed and then patterned. Note that although not illustrated, the transistor 160 can be manufactured similarly.

A large difference between the structure illustrated in FIG. 14A and that illustrated in FIG. 14B is the surface at which the source or drain electrode 142*a* and the source or drain electrode 142*b* are in contact with the oxide semiconductor layer 140, which is either the top surface or the bottom surface of the oxide semiconductor layer 140. In addition, resulting from this difference, a position of another electrode, another insulating layer, or the like is changed. As for details of each component, FIGS. 2A and 2B or other drawings can be referred to.

Specifically, in FIG. 14A, the transistor 162 includes: the gate electrode 136*d* provided over the interlayer insulating layer 128; the gate insulating layer 138 provided over the gate electrode 136d; the source or drain electrode 142a and the source or drain electrode 142b which are provided over the gate insulating layer 138; and the oxide semiconductor layer 140 in contact with the top surfaces of the source or drain electrode 142a and the source or drain electrode 142b.

In FIG. 14B, the transistor 162 includes: the gate electrode 136d provided over the interlayer insulating layer 128; the gate insulating layer 138 provided over the gate electrode 136d; the oxide semiconductor layer 140 provided over the gate insulating layer 138 so as to overlap with the gate electrode 136d; and the source or drain electrode 142a and the source or drain electrode 142b which are provided in contact with the top surface of the oxide semiconductor layer 140.

Note that a component which the structure illustrated in FIGS. 2A and 2B or the like has can be omitted in some cases also in the structures illustrated in FIGS. 14A and 14B. Also in this case, simplification of the manufacturing process can be achieved.

Figure 15A:
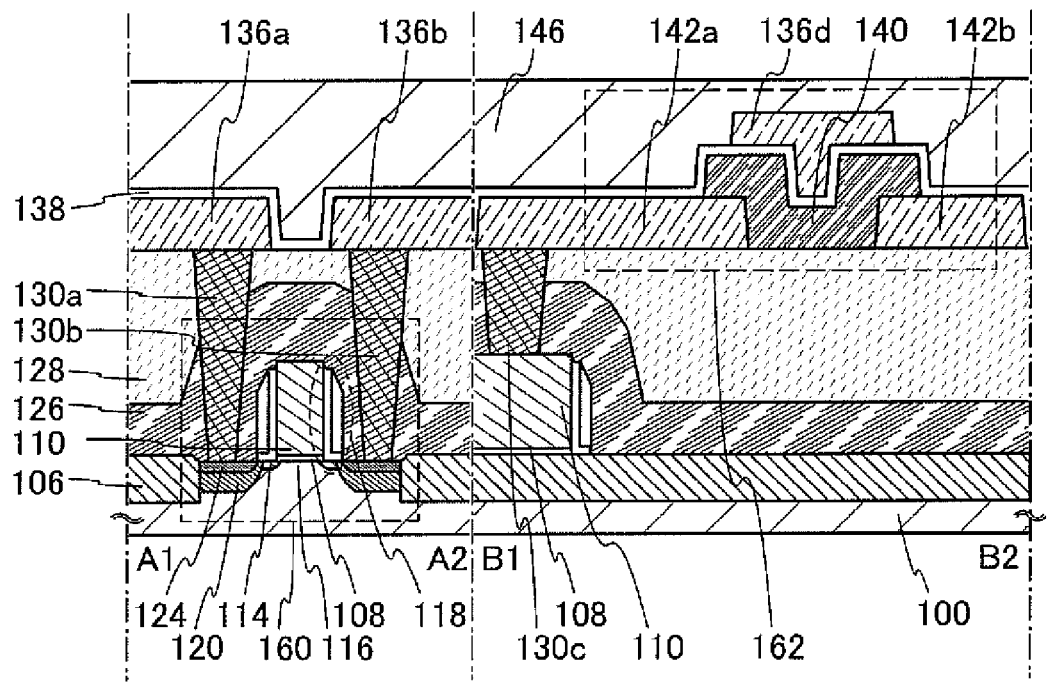
FIGS. 15A and 15B are each a cross-sectional view for illustrating a semiconductor device.
Figure 15B:
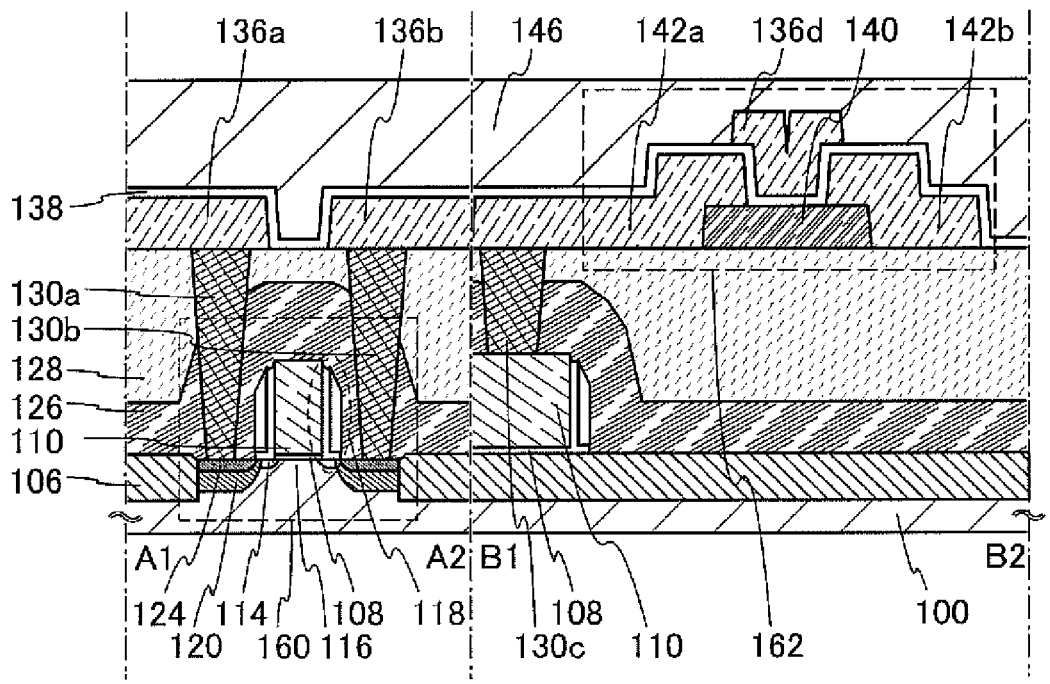

FIGS. 15A and 15B each illustrate an example of a structure in which the element has a relatively large size and the gate electrode 136d is provided over the oxide semiconductor layer 140. Also in this case, a wiring, an electrode, or the like does not need to be formed so as to be embedded in the insulating layer because flatness or coverage of a surface is not needed to be extremely high. For example, the gate electrode 136d and the like can be formed in such a manner that a conductive layer is formed and then patterned. Note that although not illustrated, the transistor 160 can be manufactured similarly.

A large difference between the structure illustrated in FIG. 15A and that illustrated in FIG. 15B is the surface at which the source or drain electrode 142a and the source or drain electrode 142b are in contact with the oxide semiconductor layer 140, which is either the top surface or the bottom surface of the oxide semiconductor layer 140. In addition, resulting from this difference, a position of another electrode, another insulating layer, or the like is changed. As for details of each component, FIGS. 2A and 2B or other drawings can be referred to.

Specifically, in FIG. 15A, the transistor 162 includes: the source or drain electrode 142a and the source or drain electrode 142b which are provided over the interlayer insulating layer 128; the oxide semiconductor layer 140 which is in contact with the top surfaces of the source or drain electrode 142a and the source or drain electrode 142b; the gate insulating layer 138 provided over the source or drain electrode 142a, the source or drain electrode 142b, and the oxide semiconductor layer 140; and the gate electrode 136d over the gate insulating layer 138 which is provided in a region overlapping with the oxide semiconductor layer 140.

In FIG. 15B, the transistor 162 includes: the oxide semiconductor layer 140 provided over the interlayer insulating layer 128; the source or drain electrode 142a and the source or drain electrode 142b which are provided in contact with the top surface of the oxide semiconductor layer 140; the gate insulating layer 138 provided over the source or drain electrode 142a, the source or drain electrode 142b, and the oxide semiconductor layer 140; and the gate electrode 136d over the gate insulating layer 138 which is provided in a region overlapping with the oxide semiconductor layer 140.

Note that a component which the structure illustrated in FIGS. 2A and 2B or the like has can be omitted in some cases also in the structures illustrated in FIGS. 15A and 15B. Also in this case, simplification of the manufacturing process can be achieved.

As described above, according to one embodiment of the disclosed invention, a semiconductor device having a novel structure is realized. Although the transistor 160 and the transistor 162 are stacked in this embodiment, the structure of the semiconductor device is not limited thereto. Further, although an example in which the channel length direction of the transistor 160 and that of the transistor 162 are perpendicular to each other is described, the positions of the transistors 160 and 162 are not limited to this. In addition, the transistors 160 and 162 may be provided to overlap with each other.

Note that although in this embodiment a semiconductor device per minimum storage unit (one bit) is described for easy understanding, the structure of the semiconductor device is not limited to this. A more developed semiconductor device can be formed by appropriately connecting a plurality of semiconductor devices. For example, it is possible to make a NAND-type or NOR-type semiconductor device by using a plurality of the semiconductor devices. The structure of the wiring is not limited to that illustrated in FIG. 1 and can be changed as appropriate.

In the semiconductor device according to this embodiment, the small-off-state current characteristic of the transistor 162 enables data to be held for an extremely long time. In other words, refreshing operation, which is needed in a DRAM or the like, is not necessary; thus, power consumption can be suppressed. In addition, the semiconductor device can be substantially used as a nonvolatile memory device.

Since data is written by switching operation of the transistor 162, high voltage is not needed and an element is not deteriorated in the semiconductor device. Further, information is written or erased according to an on state and an off state of the transistor, whereby high-speed operation can be easily realized. Moreover, information can be directly rewritten by controlling a potential input to the transistor. Erasing operation which is necessary in a flash memory and the like is thus not needed; therefore, reduction in operation speed due to erasing operation can be suppressed.

Furthermore, a transistor which uses a material other than an oxide semiconductor can operate at a speed much higher than a transistor which uses an oxide semiconductor, and thus realizes high-speed reading of stored data.

The methods and structures described in this embodiment can be combined as appropriate with any of the methods and structures described in the other embodiments.

Embodiment 2

In this embodiment, a circuit configuration and an operation method of a semiconductor device according to an embodiment of the present invention will be described.

Figure 16:
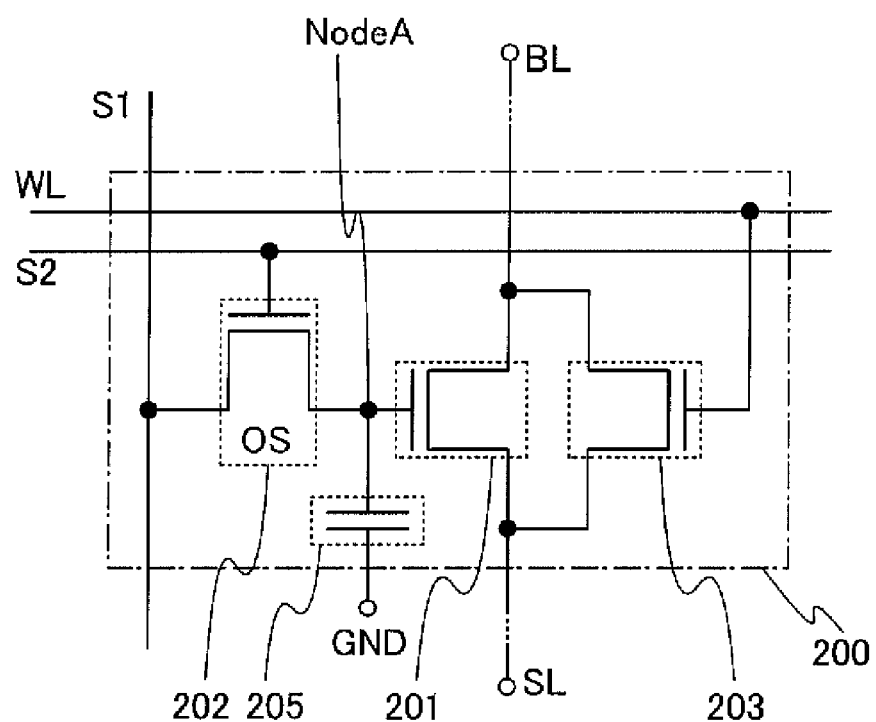
FIG. 16 is a circuit diagram for illustrating a semiconductor device.

An example of a circuit diagram of a memory element (hereinafter also referred to as a memory cell) included in the semiconductor device is illustrated in FIG. 16. A memory cell 200 illustrated in FIG. 16 is a multivalued memory cell and includes a first signal line S1 (a third wiring), a second signal line S2 (a fourth wiring), a word line WL (a fifth wiring), a transistor 201, a transistor 202, a transistor 203, and a capacitor 205. The transistors 201 and 203 are formed using a material other than an oxide semiconductor, and the transistor 202 is formed using an oxide semiconductor. Here, the transistors 201 and 203 preferably have a structure similar to that of the transistor 160 which is described in Embodiment 1. Further, the transistor 202 preferably has a structure similar to that of the transistor 162 which is described in Embodiment 1. The memory cell 200 is electrically connected to a source line SL (a first wiring) and a bit line BL (a second wiring), preferably via a transistor (which may be a transistor included in another memory cell).

Here, a gate electrode of the transistor 201 is electrically connected to one of a source electrode and a drain electrode of the transistor 202. Further, the source line SL, a source electrode of the transistor 201, and a source electrode of the transistor 203 are electrically connected to one another. The bit line BL, a drain electrode of the transistor 201, and a drain electrode of the transistor 203 are electrically connected to one another. The first signal line S1 is electrically connected to the other of the source electrode and the drain electrode of the transistor 202. The second signal line S2 is electrically connected to a gate electrode of the transistor 202, and the word line WL is electrically connected to a gate electrode of the transistor 203. Additionally, one of electrodes of the capacitor 205, the gate electrode of the transistor 201, and one of the source electrode and the drain electrode of the transistor 202 are electrically connected to one another. The other of the electrodes of the capacitor 205 is supplied with the predetermined potential, for example, GND. Note that the source line SL, the source electrode of the transistor 201, and the source electrode of the transistor 203 may be connected to one another via a transistor (which may be a transistor included in another memory cell). Further, the bit line BL, the drain electrode of the transistor 201, and the drain electrode of the transistor 203 may be connected to one another via a transistor (which may be a transistor included in another memory cell).

Here, operation of the memory cell 200 is described. For example, in the case where the memory cell 200 is a four-valued memory cell, four states of the memory cell 200 are set to data "00b", "01b", "10b", and "11b", and potentials of a node (a node A) connected to the gate electrode of the transistor 201 are set to $V_{00}$, $V_{01}$, $V_{10}$, and $V_{11}$, respectively ($V_{00}<V_{01}<V_{10}<V_{11}$). A reading method here is a method in which the bit line BL is charged via a selected memory cell from the source line SL side. When charged from the source line SL side, the bit line BL reflects a state of the memory cell 200 and is charged to a potential represented by ((the potential of the node A)−(the threshold voltage $V_{th}$ of the transistor 201)). As a result, the potentials of the bit line BL become ($V_{00}-V_{th}$), ($V_{01}-V_{th}$), ($V_{10}-V_{th}$), and ($V_{11}-V_{th}$) corresponding to the data "00b", "01b", "10b", and "11b", respectively. Since the potentials of the bit lines corresponding to the data are different from each other, the data "00b", "01b", "10b", and "11b" can be read.

Figure 17:
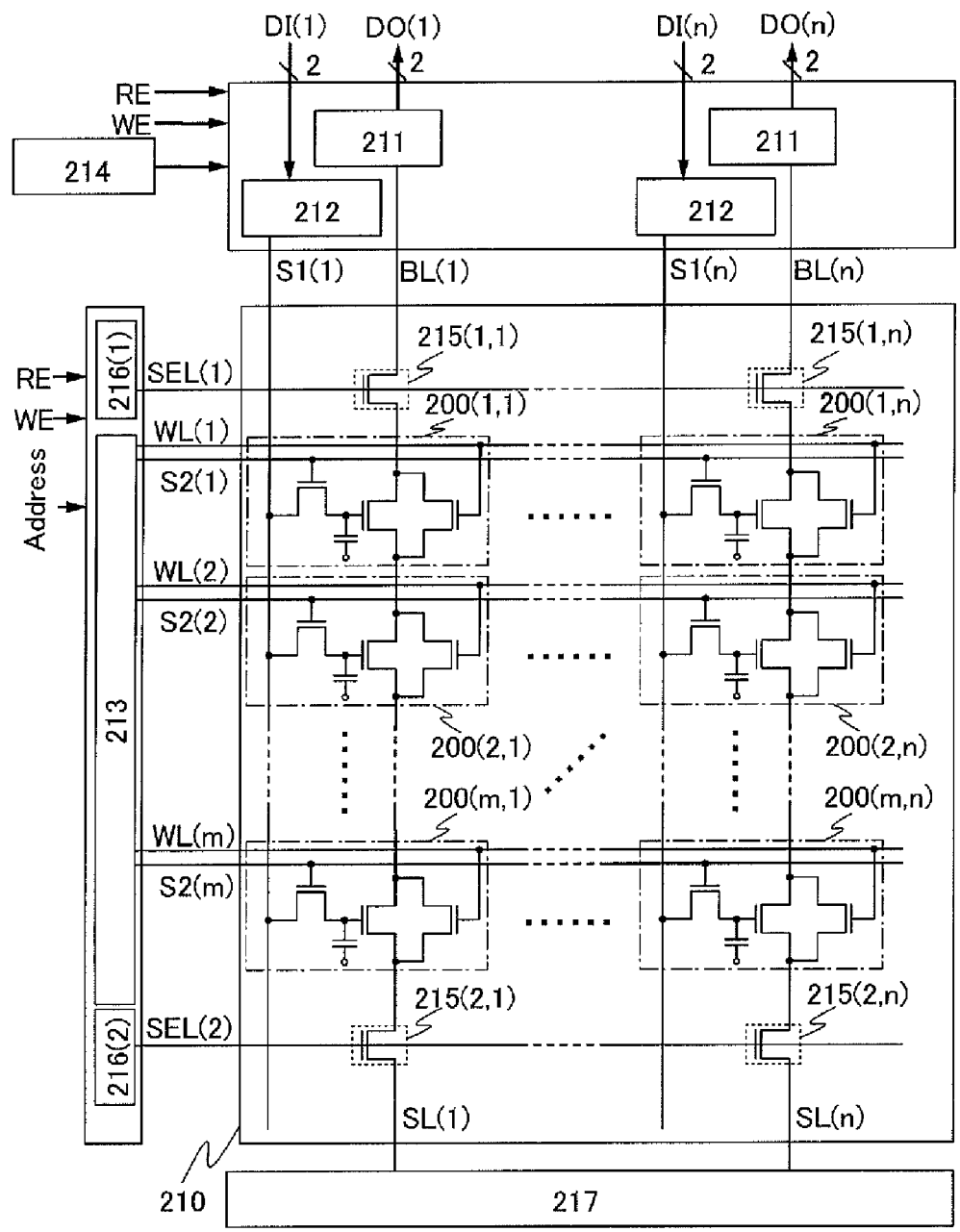
FIG. 17 is a block circuit diagram for illustrating a semiconductor device.

A block circuit diagram of a semiconductor device according to an embodiment of the present invention which includes m×n bits of storage capacity is illustrated in FIG. 17. As an example, a NAND-type semiconductor device in which the memory cells 200 are connected in series is described here.

The semiconductor device according to an embodiment of the present invention includes m word lines WL(1) to WL(m), m second signal lines S2(1) to SL(m), n bit lines BL(1) to BL(n), n first signal lines S1(1) to SL(n), two selection lines SEL(1) and SEL(2), a memory cell array 210 in which the plurality of memory cells 200(1, 1) to 200(m, n) are arranged in a matrix of m pieces (row) by n pieces (column) (m and n are natural numbers), transistors 215(1, 1) to 215(1, n) which are arranged along the selection line SEL(1) between the bit lines BL(1) to BL(n) and the memory cells 200(1, 1) to 200(1, n), transistors 215(2, 1) to 215(2, n) which are arranged along the selection line SEL(2) between the source lines SL(1) to SL(n) and the memory cells 200(m, 1) to 200(m, n), and peripheral circuits such as a driver circuit 217 for the source lines, a reading circuit 211, a driver circuit 212 for the first signal lines, a driver circuit 213 for the second signal lines and the word lines, a potential generating circuit 214, and driver circuits 216(1) and 216(2) for the selection lines. As another peripheral circuit, a refresh circuit and the like may be provided.

Each of the memory cells 200, e.g., a memory cell 200($i,j$) is considered (here, i is an integer of greater than or equal to 1 and less than or equal to m, and j is an integer of greater than or equal to 1 and less than or equal to n). The memory cell 200($i,j$) is connected to the first signal line S1($j$), the second signal line S2($i$), and the word line WL($i$). Further, the drain electrodes of the transistors 201 and 203 included in the memory cell 200($i_1,j$) ($i_1$ is an integer of greater than or equal to 2 and less than or equal to m) are connected to the source electrodes of the transistors 201 and 203 included in the memory cell 200($i_1-1$, j). The source electrodes of the transistors 201 and 203 included in the memory cell 200($i_2,j$) ($i_2$ is an integer of greater than or equal to 1 and less than or equal to m−1) are connected to the drain electrodes of the transistors 201 and 203 included in memory cell 200($i_2+1,j$). The drain electrodes of the transistors 201 and 203 included in the memory cell 200(1,$j$) are connected to a source electrode of the transistor 215(1, $j$). The source electrodes of the transistors 201 and 203 included in the memory cell 200($m,j$) are connected to a drain electrode of the transistor 215(2,$j$). A drain electrode of the transistor 215(1,$j$) is connected to the bit line BL(j) and a source electrode of the transistor 215(2,$j$) is connected to the source line SL(j). A gate electrode of the transistor 215(1,$j$) is connected to the selection line SEL(1) and a gate electrode of the transistor 215(2,$j$) is connected to the selection line SEL(2).

The source lines SL(1) to SL(n) are connected to the driver circuit 217 for the source lines; the bit lines BL(1) to BL(n) are connected to the reading circuit 211; the first signal lines S1(1) to S1($n$) are connected to the driver circuit 212 for the first signal lines; the second signal lines S2(1) to S2($m$) and the word lines WL(1) to WL(m) are connected to the driver circuit 213 for the second signal lines and the word lines; and the selection lines SEL(1) and SEL(2) are connected to the driver circuits 216(1) and 216(2) for the selection lines, respectively.

Figure 18:
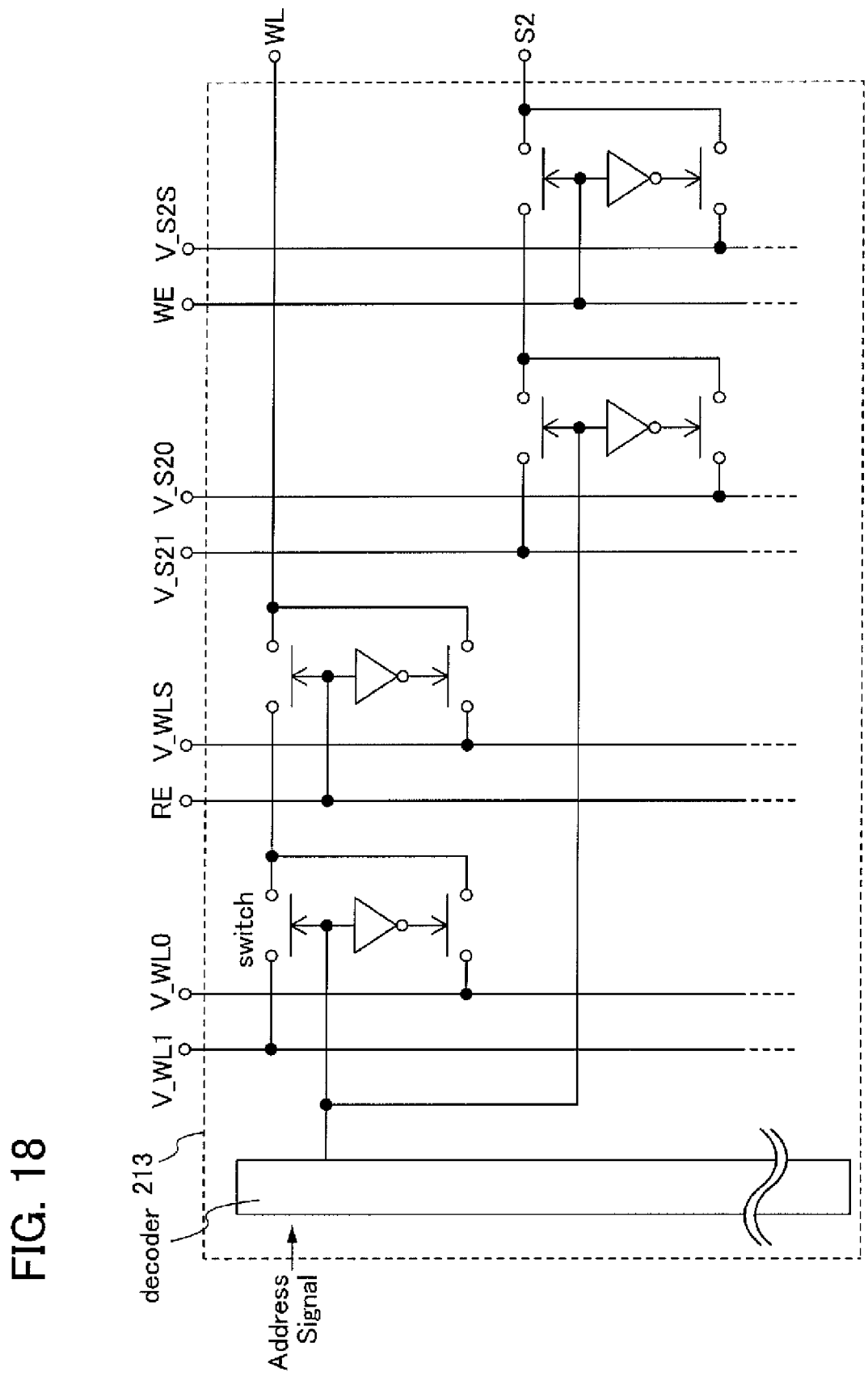
FIG. 18 is a circuit diagram for illustrating a semiconductor device.

An example of the driver circuit 213 for the second signal lines and the word lines is illustrated in FIG. 18. The driver circuit 213 for the second signal lines and the word lines includes a decoder and the like. The second signal line S2 is connected to wirings V_S20, V_S21, and V_S2S via a switch which is controlled by a write enable signal (a WE signal) and a switch which is controlled by a signal output from the decoder. The word line WL is connected to wirings V_WL0, V_WL1, and V_WLS via a switch which is controlled by a read enable signal (an RE signal) and a switch which is controlled by a signal output from the decoder. An address signal is input to the decoder from the external.

When the address signal is input to the driver circuit 213 for the second signal lines and the word lines, a row specified by the address (hereinafter also referred to as a selected row) is asserted (activation) and rows other than the row specified by the address (hereinafter also referred to as non-selected rows) are de-asserted (inactivation). When the RE signal is de-asserted, a potential V_WLS is applied to the word line WL. When the RE signal is asserted, a potential V_WL1 is applied to the word line WL in the selected row and a potential V_WL0 is applied to the word line WL in the non-selected rows. When the WE signal is de-asserted, a potential V_S2S is applied to the second signal line S2. When the WE signal is asserted, a potential V_S21 is applied to the second signal line S2 in the selected row and a potential V_S20 is applied to the second signal line S2 in the non-selected rows.

The transistor 203 which is connected to the word line WL to which the potential V_WL0 is applied is turned on. The transistor 203 which is connected to the word line WL to which the potential V_WL1 is applied is turned off. The transistor 202 which is connected to the second signal line S2 to which the potentials V_S2S and V_S20 are applied is turned off. The transistor 202 which is connected to the second signal line S2 to which the potential V_S21 is applied is turned on.

When the RE signal is asserted, the driver circuits 216(1) and 216(2) for the selection lines set the selection lines SEL(1) and SEL(2) to a potential V_SEL1 and turn the transistors 215(1, 1) to 215(1, n) and the transistors 215(2, 1) to 215(2, n) on. On the other hand, when the RE signal is de-asserted, the driver circuits 216(1) and 216(2) for the selection lines set the selection lines SEL(1) and SEL(2) to a potential V_SEL0 and turn the transistors 215(1, 1) to 215(1, n) and the transistors 215(2, 1) to 215(2, n) off.

Figure 19:
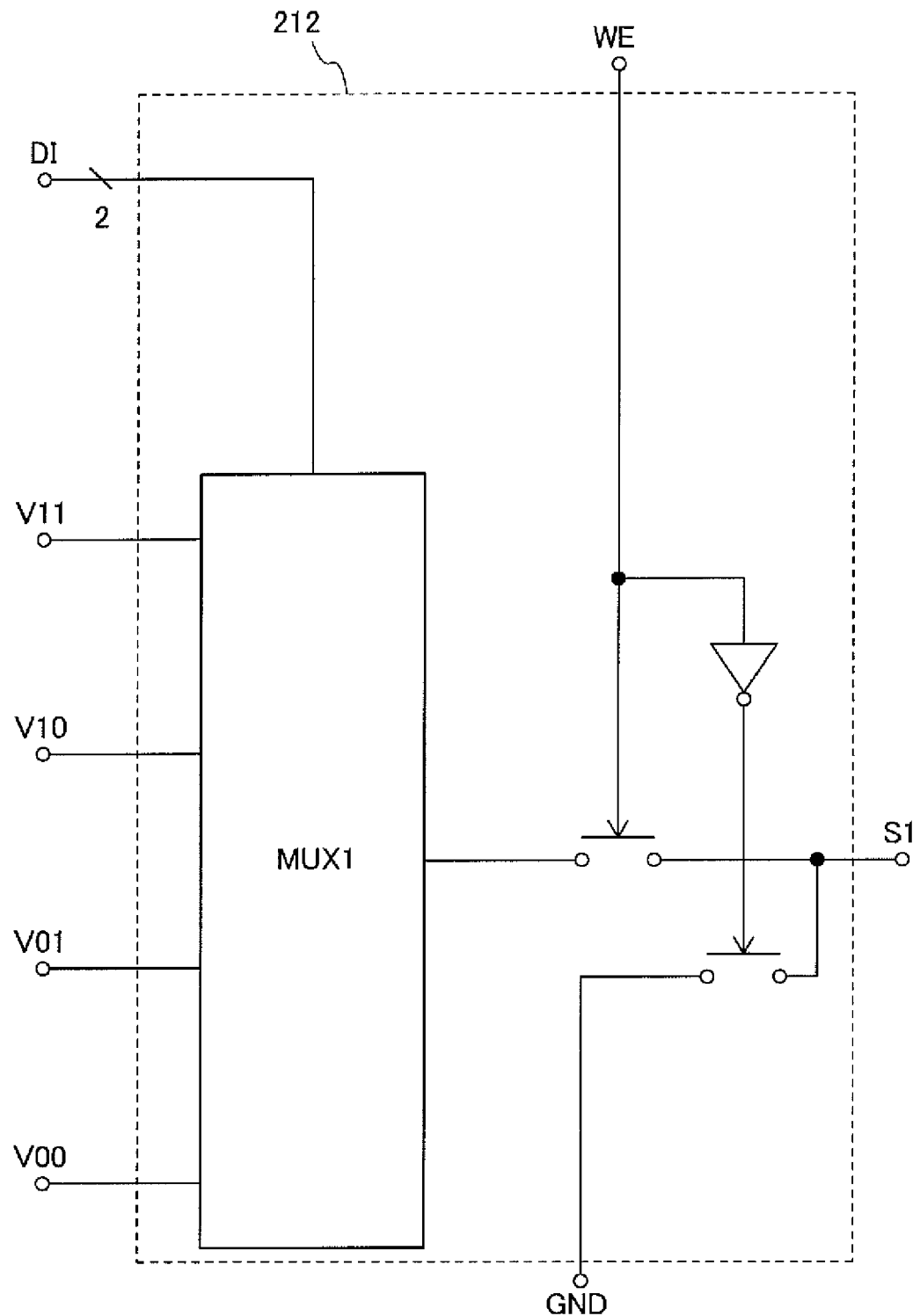
FIG. 19 is a circuit diagram for illustrating a semiconductor device.

An example of the driver circuit 212 for the first signal lines is illustrated in FIG. 19. The driver circuit 212 for the first signal lines includes a multiplexer (MUX1). A signal DI and the writing potentials $V_{00}$, $V_{01}$, $V_{10}$, and $V_{11}$ are input to the multiplexer (MUX1). An output terminal of the multiplexer (MUX1) is connected to the first signal line S1 via a switch. Additionally, the first signal line S1 is connected to GND via a switch. The switch is controlled by a write enable signal.

When the signal DI is input to the driver circuit 212 for the first signal lines, the multiplexer (MUX1) selects writing potential $V_w$ in accordance with the value of the signal DI from the writing potentials $V_{00}$, $V_{01}$, $V_{10}$, and $V_{11}$. The behavior of the multiplexer (MUX1) is shown in Table 1. When the write enable signal is asserted, the selected writing potential $V_w$ is applied to the first signal line S1. When the write enable signal is de-asserted, the first signal line S1 is connected to the GND.

TABLE 1

| DI[1] | DI[0] | output from MUX1 |
|---|---|---|
| 0 | 0 | $V_{00}$ |
| 0 | 1 | $V_{01}$ |
| 1 | 0 | $V_{10}$ |
| 1 | 1 | $V_{11}$ |

In a reading period after precharging, the driver circuit 217 for the source lines applies a potential $V_s\_read$ to the source line SL. In other periods, 0 V is applied. Here, the potential $V_s\_read$ is higher than a potential $(V_{11}-V_{th})$.

Figure 20:
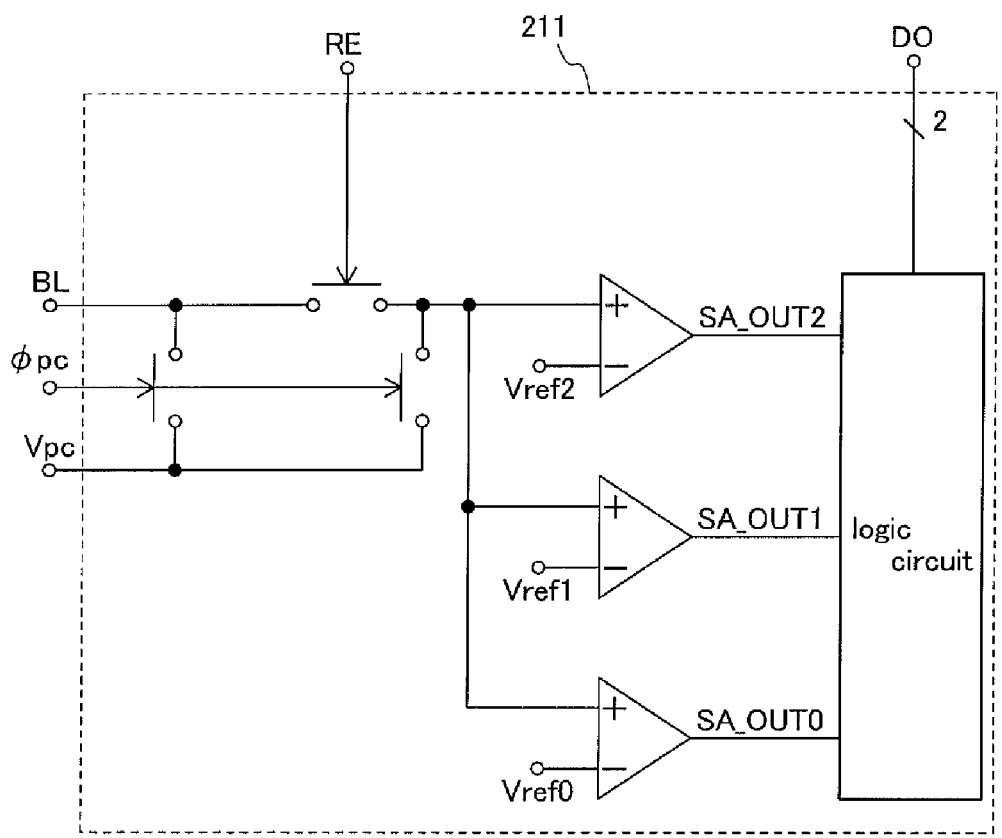
FIG. 20 is a circuit diagram for illustrating a semiconductor device.

An example of the reading circuit 211 is illustrated in FIG. 20. The reading circuit 211 includes sense amplifier circuits, a logic circuit, and the like. One input terminal of each of the sense amplifier circuits is connected to the bit line BL or a wiring $V_{pc}$ via switches. Any of reference potentials $V_{ref0}$, $V_{ref1}$, and $V_{ref2}$ is input to the other input terminal of each of the sense amplifier circuits. An output terminal of each of the sense amplifier circuits is connected to an input terminal of the logic circuit. Note that the switches are controlled by a read enable signal and a signal Φpc.

A state of a memory cell can be read as a digital signal with three bits by setting values of each of the reference potentials $V_{ref0}$, $V_{ref1}$, and $V_{ref2}$ so that $(V_{00}-V_{th})<V_{ref0}<(V_{01}-V_{th})<V_{ref1}<(V_{10}-V_{th})<V_{ref2}<(V_{11}-V_{th})$. For example, in the case of data "00b", a potential of the bit line BL is $(V_{00}-V_{th})$. Here, the value of the potential of the bit line is smaller than any of the reference potentials $V_{ref0}$, $V_{ref1}$, and $V_{ref2}$, whereby, outputs SA_OUT0, SA_OUT1 and SA_OUT2 of the sense amplifier circuits all become "0". Similarly, in the case of data "01b", the outputs SA_OUT0, SA_OUT1, and SA_OUT2 of the sense amplifier circuits become "1", "0", and "0", respectively. In the case of data "10b", the outputs SA_OUT0, SA_OUT1, and SA_OUT2 of the sense amplifier circuits become "1", "1", and "0", respectively. In the case of data "11b", the outputs SA_OUT0, SA_OUT1, and SA_OUT2 of the sense amplifier circuits become "1", "1", and "1", respectively. After that, using the logic circuit shown in a logic table in Table 2, data DO with two bits is generated and output from the reading circuit 211.

TABLE 2

| SA_OUT0 | SA_OUT1 | SA_OUT2 | DO[1] | DO[0] |
|---|---|---|---|---|
| 0 | 0 | 0 | 0 | 0 |
| 1 | 0 | 0 | 0 | 1 |
| 1 | 1 | 0 | 1 | 0 |
| 1 | 1 | 1 | 1 | 1 |

Note that in the reading circuit 211 illustrated here, when the φpc signal is asserted, the bit line BL and the input terminals of the sense amplifier circuits connected to the bit line BL are charged to a potential $V_{pc}$. In other words, precharge can be performed with the signal Φpc. Note that the potential $V_{pc}$ is set to lower than $(V_{00}-V_{th})$. When the RE signal is asserted, the potential $V_s\_read$ is applied to the source line SL which is connected to the driver circuit 217 for the source lines, whereby a potential reflecting data is charged to the bit line BL. Then, the reading is performed in the reading circuit 211.

Note that "a potential of the bit line BL" compared in reading includes a potential of a node of input terminals of the sense amplifier circuits connected to the bit line BL via the switch. That is, a potential compared in the reading circuit does not need to be exactly the same as the potential of the bit line BL.

Figure 21:
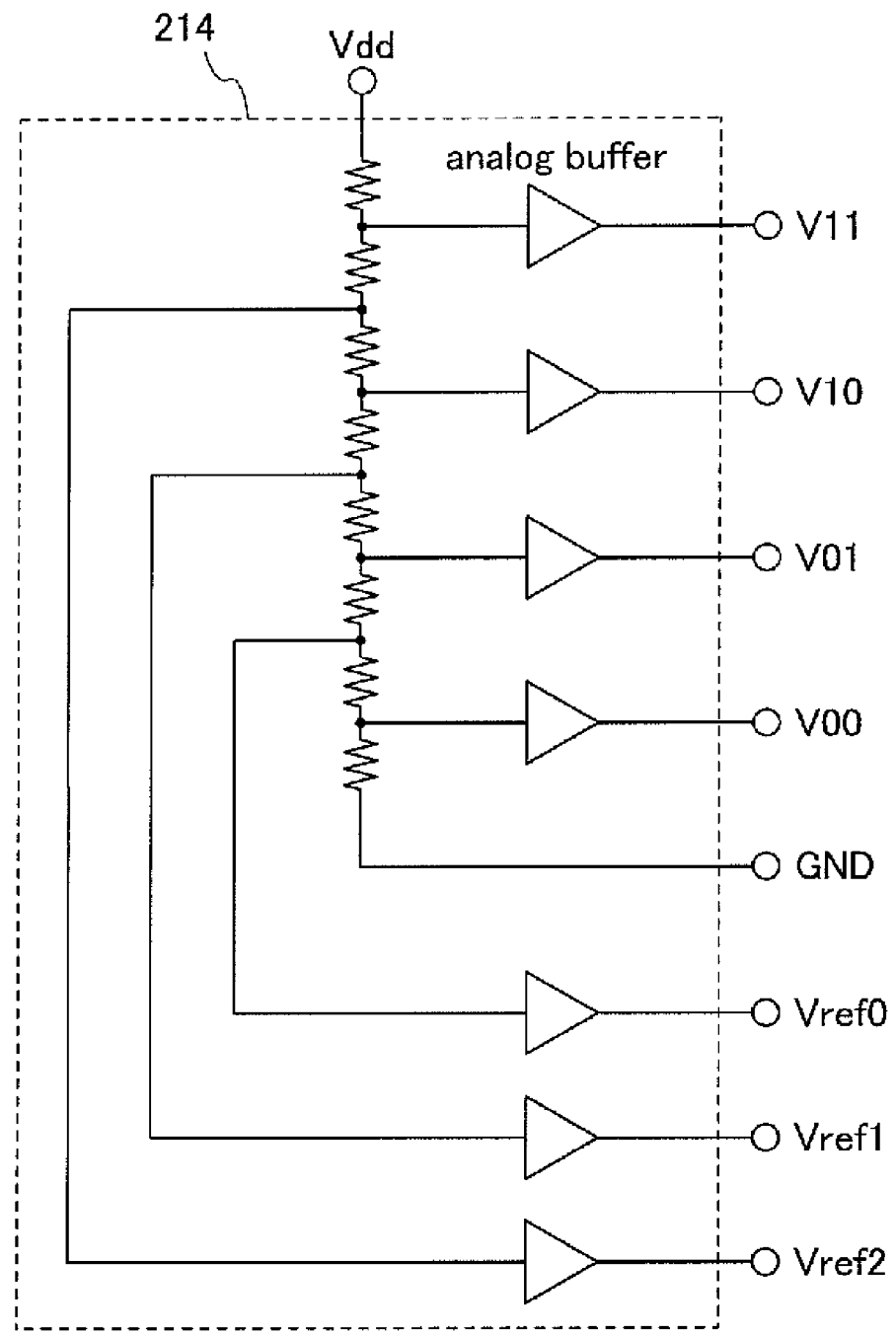
FIG. 21 is a circuit diagram for illustrating a semiconductor device.

An example of the potential generating circuit 214 is illustrated in FIG. 21. In the potential generating circuit 214, a potential is divided between power supply potential $V_{dd}$ and GND by resistance, whereby desired potentials can be obtained. Then the generated potentials are output via analog buffers. In this manner, the writing potentials $V_{00}$, $V_{01}$, $V_{10}$, and $V_{11}$ and the reference potentials $V_{ref0}$, $V_{ref1}$, and $V_{ref2}$ are generated. Note that a configuration in which $V_{00}<V_{ref0}<V_{01}<V_{ref1}<V_{10}<V_{ref2}<V_{11}$ is illustrated in FIG. 21; however, a potential relation is not limited thereto. Potentials required can be generated as appropriate by adjusting a resistor and nodes to which the reference potentials are connected. Further, $V_{00}$, $V_{01}$, $V_{10}$, and $V_{11}$ may be generated using a potential generating circuit different from that generates $V_{ref0}$, $V_{ref1}$, and $V_{ref2}$.

Instead of the power supply potential $V_{dd}$, a potential boosted in a boosting circuit may be supplied to the potential generating circuit 214. The absolute value of the potential difference can be increased by supplying an output of the boosting circuit to the potential generating circuit, so that a higher potential can be supplied.

Note that even in the case where the power supply potential $V_{dd}$ is directly supplied to the potential generating circuit, the power supply potential $V_{dd}$ can be divided into a plurality of potentials. However, since adjacent potentials are difficult to be distinguished from each other in this case, the number of writing mistakes and reading mistakes will be increased. In the case where the output of the boosting circuit is supplied to the potential generating circuit, the absolute value of the potential difference can be increased, so that the potential difference between the adjacent potentials can be sufficiently secured even if the number of divided potentials is increased.

Thus, storage capacity of a memory cell can be increased without increasing the number of writing mistakes and reading mistakes.

Figure 22A:
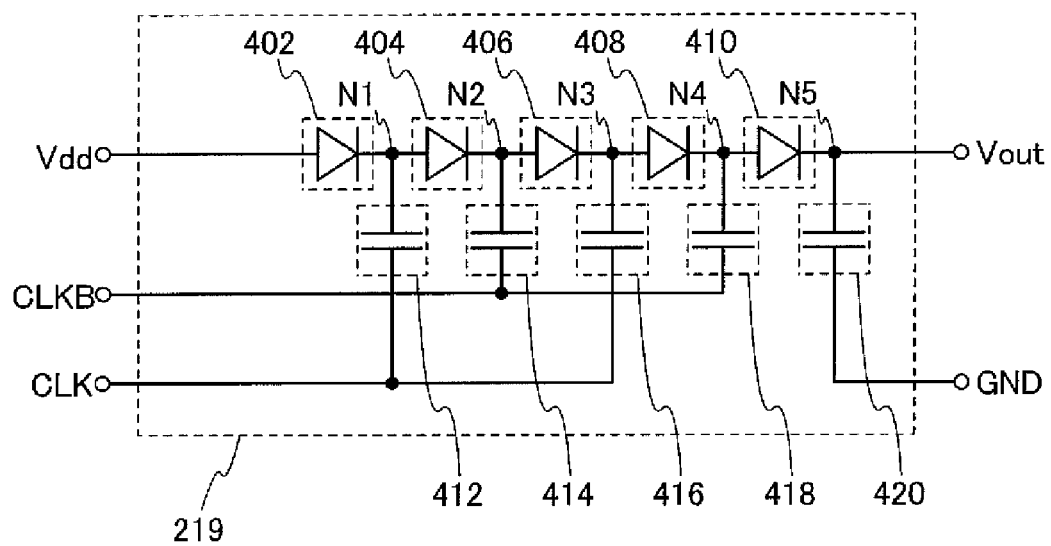
FIGS. 22A and 22B are circuit diagrams for illustrating a semiconductor device.

As an example of a boosting circuit in which boosting of four stages is performed, a boosting circuit 219 is illustrated in FIG. 22A. In FIG. 22A, the power supply potential $V_{dd}$ is supplied to an input terminal of a first diode 402. An input terminal of a second diode 404 and one terminal of a first capacitor 412 are connected to an output terminal of the first diode 402. Similarly, an input terminal of a third diode 406 and one terminal of a second capacitor 414 are connected to an output terminal of the second diode 404. Connections of other parts are similar to the above; therefore, detailed explanation is omitted. However, the connection can be represented as follows: one terminal of an n-th capacitor is connected to an output terminal of an n-th diode (n is a natural number). Note that an output of a fifth diode 410 becomes an output $V_{out}$ of the boosting circuit 219.

In addition, a clock signal CLK is input to the other terminal of the first capacitor 412 and the other terminal of a third capacitor 416. An inverted clock signal CLKB is input to the other terminal of the second capacitor 414 and one terminal of a fourth capacitor 418. That is, the clock signal CLK is input to the other terminal of the (2k−1)th capacitor and the inverted clock signal CLKB is input to the other terminal of the 2k-th capacitor (k is a natural number). Note that a ground potential GND is input to the other terminal of a capacitor of the last stage (a fifth capacitor 420 in this embodiment).

When the clock signal CLK is High, that is, when the inverted clock signal CLKB is Low, the first capacitor 412 and the third capacitor 416 are charged, and potentials of a node N1 and a node N3 capacitively coupled with the clock signal CLK are increased by a predetermined voltage. On the other hand, potentials of a node N2 and a node N4 capacitively coupled with the inverted clock signal CLKB are decreased by a predetermined voltage.

Therefore, an electric charge moves through the first diode 402, the third diode 406, and the fifth diode 410, and the potentials of the node N2 and the node N4 are increased to a predetermined value.

Next, when the clock signal CLK becomes Low and the inverted clock signal CLKB becomes High, potentials of the node N2 and the node N4 are further increased. On the other hand, the potentials of the node N1, the node N3, and a node N5 are decreased by a predetermined voltage.

Accordingly, an electric charge moves through the second diode 404 and the fourth diode 408. As a result, potentials of the node N3 and the node N5 are increased to a predetermined potential. Thus, a relationship among potentials of the nodes become $(V_{N5}>V_{N4(CLKB=High)}>V_{N3(CLK=High)}>V_{N2(CLKB=High)}>V_{N1(CLK=High)}>V_{dd})$, whereby boosting is performed. Note that the boosting circuit 219 is not limited to a circuit in which boosting of four stages is performed. The number of stages of the boosting can be changed as appropriate.

Note that the output $V_{out}$ of the boosting circuit 219 is significantly affected by variation between the characteristics of the diodes. For example, a diode is provided by connecting a source electrode and a gate electrode of a transistor to each other, but in this case, the characteristic of the diode is affected by variation in the threshold value of the transistor.

Figure 22B:
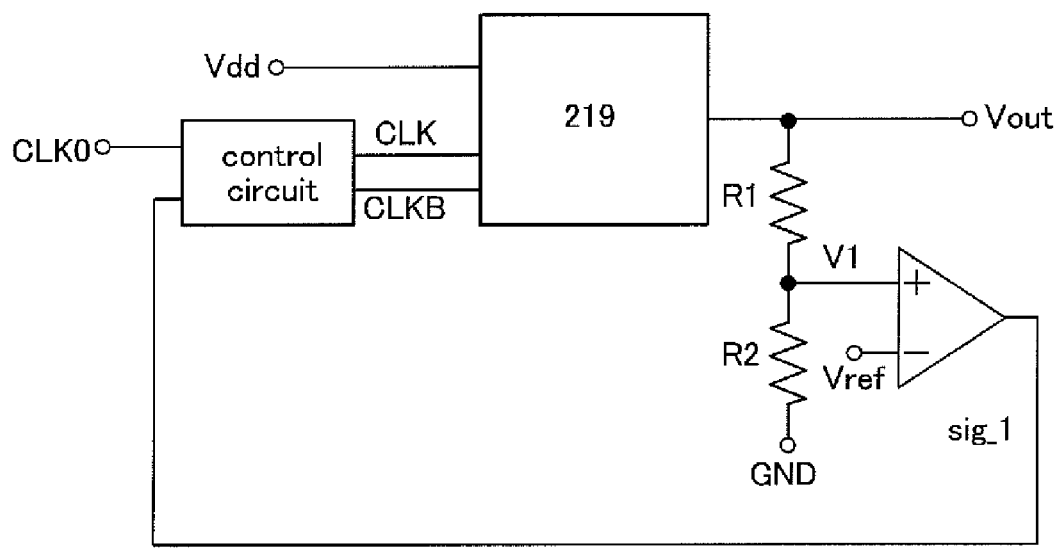

In order to control the output $V_{out}$ with high accuracy, a structure in which the output $V_{out}$ is fed back may be employed. FIG. 22B illustrates an example of a circuit configuration in the case where the output $V_{out}$ is fed back. The boosting circuit 219 in FIG. 22B corresponds to the boosting circuit 219 in FIG. 22A.

An output terminal of the boosting circuit 219 is connected to one input terminal of a sense amplifier circuit via a resistance $R_1$. In addition, the one input terminal of the sense amplifier circuit is grounded via a resistance $R_2$. That is, a potential $V_1$ corresponding to the output $V_{out}$ is input to the one input terminal of the sense amplifier circuit. Here, $V_1 = V_{out} \cdot R_2/(R_1+R_2)$.

Further, the reference potential $V_{ref}$ is input to the other input terminal of the sense amplifier circuit. That is, $V_1$ and $V_{ref}$ are compared in the sense amplifier circuit. The output terminal of the sense amplifier circuit is connected to a control circuit. A clock signal CLK0 is input to the control circuit. The control circuit outputs the clock signal CLK and the inverted clock signal CLKB to the boosting circuit 219 in response to the output of the sense amplifier circuit.

When $V_1 > V_{ref}$, an output sig_1 of the sense amplifier circuit is asserted, and the control circuit stops supplying the clock signal CLK and the inverted clock signal CLKB to the boosting circuit 219. Thus, the boosting operation is stopped, so that the potential $V_{out}$ stops increasing. Then, a circuit connected to the output of the boosting circuit 219 consumes electricity, whereby the potential $V_{out}$ gradually decreases.

When $V_1 < V_{ref}$, the output sig_1 of the sense amplifier circuit is de-asserted, and the control circuit starts to supply the clock signal CLK and the inverted clock signal CLKB to the boosting circuit 219. Thus, the boosting operation is performed, so that the potential $V_{out}$ gradually increases.

In this manner, the output potential $V_{out}$ of the boosting circuit 219 can be kept at a constant value by feeding back the output potential $V_{out}$ of the boosting circuit 219. The configuration is effective especially in the case where there is variation in the characteristic of the diodes. Moreover, the configuration is also effective in the case where the predetermined potential is to be generated in accordance with the reference potential $V_{ref}$. Note that a plurality of potentials can be generated in the boosting circuit 219 by using a plurality of different reference potentials.

In this manner, the absolute value of a potential difference can be increased by supplying an output of a boosting circuit to a potential generating circuit. Therefore, a higher potential can be generated without a change of the minimum unit of the potential difference. That is, storage capacity of a memory cell can be increased.

Figure 23:
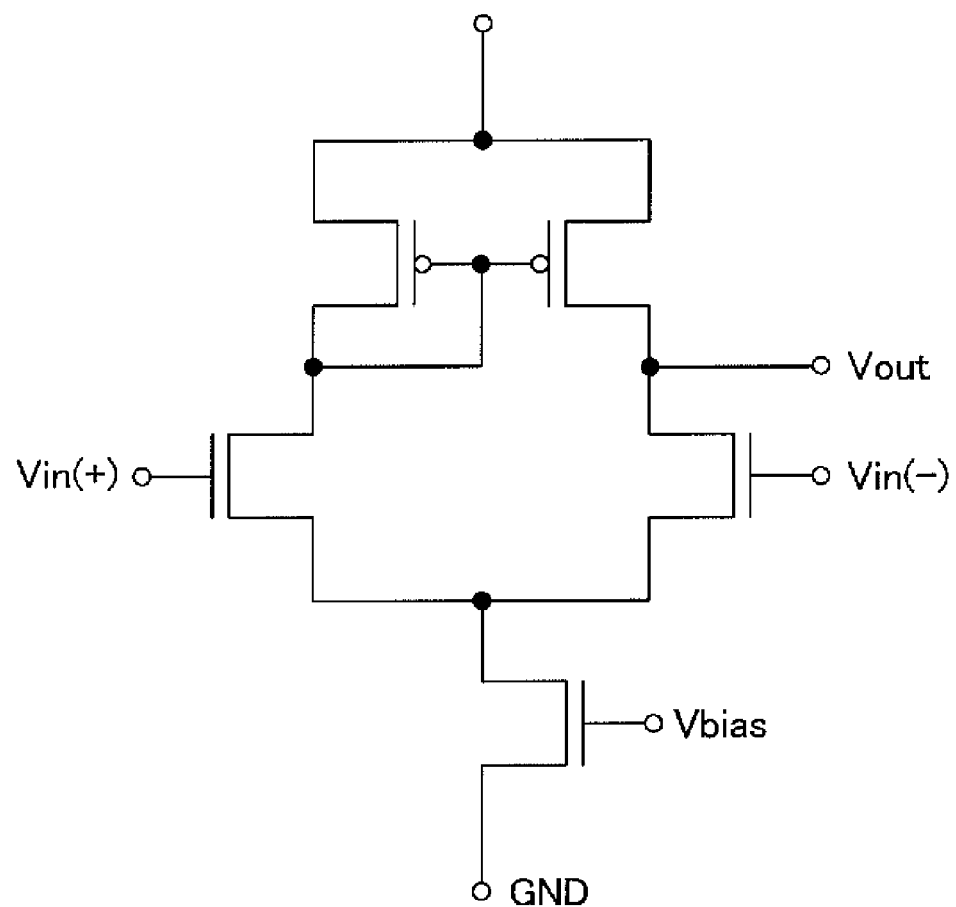
FIG. 23 is a circuit diagram for illustrating a semiconductor device.

FIG. 23 illustrates a differential sense amplifier as an example of a sense amplifier circuit. The differential sense amplifier includes input terminals $V_{in}(+)$ and $V_{in}(-)$ and an output terminal $V_{out}$, and amplifies a difference between a potential of $V_{in}(+)$ and a potential of $V_{in}(-)$. $V_{out}$ outputs a High signal when the potential of $V_{in}(+)$ is higher than the potential of $V_{in}(-)$, and outputs a Low signal when the potential of $V_{in}(+)$ is lower than the potential of $V_{in}(-)$.

Figure 24:
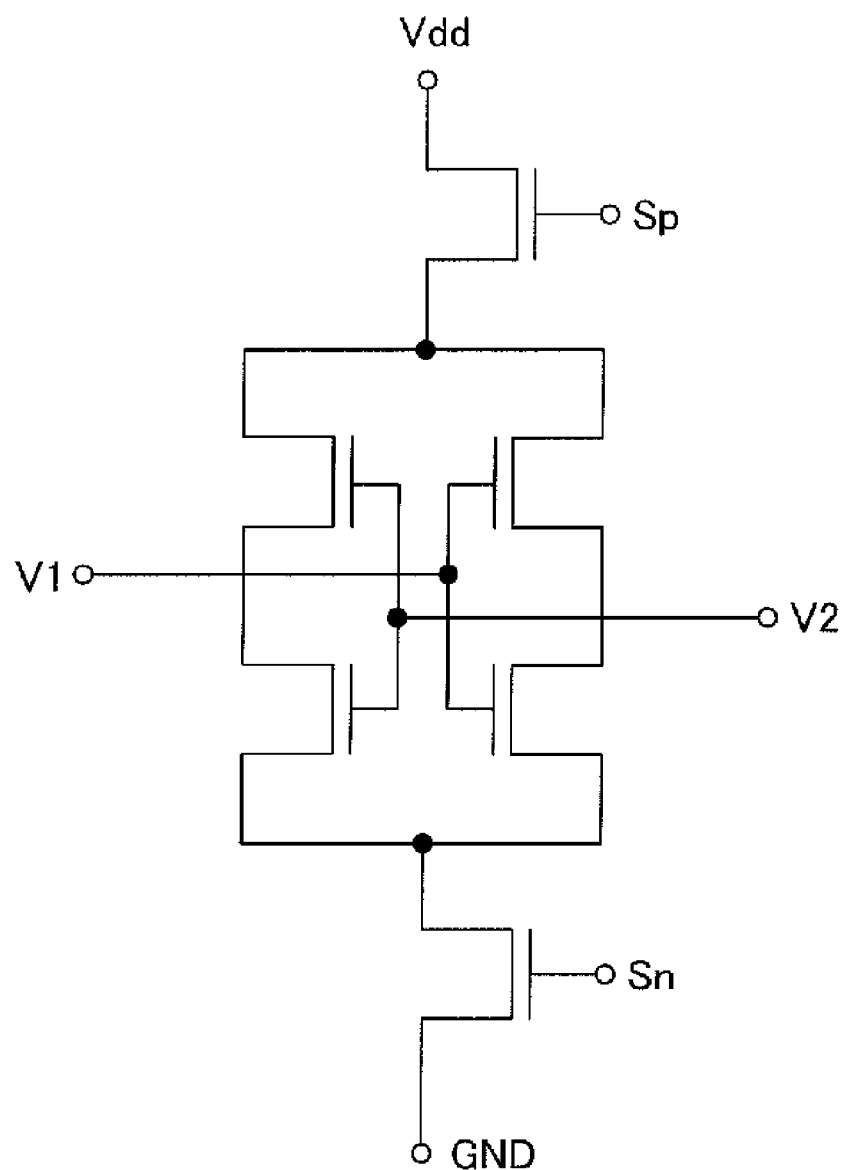
FIG. 24 is a circuit diagram for illustrating a semiconductor device.

FIG. 24 illustrates a latch sense amplifier as an example of a sense amplifier circuit. The latch sense amplifier includes input-output terminals V1 and V2 and input terminals of control signals Sp and Sn. First, power supply voltage ($V_{dd}$) is interrupted by setting the signal Sp at High and the signal Sn at Low. Next, potentials to be compared are applied to each of V1 and V2. After that, when power supply voltage ($V_{dd}$) is supplied by setting the signal Sp at Low and the signal Sn at High, an output of V1 is High and an output of V2 is Low when the potential of V1 is higher than the potential of V2. The output of V1 is Low and the output of V2 is High when the potential of V1 is lower than the potential of V2. In such a manner, a potential difference between V1 and V2 is amplified.

Examples of specific operation potentials (voltages) are described. For example, when the threshold voltage of the transistor 201 is approximately 0.3 V and the power supply voltage $V_{dd}$ is 2 V, $V_{11}$ can be 1.6 V; $V_{10}$, 1.2 V; $V_{01}$, 0.8 V; $V_{00}$, 0 V; $V_{ref0}$, 0.3 V; $V_{ref1}$, 0.7 V; and $V_{ref2}$, 1.1 V. Further, $V_s$_read can be 2 V. It is preferable that V_WL0 be 2V; V_WL1, 0 V; V_WLS, 0 V; V_S20, 0 V; V_S21, 2 V; V_S2S, 0 V; V_SEL0, 0 V; and V_SEL1, 2 V. The potential $V_{pc}$ is preferably 0 V, for example.

Next, operation of the semiconductor device illustrated in FIG. 17 is described. For example, in the case where the memory cell 200 is a four-valued memory cell, four states of the memory cell 200 are data "00b", "01b", "10b", and "11b", and potentials of the node A in the four states are set to $V_{00}$, $V_{01}$, $V_{10}$, and $V_{11}$, respectively ($V_{00} < V_{01} < V_{10} < V_{11}$). In this structure, writing and reading are performed per row.

Figure 25A:
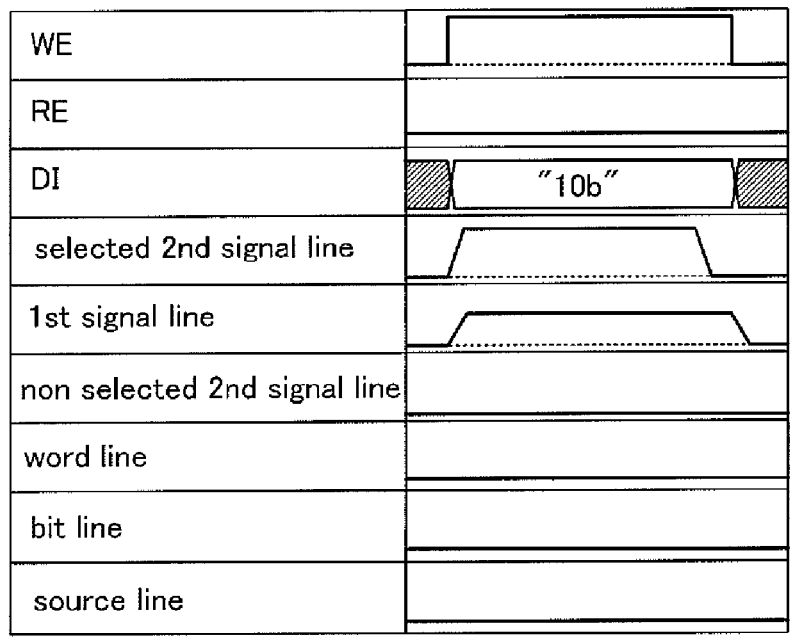
FIGS. 25A and 25B are a timing chart of writing operation and a timing chart of reading operation, respectively, for illustrating a semiconductor device.

First, writing operation of the semiconductor device is described. Writing operation is performed in a period when a write enable signal is asserted. During the writing operation, a read enable signal is de-asserted. In the case where writing is performed on the memory cells 200(i, 1) to 200(i, n) in the i-th row, the second signal line S2(i) is set to the potential V_S21 and the transistor 202 in a selected memory cell is turned on. On the other hand, the second signal lines S2 in the rows other than the i-th row are set to the potential V_S20 and the transistor 202 in a non-selected memory cell is turned off. In accordance with the signal DI which is input to the driver circuit 212 for the first signal lines, the first signal lines S1(1) to S1(n) are set to $V_{00}$ in a column into which data "00b" is written, $V_{01}$ in a column into which data "01b" is written, $V_{10}$ in a column into which data "10b" is written, and $V_{11}$ in a column into which data "11b" is written. Note that at the end of the writing, the second signal line S2(i) is set to the potential V_S20 before the potentials of the first signal lines S1(1) to S1(n) are changed, so that the transistor 202 in the selected memory cell is turned off. As for the other wirings, for example, the bit lines BL(1) to BL(n) are set to 0 V; the word lines WL(1) to WL(m), the potential of V_WLS; the selection lines SEL(1) and SEL(2), the potential of V_SEL0; and the potentials $V_s$ of the source lines SL(1) to SL(n), 0 V. FIG. 25A illustrates an example of a timing chart of the above-described writing operation. Note that FIG. 25A is a timing chart in the case where the data "10b" is written into the memory cell.

As a result, the potential of the node A of the memory cell into which the data "00b" is written is approximately $V_{00}$ [V], a potential of the node A of the memory cell into which the data "01b" is written is approximately $V_{01}$ [V], a potential of the node A of the memory cell into which the data "10b" is written is approximately $V_{10}$ [V], and a potential of the node A of the memory cell into which the data "11b" is written is approximately $V_{11}$ [V]. A potential of the node A of the non-selected memory cell is not changed. Here, an electric charge is accumulated in the node A in accordance with the potential of the first signal line S1. Since the off-state current of the transistor 202 is extremely small or substantially 0, the potential of the gate electrode of the transistor 201 (the node A) is held for a long time.

Next, reading operation of the semiconductor device is described. Reading operation is performed in a period when the read enable signal is asserted. During the reading operation, the write enable signal is de-asserted. In the case where reading of the memory cells 200(i, 1) to 200(i, n) in the i-th row is performed, the selection lines SEL(1) and SEL(2) are set to the potential V_SEL1 and the transistors 215(1, 1) to 215(1, n) and the transistors 215(2,1) to 215(2, n) are turned on. Further, the potential of the word line WL(i) is set to V_WL1 and the potential of the word lines WL in rows other than the i-th row are set to V_WL0. At this time, the transistor 203 in the memory cell in the i-th row is turned off. The transistors 203 in the memory cells in the rows other than the i-th row are turned on. The second signal lines S2(1) to S2(m) are set to the potential V_S2S and the transistors 202 in all the memory cells are turned off. The potential of the first signal lines S1(1) to S1(n) are set to 0 V.

In a certain period at the beginning of the reading operation, the signal Φpc is asserted. As a result, the bit line BL is precharged to the potential $V_{pc}$. Then, the potentials $V_s$ of the source lines SL(1) to SL(n) are set to $V_s$_read. Thus, in accordance with the state of the transistor 201 in the memory cell in the i-th row, current flows from the source line SL to the bit line BL so that the bit line BL is charged to a potential represented by ((the potential of the node A)−(the threshold voltage $V_{th}$ of the transistor 201)). As a result, the potentials of the bit line BL become ($V_{00}$−$V_{th}$), ($V_{01}$−$V_{th}$), ($V_{10}$−$V_{th}$), and ($V_{11}$−$V_{th}$) corresponding to the data "00b", "01b", "10b", and "11b", respectively. Since the potentials of the bit lines corresponding to the data are different from each other, the data "00b", "01b", "10b", and "11b" can be read by the reading circuit. Note that ($V_{11}$−$V_{th}$) is lower than or equal to (V_SEL1−$V_{th}$_SEL) and lower than or equal to (V_WL0−$V_{th}$_203). Here, $V_{th}$_SEL represents the threshold voltage of the transistor 215 and $V_{th}$_203 represents the threshold voltage of the transistor 203.

Figure 25B:
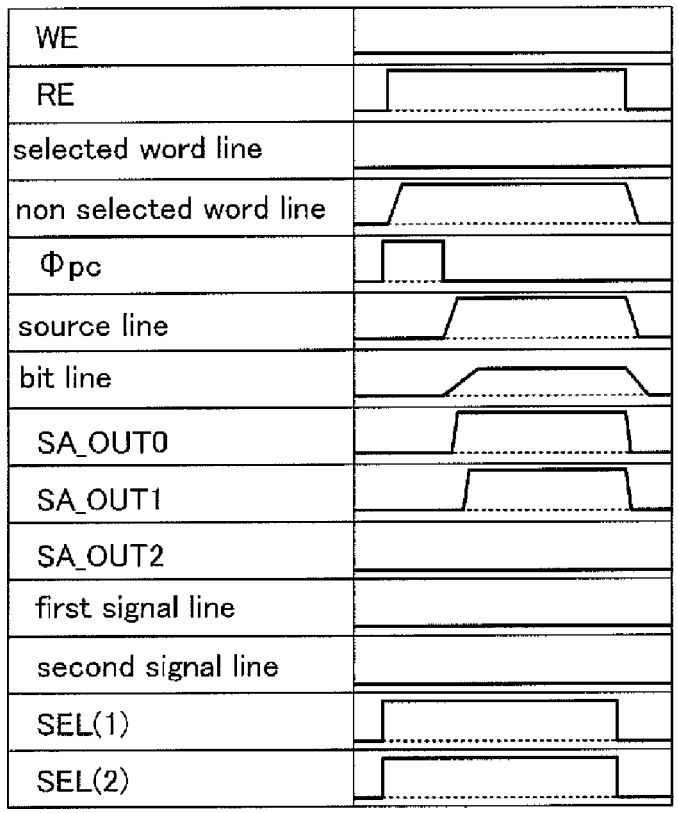

FIG. 25B illustrates an example of a timing chart of the above-described reading operation. The case where data "10b" is read from a memory cell is illustrated in the timing chart in FIG. 25B. The potential of the selected word line WL becomes V_WL0 and the potential of the source line SL becomes $V_s$_read, whereby the bit line BL is charged to the potential ($V_{10}$−$V_{th}$) corresponding to the data "10b" of the memory cell. As a result, SA_OUT0, SA_OUT1, and SA_OUT2 become "1", "1", and "0", respectively.

Note that in the case where the semiconductor device does not have a substrate potential, e.g., in the case where a thin film transistor is formed on an SOI substrate, the potential of the word lines WL(i+1) to WL(m) are preferably set to V_WL0 and the potential of the selection line SEL(2) is preferably set to V_SEL1 when writing is performed. Thus, at least one of the potential of the source electrode and the potential of the drain electrode of the transistor 201 in the memory cell in the i-th row can be approximately 0 V. Alternatively, the potential of the selection line SEL(1) may be set to V_SEL1 and the potential of the word lines WL(1) to WL(i−1) may be set to V_WL0. On the other hand, the substrate potential may be 0 V in the case where the semiconductor device has a substrate potential, e.g., in the case where a transistor is formed over a single crystal semiconductor substrate.

Note that the potential of the bit lines BL(1) to BL(n) are set to 0 V at the time of writing operation; in the case where the potential of the selection line SEL(1) is set to V_SEL0, the potential of the bit lines BL(1) to BL(n) may be charged to be a floating state or to a potential higher than 0 V. Although the potential of the first signal lines S1(1) to S1(n) are set to 0 V when reading is performed, the first signal lines S1(1) to S1(n) may be charged to be a floating state or to a potential higher than 0 V.

Additionally, in this embodiment, the first signal lines S1 are arranged in the bit line BL direction (column direction) and the second signal lines S2 are arranged in the word line WL direction (row direction); however, one embodiment of the present invention is not limited thereto. For example, the first signal lines S1 may be arranged in the word line WL direction (row direction) and the second signal lines S2 may be arranged in the bit line BL direction (column direction). In such a case, the driver circuit to which the first signal line S1 is connected and the driver circuit to which the second signal line S2 is connected may be arranged as appropriate.

In this embodiment, operation of a four-valued memory cell, i.e., writing any of four different states to one memory cell or reading any of four different states from one memory cell, is described. However, operation of an n-valued memory cell, i.e., writing any of n different states (n is an integer of greater than or equal to 2) to one memory cell or reading any of n different states from one memory cell, can be performed by changing a circuit configuration as appropriate.

For example, in an eight-valued memory cell, storage capacity becomes three times as large as a two-valued memory cell. When writing is performed, eight kinds of writing potentials to decide a potential of the node A are prepared and eight states are generated. When reading is performed, seven kinds of reference potentials capable of distinguishing the eight states are prepared. One sense amplifier is provided and comparison is performed seven times, so that reading can be performed. Further, the number of comparison times may be reduced to three by feeding back the result of the comparison. In a reading method in which the source line SL is driven, reading can be performed in one comparison by providing seven sense amplifiers. Furthermore, a structure in which a plurality of sense amplifiers is provided and comparison is performed plural times can be employed.

Generally, in a $2^k$-valued memory cell (k is an integer of greater than or equal to 1), storage capacity is k times as large as a two-valued memory cell. When writing is performed, $2^k$ kinds of writing potentials to decide a potential of the node A are prepared, and $2^k$ states are generated. When reading is performed, $(2^k-1)$ kinds of reference potentials capable of distinguishing $2^k$ states are preferably prepared. One sense amplifier is provided and comparison is performed $(2^k-1)$ times, so that reading can be performed. Further, the number of comparison times may be reduced to k by feeding back the result of the comparison. In a reading method in which the source line SL is driven, reading can be performed in one comparison by providing $(2^k-1)$ sense amplifiers. Furthermore, a structure in which a plurality of sense amplifiers is provided and comparison is performed plural times can be employed.

In the semiconductor device according to this embodiment, the small-off-current characteristic of the transistor 202 enables data to be held for an extremely long time. In other words, refreshing operation, which is needed in a DRAM or the like, is not necessary; thus, power consumption can be suppressed. In addition, the semiconductor device can be substantially used as a nonvolatile memory device.

Since data is written by switching operation of the transistor 202, high voltage is not needed and an element is not deteriorated in the semiconductor device. Further, data is written or erased according to an on state and an off state of the transistor, whereby high-speed operation can be easily realized. Moreover, data can be directly rewritten by controlling a potential input to the transistor. Erasing operation which is necessary in a flash memory is thus not needed; therefore, reduction in operation speed due to erasing operation can be suppressed.

Furthermore, the transistor which uses a material other than an oxide semiconductor can operate at a speed much higher than a transistor which uses an oxide semiconductor, and thus realizes high-speed reading of stored data.

The semiconductor device according to this embodiment is a multivalued semiconductor device, so that storage capacity per area can be larger than that of a two-valued semiconductor device. Therefore, the size of the semiconductor device can be reduced and the semiconductor device can be highly integrated. Additionally, potentials of a node which becomes a floating state when writing operation is performed can be directly controlled; thus, threshold voltage can be easily controlled with high accuracy which is needed in a multivalued memory. Therefore, verification of states after writing operation which is needed in a multivalued-type memory can be omitted, and in such a case, time required for writing operation can be shortened.

In the semiconductor device according to this embodiment, the absolute value of a potential difference can be increased by supplying an output of a boosting circuit to a potential generating circuit. Therefore, a higher potential can be generated without a change of the minimum unit of the potential difference. That is, storage capacity of a memory cell can be increased.

The methods and structures described in this embodiment can be combined as appropriate with any of the methods and structures described in the other embodiments.

Embodiment 3

In this embodiment, an example of a circuit configuration of a semiconductor device which is different from that in Embodiment 2 and operation thereof will be described.

Figure 26:
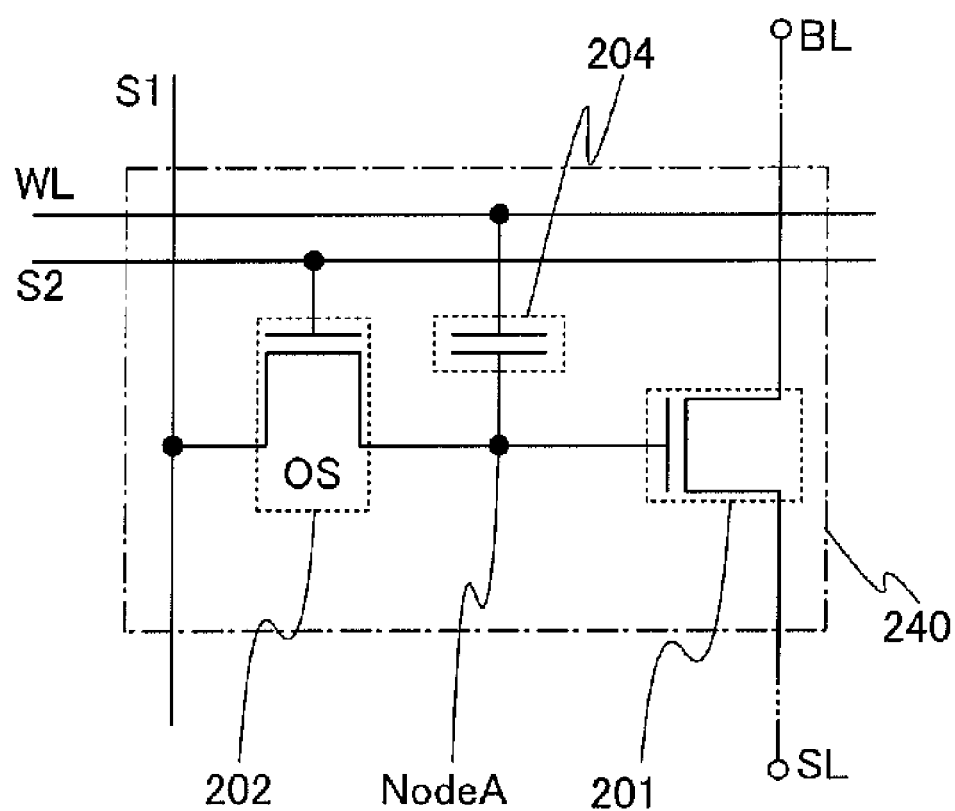
FIG. 26 is a circuit diagram for illustrating a semiconductor device.

An example of a circuit diagram of a memory cell included in the semiconductor device is illustrated in FIG. 26. A memory cell 240 illustrated in FIG. 26 is a multivalued memory cell and includes the first signal line S1, the second signal line S2, the word line WL, the transistor 201, the transistor 202, and the capacitor 204. The transistor 201 is formed using a material other than an oxide semiconductor, and the transistor 202 is formed using an oxide semiconductor. Here, the transistor 201 preferably has a structure similar to that of the transistor 160 which is described in Embodiment 1. Further, the transistor 202 preferably has a structure similar to that of the transistor 162 which is described in Embodiment 1. The memory cell 240 is electrically connected to the source line SL and the bit line BL, preferably via a transistor (which may be a transistor included in another memory cell).

Here, the gate electrode of the transistor 201, one of the source electrode and the drain electrode of the transistor 202, and one of the electrodes of the capacitor 204 are electrically connected to one another. Further, the source line SL and the source electrode of the transistor 201 are electrically connected to each other, and the drain electrode of the transistor 201 and the bit line BL are electrically connected to each other. The other of the source electrode and the drain electrode of the transistor 202 and the first signal line S1 is electrically connected to each other, and the second signal line S2 and the gate electrode of the transistor 202 are electrically connected to each other. The word line WL and the other of the electrodes of the capacitor 204 are electrically connected to each other. Note that the source line SL and the source electrode of the transistor 201 may be connected to each other via a transistor (which may be a transistor included in another memory cell). Further, the bit line BL and the drain electrode of the transistor 201 may be connected to each other via a transistor (which may be a transistor included in another memory cell).

Here, operation of the memory cell 240 is described. For example, in the case where the memory cell 240 is a four-valued memory cell, four states of the memory cell 240 are set to data "00b", "01b", "10b", and "11b", and potentials of the node A of the transistor 201 are set to $V_{00}$, $V_{01}$, $V_{10}$, and $V_{11}$, respectively ($V_{00}<V_{01}<V_{10}<V_{11}$). The potential of the node A of the memory cell 240 depends on the potential of the word line WL. As the potential of the word line WL is increased, the potential of the node A of the memory cell 240 is increased. For example, the potential of the word line WL applied to the memory cells in the four different states is changed from a low potential to a high potential, the transistor 201 of the memory cell of the data "11b" is turned on first, and then, the memory cell of the data "10b", the memory cell of the data "01b", and the memory cell of the data "00b" are turned on in this order. In other words, by appropriately selecting the potential of the word line WL, the states of the memory cells (that is, the data included in the memory cells) can be distinguished. By appropriately selecting the potential of the word line WL, the memory cell in which the transistor 201 is in an on state is in a low resistance state, and the memory cell in which the transistor 201 is in an off state is in a high resistance state; therefore, when the resistance state is distinguished by the reading circuit, the data "00b", "01b", "10b", and "11b" can be read out.

Figure 27:
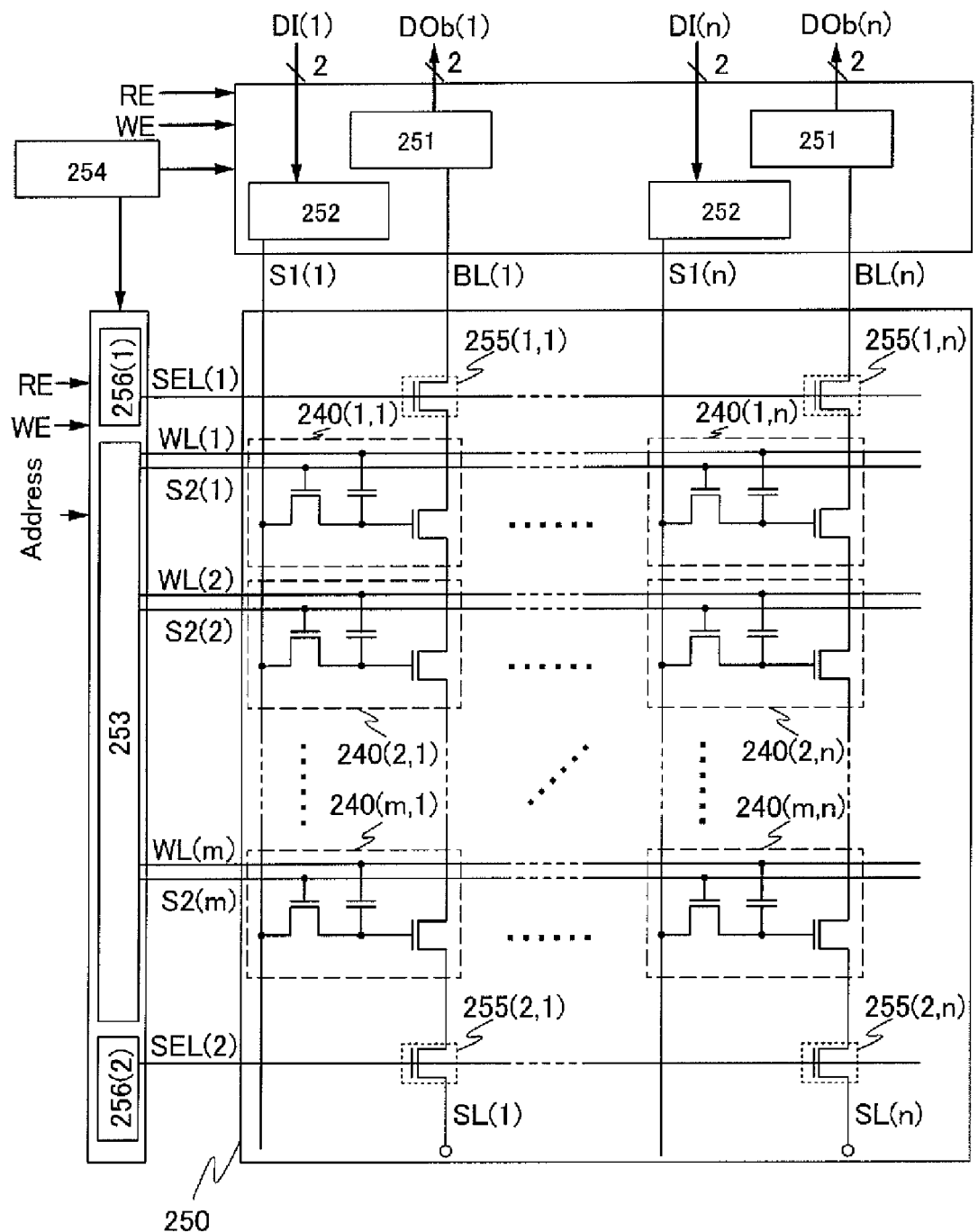
FIG. 27 is a block circuit diagram for illustrating a semiconductor device.

A block circuit diagram of a semiconductor device in an embodiment of the present invention including m×n bits of storage capacity is illustrated in FIG. 27. As an example, a NAND-type semiconductor device in which the memory cells 240 are connected in series is described here.

The semiconductor device described in FIG. 27 includes m word lines WL, m second signal lines S2, n bit lines BL, n first signal lines S1, the two selection lines SEL(1) and SEL(2), a memory cell array 250 in which the plurality of memory cells 240(1, 1) to 240(m, n) are arranged in a matrix of m pieces (row) by n pieces (column) (m and n are natural numbers), transistors 255(1, 1) to 255(1, n) which are arranged along the selection line SEL(1) between the bit lines BL(1) to BL(n) and the memory cells 240(1, 1) to 240(1, n), transistors 255(2, 1) to 255(2, n) which are arranged along the selection line SEL(2) between the source lines SL(1) to SL(n) and the memory cells 240(m, 1) to 240(m, n), and peripheral circuits such as a reading circuit 251, a driver circuit 252 for the first signal lines, a driver circuit 253 for the second signal lines and the word lines, a potential generating circuit 254, and driver circuits 256(1) and 256(2) for the selection lines. As another peripheral circuit, a refresh circuit and the like may be provided.

Each of the memory cells 240, e.g., a memory cell 240(i, j) is considered (here, i is an integer of greater than or equal to 1 and less than or equal to m, and j is an integer of greater than or equal to 1 and less than or equal to n). The memory cell 240(i, j) is connected to the first signal line S1(j), the second signal line S2(i), and the word line WL(i). Further, the drain electrode of the transistor 201 included in the memory cell 240($i_1$, j) ($i_1$ is an integer of greater than or equal to 2 and less than or equal to m) is connected to the source electrode of the transistor 201 included in the memory cell 240($i_1$−1, j). The source electrode of the transistor 201 included in the memory cell 240($i_2$, j) ($i_2$ is an integer of greater than or equal to 1 and less than or equal to m−1) is connected to the drain electrode of the transistor 201 included in memory cell 240($i_2$+1, j). The drain electrode of the transistor 201 included in the memory cell 240(1, j) is connected to a source electrode of the transistor 255(1, j). The source electrode of the transistor 201 included in the memory cell 240(m, j) is connected to a drain electrode of the transistor 255(2, j). A drain electrode of the transistor 255(1, j) is connected to the bit line BL(j) and a source electrode of the transistor 255(2, j) is connected to the source line SL(j).

The bit lines BL(1) to BL(n) are connected to the reading circuit 251; the first signal lines S1(1) to S1(n) are connected to the driver circuit 252 for the first signal lines; the second signal lines S2(1) to S2(m) and the word lines WL(1) to WL(m) are connected to the driver circuit 253 for the second signal lines and the word lines; and the selection lines SEL(1) and SEL(2) are connected to the driver circuits 256(1) and 256(2) for the selection lines. The potential V is applied to the source lines SL(1) to SL(n). Note that the source lines SL(1) to SL(n) are not necessarily separated and may be electrically connected to each other.

Note that the driver circuit 252 for the first signal lines and the potential generating circuit 254 can have the structures described with reference to FIG. 19 and FIG. 21 in Embodiment 2, respectively. Instead of the power supply potential $V_{dd}$, a potential boosted in the boosting circuit described in Embodiment 2 with reference to FIGS. 22A and 22B may be supplied to the potential generating circuit 254. Further, the structures described in Embodiment 2 can be used for the driver circuits 256(1) and 256(2) for the selection lines.

Figure 28:
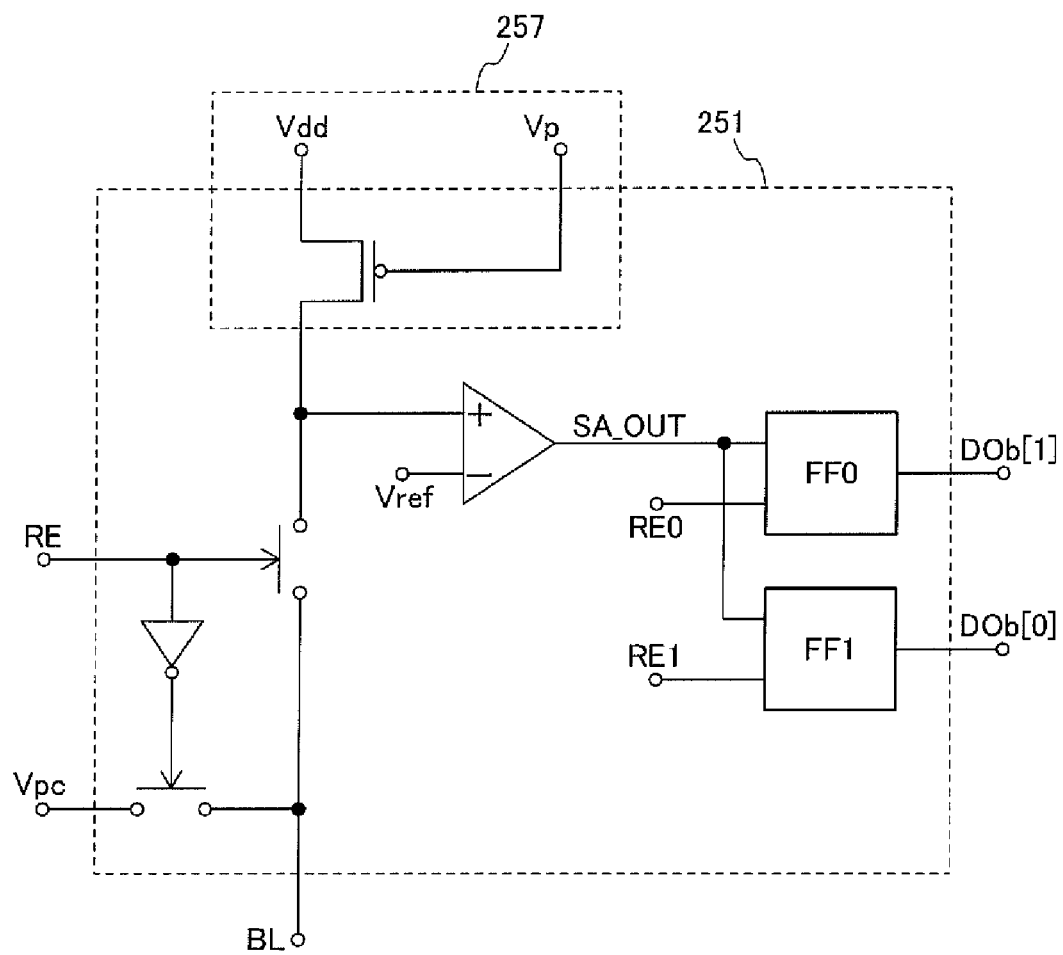
FIG. 28 is a circuit diagram for illustrating a semiconductor device.

FIG. 28 illustrates an example of the reading circuit 251. The reading circuit includes a sense amplifier circuit, flip-flop circuits, a bias circuit 257, and the like. The bias circuit 257 is connected to the bit line BL via a switch. Further, the bias circuit 257 is connected to an input terminal of the sense amplifier circuit. A reference potential $V_{ref}$ is input to the other input terminal of the sense amplifier circuit. An output terminal of the sense amplifier circuit is connected to an input terminal of flip-flop circuits. Note that the switch is controlled by a read enable signal.

The reading circuit 251 illustrated in FIG. 28 includes the one sense amplifier and performs comparison twice in order to distinguish the four different states. The two comparisons are controlled by signals RE0 and RE1. The flip-flop circuits FF0 and FF1 are controlled by the signals RE0 and RE1, respectively, and store the value of an output signal of the sense amplifier circuit. An output of the flip-flop circuit FF0 and an output of the flip-flop circuit FF1 are output as a signal DOb[1] and a signal DOb[0] from the reading circuit.

Note that in the illustrated reading circuit 251, when the RE signal is de-asserted, the bit line BL is connected to the wiring $V_{pc}$ and pre-charge is performed. When the RE signal is asserted, electrical continuity between the bit line BL and the bias circuit 257 is established. Note that pre-charge is not necessarily performed.

Figure 29:
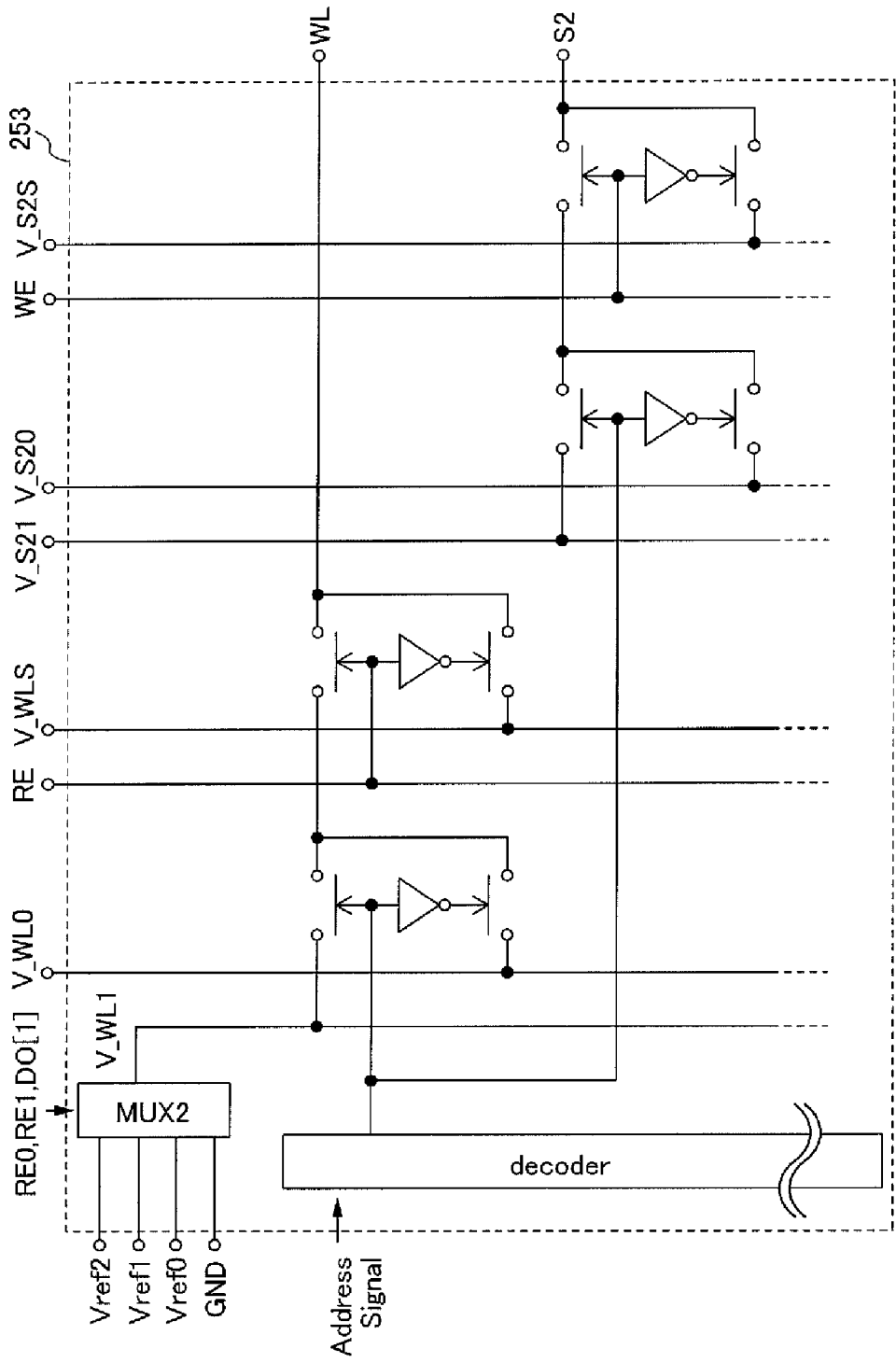
FIG. 29 is a circuit diagram for illustrating a semiconductor device.

An example of the driver circuit 253 for the second signal lines and the word lines is illustrated in FIG. 29. The driver circuit 253 for the second signal lines and the word lines includes a decoder, a multiplexer (MUX2), and the like. The second signal line S2 is connected to the wirings V_S20, V_S21, and V_S2S via a switch which is controlled by a write enable signal (a WE signal) and a switch which is controlled by a signal output from the decoder. The word line WL is connected to the wirings V_WL0, V_WL1, and V_WLS via a switch which is controlled by a read enable signal (an RE signal) and a switch which is controlled by a signal output from the decoder. Further, the signals RE0, RE1, DOb[1], the reference potentials $V_{ref0}$, $V_{ref1}$, and $V_{ref2}$, and GND are input to the multiplexer (MUX2) and the multiplexer (MUX2) outputs a potential V_WL. An address signal is input to the decoder from the external.

When the address signal is input to the driver circuit 253 for the second signal lines and the word lines, a row specified by the address (a selected row) is asserted and rows other than the row specified by the address (non-selected rows) are de-asserted. When the RE signal is de-asserted, the potential V_WLS is applied to the word line WL. When the RE signal is asserted, the potential V_WL1 is applied to the word line WL in the selected row and the potential V_WL0 is applied to the word line WL in the non-selected rows. When the WE signal is de-asserted, the potential V_S2S is applied to the second signal line S2. When the WE signal is asserted, the potential V_S21 is applied to the second signal line S2 in the selected row and the potential V_S20 is applied to the second signal line S2 in the non-selected rows. V_WL1 is a potential selected by the multiplexer (MUX2). The multiplexer selects one of the three kinds of reference potentials $V_{ref0}$, $V_{ref1}$, and $V_{ref2}$, and GND in accordance with the values of the signals RE0, RE1, and DOb[1]. The behavior of the multiplexer (MUX2) is illustrated in Table 3.

TABLE 3

| RE0 | RE1 | DO[1] | V_WL1 |
|---|---|---|---|
| 0 | 0 | * | GND |
| 1 | 0 | * | $V_{ref1}$ |
| 0 | 1 | 0 | $V_{ref0}$ |
| 0 | 1 | 1 | $V_{ref2}$ |

* = 1 or 0

The transistor 201 which is connected to the word line WL to which the potential V_WL0 is applied is turned on. The transistor 202 which is connected to the second signal line S2 to which the potentials V_S2S and V_S20 are applied is turned off. The transistor 202 which is connected to the second signal line S2 to which the potential V_S21 is applied is turned on.

The three kinds of reference potentials $V_{ref0}$, $V_{ref1}$, and $V_{ref2}$ ($V_{ref0} < V_{ref1} < V_{ref2}$) and the states of the transistor 201 in the case where the above potentials are selected as a potential of the word line WL are described. In the case where $V_{ref2}$ is selected as the potential of the word line WL, a potential with which the transistor 201 of the memory cell of the data "00b" is turned off and the transistor 201 of the memory cell of the data "01b" is turned on is selected as $V_{ref2}$. In addition, in the case where $V_{ref1}$ is selected as the potential of the word line WL, a potential with which the transistor 201 of the memory cell of the data "01b" is turned off and the transistor 201 of the memory cell of the data "10b" is turned on is selected as $V_{ref1}$. In addition, in the case where $V_{ref2}$ is selected as the potential of the word line WL, a potential with which the transistor 201 of the memory cell of the data "10b" is turned off and the transistor 201 of the memory cell of the data "11b" is turned on is selected as $V_{ref2}$.

In the reading circuit 251, reading is performed by the two comparisons in the case described above. A first comparison is performed using $V_{ref1}$. A second comparison is performed using $V_{ref0}$ when the value of the result DOb[1] of the comparison with the use of $V_{ref1}$ is "0", or using $V_{ref2}$ when the value of the result DOb[1] of the comparison with the use of $V_{ref1}$ is "1". In the above manner, the four states can be read out by the two comparisons.

Note that although the number of the comparison times in reading operation is two in this embodiment, one embodiment of the present invention is not limited to this structure. For example, the comparison can be performed three times without feedback of a value obtained after the comparison.

Figure 30:
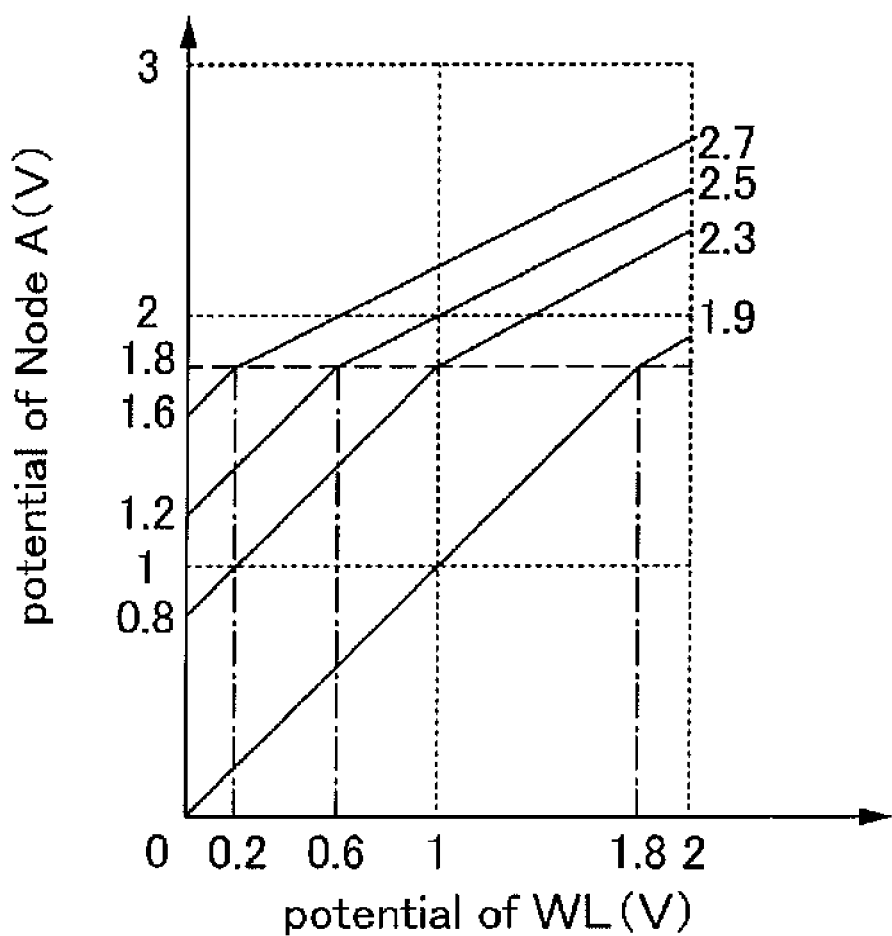
FIG. 30 is a graph for illustrating a relation between a potential of a node A and a potential of a word line WL.

Specific examples of operation potentials (voltages) are described. For example, the power supply voltage $V_{dd}$ is 2 V and the threshold voltage $V_{th}$ of the transistor 201 is 1.8 V. The potential of the node A depends on capacitance C1 between the word line WL and the node A and gate capacitance C2 of the transistor 202, and here, for example, C1/C2>>1 when the transistor 202 is in an off state, and C1/C2=1 when the transistor 202 is in an on state. FIG. 30 shows relation between the potential of the node A and the potential of the word line WL in the case where the source line SL has a potential 0V. From FIG. 30, it is found that the reference potentials $V_{ref0}$, $V_{ref1}$, and $V_{ref2}$ are preferably 0.4 V, 0.8 V, and 1.2 V, respectively in the case where when writing is performed, the potential of the node A of the data "00b" is 0V, that of the data "01b" is 0.8 V, that of the data "10b" is 1.2 V, and that of the data "11b" is 1.6 V.

Next, operation of the semiconductor device illustrated in FIG. 27 is described. Here, the case where the memory cell is a four-valued memory cell is described. Four states of the memory cell 240 are data "00b", "01b", "10b", and "11b", and potentials of the node A in the four states are set to $V_{00}$, $V_{01}$, $V_{10}$, and $V_{11}$, respectively ($V_{00} < V_{01} < V_{10} < V_{11}$). In this structure, writing and reading are performed per row.

First, writing operation of the semiconductor device is described. Writing operation is performed in a period when a write enable signal is asserted. During the writing operation, a read enable signal is de-asserted. In the case where writing is performed on the memory cells 240($i$, 1) to 240($i$, $n$) in the i-th row, the second signal line S2($i$) is set to the potential V_S21 and the transistor 202 in a selected memory cell is turned on. On the other hand, the second signal lines S2 in the rows other than the i-th row are set to the potential V_S20 and the transistor 202 in a non-selected memory cell is turned off. In accordance with the signal DI which is input to the driver circuit 212 for the first signal lines, the first signal lines S1(1) to S1($n$) are set to the potential $V_{00}$ in a column into which data "00b" is written, the potential $V_{01}$ in a column into which data "01b" is written, the potential $V_{10}$ in a column into which data "10b" is written, and the potential $V_{11}$ in a column into which data "11b" is written. Note that at the end of the writing, the second signal line S2($i$) is set to the potential V_S20 before the potentials of the first signal lines S1(1) to S1($n$) are changed, so that the transistor 202 in the selected memory cell is turned off. As for the other wirings, for example, the bit lines BL(1) to BL(n) are set to 0 V; the word lines WL(1) to WL(m), the potential V_WLS; the selection lines SEL(1) and SEL(2), the potential V_SEL0; and the potentials $V_s$ of the source lines SL(1) to SL(n), 0 V. A timing chart of the above-described writing operation is similar to that illustrated in FIG. 25A. Note that FIG. 25A is a timing chart in the case where the data "10b" is written into the memory cell.

As a result, the potential of the node A of the memory cell into which the data "00b" is written is approximately $V_{00}$ [V], a potential of the node A of the memory cell into which the data "01b" is written is approximately $V_{01}$ [V], a potential of the node A of the memory cell into which the data "10b" is written is approximately $V_{10}$ [V], and a potential of the node A of the memory cell into which the data "11b" is written is approximately $V_{11}$ [V]. A potential of the node A of the non-selected memory cell is not changed. Here, an electric charge is accumulated in the node A in accordance with the potential of the first signal line S1. Since the off-state current of the transistor 202 is extremely small or substantially 0, the potential of the gate electrode of the transistor 201 (the node A) is held for a long time.

Next, reading operation of the semiconductor device is described. Reading operation is performed in a period when the read enable signal is asserted. During the reading operation, the write enable signal is de-asserted. In the case where reading of the memory cells 240($i$, 1) to 240($i$, $n$) in the i-th row is performed, the selection lines SEL(1) and SEL(2) are set to the potential V_SEL1 and the transistors 255(1, 1) to 255(2, n) are turned on. The potentials $V_s$ of the source lines SL(1) to SL(n), 0 V. The second signal lines S2(1) to S2(m) are set to the potential V_S2S and the transistors 202 in all the memory cells are turned off. The first signal lines S1(1) to S1(n) are set to 0 V.

Figure 31:
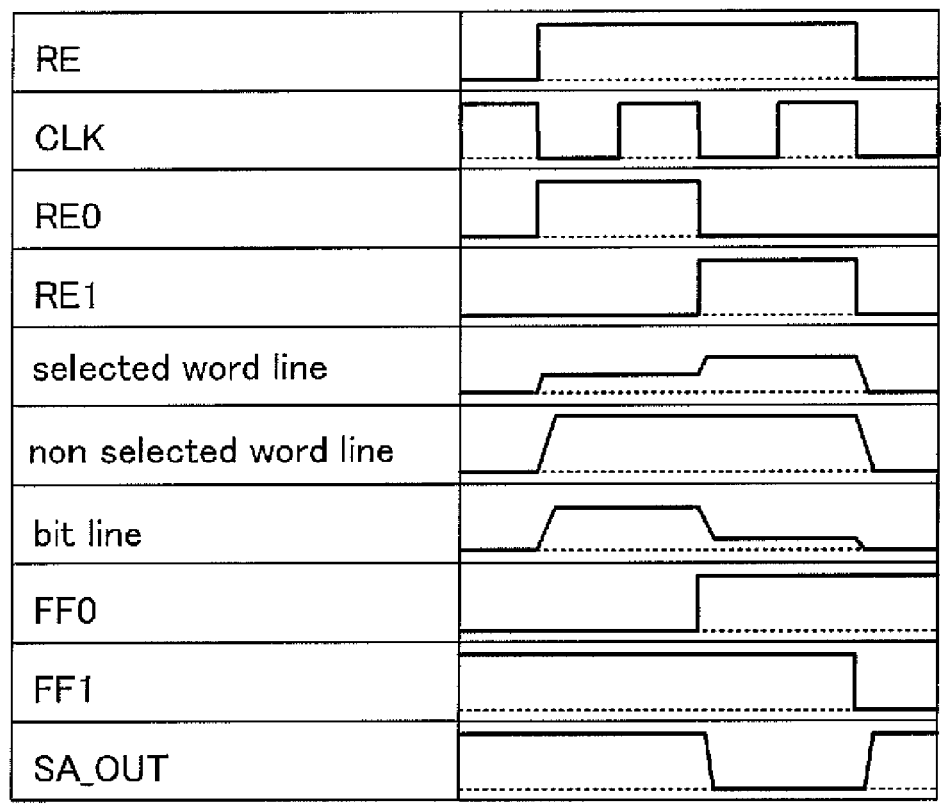
FIG. 31 is a timing chart of reading operation for illustrating a semiconductor device.

Further, the word line WL(i) is set to the potential V_WL1 and the word lines WL in rows other than the i-th row are set to the potential V_WL0. The transistors 201 in the memory cells in the rows other than the i-th row are turned on. As a result, a resistance state (conductance) between the bit line BL and the source line SL is low when the transistor 201 in the selected row is in an on state or high when the transistor 201 in the selected row is in an off state. In the selected row, the potential of the word line WL is appropriately selected so that the on state and the off state of the transistor 201 vary between the memory cells having different data. As a result, the reading circuit can read the data "00b", "01b", "10b", and "11b" by distinguishing the resistance state (the conductance) between the bit line BL and the source line SL. That is, the reading circuit can read data by reading out the resistance state (the conductance) of a specified memory cell. Note that reading of the resistance state (the conductance) of the memory cell indicates reading of an on or off state of the transistor 201 included in the memory cell. An example of a timing chart of reading operation is illustrated in FIG. 31. FIG. 31 shows a timing chart in the case where the data "01b" is read out from the memory cell. The reference potentials $V_{ref1}$ and $V_{ref2}$ are input to the selected respective word lines WL, and the comparison result in the sense amplifier is stored in the flip-flop circuits FF0 and FF1 in respective periods in which the signals RE0, and RE1 are asserted. In the case of the data of the memory cell is "01b", the values of the flip-flop circuits FF0 and FF1 are "1" and "0". Note that the first signal line S1 and the second signal line S2 have 0 V.

Note that the potential of the node A of the transistor 201 after the writing (the potential of the word line WL is 0 V) is preferably lower than or equal to the threshold voltage of the transistor 201. Further, V_WL0 can be 2 V; V_WLS, 0 V; V_S20, 0 V; V_S21, 2 V; and V_S2S, 0 V.

Note that the bit lines BL(1) to BL(n) are set to 0 V at the time of writing operation; in the case where the selection line SEL(1) is set to the potential V_SEL0, the bit lines BL(1) to BL(n) may be charged to be a floating state or to a potential higher than 0 V. Although the first signal lines S1(1) to S1(n) are set to 0 V when reading is performed, the first signal lines S1(1) to S1(n) may be charged to be a floating state or to a potential higher than 0 V.

Additionally, in this embodiment, the first signal lines S1 are arranged in the bit line BL direction (column direction) and the second signal lines S2 are arranged in the word line WL direction (row direction); however, one embodiment of the present invention is not limited thereto. For example, the first signal lines S1 may be arranged in the word line WL direction (row direction) and the second signal lines S2 may be arranged in the bit line BL direction (column direction). In such a case, the driver circuit to which the first signal line S1 is connected and the driver circuit to which the second signal line S2 is connected may be arranged as appropriate.

In this embodiment, operation of a four-valued memory cell, i.e., writing any of four different states to one memory cell or reading any of four different states from one memory cell, is described. However, operation of an n-valued memory cell, i.e., writing any of n different states (n is an integer of greater than or equal to 2) to one memory cell or reading any of n different states from one memory cell, can be performed by changing a circuit configuration as appropriate.

For example, in an eight-valued memory cell, storage capacity becomes three times as large as a two-valued memory cell. When writing is performed, eight kinds of writing potentials to decide a potential of the node A are prepared and eight states are generated. When reading is performed, seven kinds of reference potentials capable of distinguishing the eight states are prepared. One sense amplifier is provided and comparison is performed seven times, so that reading can be performed. Further, the number of comparison times may be reduced to three by feeding back the result of the comparison. In a reading method in which the source line SL is driven, reading can be performed in one comparison by providing seven sense amplifiers. Furthermore, a plurality of sense amplifiers can be provided and comparison is performed plural times.

Generally, in a $2^k$-valued memory cell (k is an integer of greater than or equal to 1), storage capacity is k times as large as a two-valued memory cell. When writing is performed, $2^k$ kinds of writing potentials to decide a potential of the node A are prepared, and $2^k$ states are generated. When reading is performed, $(2^k-1)$ kinds of reference potentials capable of distinguishing $2^k$ states are preferably prepared. One sense amplifier is provided and comparison is performed $(2^k-1)$ times, so that reading can be performed. Further, the number of comparison times may be reduced to k by feeding back the result of the comparison. In a reading method in which the source line SL is driven, reading can be performed in one comparison by providing $(2^k-1)$ sense amplifiers. Furthermore, a structure in which a plurality of sense amplifiers is provided and comparison is performed plural times can be employed.

In the semiconductor device according to this embodiment, the small-off-current characteristic of the transistor 202 enables data to be held for an extremely long time. In other words, refreshing operation, which is needed in a DRAM or the like, is not necessary; thus, power consumption can be suppressed. In addition, the semiconductor device can be substantially used as a nonvolatile memory device.

Since data is written by switching operation of the transistor 202, high voltage is not needed and an element is not deteriorated in the semiconductor device. Further, information is written or erased according to an on state and an off state of the transistor, whereby high-speed operation can be easily realized. Moreover, data can be directly rewritten by controlling a potential input to the transistor. Erasing operation which is necessary in a flash memory is thus not needed; therefore, reduction in operation speed due to erasing operation can be suppressed.

The transistor which uses a material other than an oxide semiconductor can operate at a speed much higher than a transistor which uses an oxide semiconductor, and thus realizes high-speed reading of stored data.

The semiconductor device according to this embodiment is a multivalued semiconductor device, so that storage capacity per area can be larger than that of a two-valued semiconductor device. Therefore, the size of the semiconductor device can be reduced and the semiconductor device can be highly integrated. Additionally, potentials of a node which becomes a floating state when writing operation is performed can be directly controlled; thus, threshold voltage can be easily controlled with high accuracy which is needed in a multivalued memory. Therefore, verification of states after writing operation which is needed in a multivalued-type memory can be omitted, and in such a case, time required for writing operation can be shortened.

In the semiconductor device according to this embodiment, the absolute value of a potential difference can be increased by supplying an output of a boosting circuit to a potential generating circuit. Therefore, a higher potential can be generated without a change of the minimum unit of the potential difference. That is, storage capacity of a memory cell can be increased.

The methods and structures described in this embodiment can be combined as appropriate with any of the methods and structures described in the other embodiments.

Embodiment 4

In this embodiment, examples of an electronic appliance in which the semiconductor device obtained according to the above embodiment is mounted are described with reference to FIGS. 32A to 32F. The semiconductor device obtained according to the above embodiment can hold data even without supply of power. In addition, degradation incident to writing and erasing is not caused. Further, operation speed thereof is high. Thus, with the use of the semiconductor device, an electronic appliance having a novel structure can be provided. Note that the semiconductor device according to the above embodiment is integrated and mounted on a circuit board or the like to be mounted on an electronic appliance.

Figure 32A:
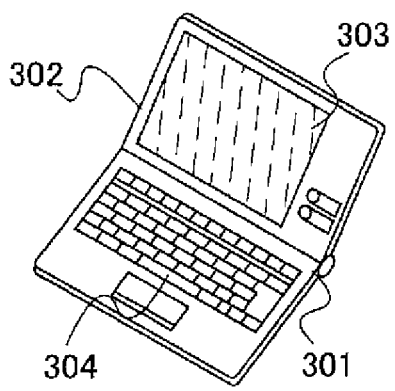
FIGS. 32A to 32F are each a view for illustrating an electronic device using a semiconductor device.

FIG. 32A illustrates a laptop personal computer which includes the semiconductor device according to the above embodiment and includes a main body 301, a housing 302, a display portion 303, a keyboard 304, and the like. When the semiconductor device according to an embodiment of the present invention is applied to the laptop personal computer, data can be held even without supply of power. In addition, degradation incident to writing and erasing is not caused. Further, operation speed thereof is high. Thus, it is preferable that the semiconductor device according to an embodiment of the present invention be applied to the laptop personal computer.

Figure 32D:
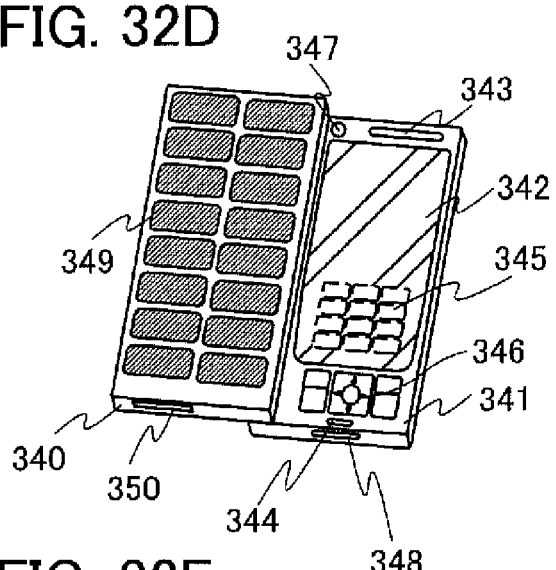
Figure 32B:
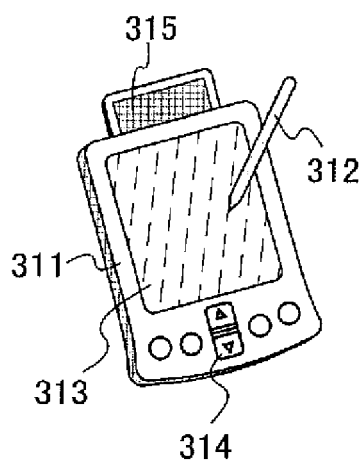

FIG. 32B illustrates a portable information terminal (PDA) which includes the semiconductor device according to the above embodiment and is provided with a main body 311 including a display portion 313, an external interface 315, an operation button 314, and the like. In addition, a stylus 312 is included as an accessory for operation. When the semiconductor device according to an embodiment of the present invention is applied to the PDA, data can be held even without supply of power. In addition, degradation incident to writing and erasing is not caused. Further, operation speed thereof is high. Thus, it is preferable that the semiconductor device according to an embodiment of the present invention be applied to the PDA.

Figure 32E:
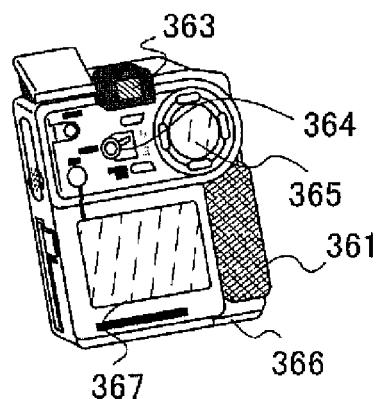
Figure 32C:
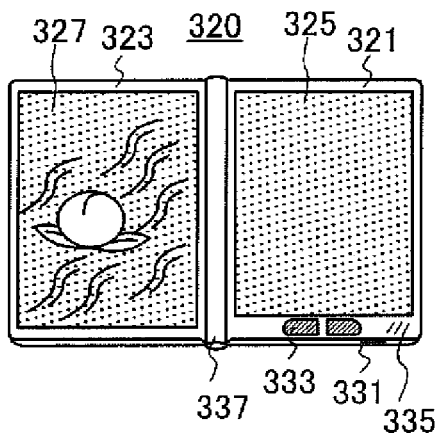

FIG. 32C illustrates an e-book reader 320 as an example of electronic paper including the semiconductor device according to the above embodiment. The e-book reader 320 includes two housings, a housing 321 and a housing 323. The housing 321 and the housing 323 are combined with a hinge 337 so that the e-book reader 320 can be opened and closed with the hinge 337 as an axis. With such a structure, the e-book reader 320 can be used like a paper book. When the semiconductor device according to an embodiment of the present invention is applied to the electronic paper, data can be held even without supply of power. In addition, degradation incident to writing and erasing is not caused. Further, operation speed thereof is high. Thus, it is preferable that the semiconductor device according to an embodiment of the present invention be applied to the electronic paper.

A display portion 325 is incorporated in the housing 321 and a display portion 327 is incorporated in the housing 323. The display portion 325 and the display portion 327 may display one image, or may display different images. When the display portions 325 and 327 display different images, for example, a display portion on the right side (the display portion 325 in FIG. 32C) can display text and a display portion on the left side (the display portion 327 in FIG. 32C) can display graphics.

FIG. 32C illustrates an example in which the housing 321 is provided with an operation portion and the like. For example, the housing 321 is provided with a power button 331, operation keys 333, a speaker 335, and the like. Pages can be turned with the operation keys 333. Note that a keyboard, a pointing device, or the like may also be provided on the surface of the housing, on which the display portion is provided. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Further, the e-book reader 320 may have a function of an electronic dictionary.

The e-book reader 320 may be configured to transmit and receive data wirelessly. Through wireless communication, desired book data or the like can be purchased and downloaded from an e-book server.

Note that the electronic paper can be applied to an electronic appliance in any field which can display information. For example, the electronic paper can be used for posters, advertisements in vehicles such as trains, display in a variety of cards such as credit cards, and the like in addition to e-book readers.

FIG. 32D illustrates a mobile phone including the semiconductor device according to the above embodiment. The mobile phone includes two housings, the housing 340 and the housing 341. The housing 341 includes a display panel 342, a speaker 343, a microphone 344, a pointing device 346, a camera lens 347, an external connection terminal 348, and the like. The housing 340 includes a solar cell 349 for charging the mobile phone, an external memory slot 350, and the like. In addition, an antenna is incorporated in the housing 341. When the semiconductor device according to an embodiment of the present invention is applied to the mobile phone, data can be held even without supply of power. In addition, degradation incident to writing and erasing is not caused. Further, operation speed thereof is high. Thus, it is preferable that the semiconductor device according to an embodiment of the present invention be applied to the mobile phone.

The display panel 342 is provided with a touch panel function. A plurality of operation keys 345 which are displayed as images is illustrated by dashed lines in FIG. 32D. Note that the mobile phone includes a boosting circuit for raising a voltage output from the solar cell 349 to a voltage which is necessary for each circuit. Further, in addition to the above structure, a structure in which a noncontact IC chip, a small recording device, or the like is incorporated may be employed.

A display direction of the display panel 342 is appropriately changed in accordance with the usage mode. Further, the camera lens 347 is provided on the same surface as the display panel 342, and thus it can be used as a video phone. The speaker 343 and the microphone 344 can be used for videophone, recording, playback, and the like without being limited to verbal communication. Moreover, the housings 340 and 341 in a state where they are developed as illustrated in FIG. 32D can be slid so that one is lapped over the other; therefore, the size of the mobile phone can be reduced, which makes the mobile phone suitable for being carried.

The external connection terminal 348 can be connected to various kinds of cables such as an AC adapter or a USB cable, which enables charging and data communication. Moreover, by inserting a recording medium into the external memory slot 350, the mobile phone can deal with storing and moving a large capacity of data. Further, in addition to the above functions, an infrared communication function, a television reception function, or the like may be provided.

FIG. 32E illustrates a digital camera including the semiconductor device according to the above embodiment. The digital camera includes a main body 361, a display portion (A) 367, an eyepiece 363, an operation switch 364, a display portion (B) 365, a battery 366, and the like. When the semiconductor device according to an embodiment of the present invention is applied to the digital camera, information can be held even without supply of power. In addition, degradation incident to writing and erasing is not caused. Further, operation speed thereof is high. Thus, it is preferable that the semiconductor device according to an embodiment of the present invention be applied to the digital camera.

Figure 32F:
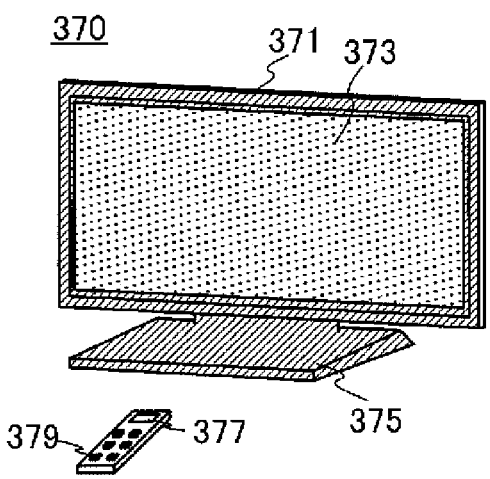

FIG. 32F illustrates a television set including the semiconductor device according to the above embodiment. In the television set 370, a display portion 373 is incorporated in a housing 371. The display portion 373 can display an image. Here, the housing 371 is supported by a stand 375.

The television set 370 can be operated by an operation switch of the housing 371 or a separate remote controller 380. Channels and volume can be controlled by an operation key 379 of the remote controller 380 so that an image displayed on the display portion 373 can be controlled. Furthermore, the remote controller 380 may be provided with a display portion 377 for displaying information output from the remote controller 380. When the semiconductor device according to an embodiment of the present invention is applied to the television set, information can be held even without supply of power. In addition, degradation incident to writing and erasing is not caused. Further, operation speed thereof is high. Thus, it is preferable that the semiconductor device according to an embodiment of the present invention be applied to the television set.

Note that the television set 370 is preferably provided with a receiver, a modem, and the like. With the receiver, a general television broadcast can be received. Furthermore, when the television set 370 is connected to a communication network by wired or wireless connection via the modem, one-way (from a transmitter to a receiver) or two-way (between a transmitter and a receiver, between receivers, or the like) information communication can be performed.

The methods and structures described in this embodiment can be combined as appropriate with any of the methods and structures described in the other embodiments.

This application is based on Japanese Patent Application serial no. 2009-255536 filed with Japan Patent Office on Nov. 6, 2009 and Japanese Patent Application serial no. 2009-264572 filed with Japan Patent office on Nov. 20, 2009, the entire contents of which are hereby incorporated by reference.

EXPLANATION OF REFERENCE

100: substrate, 102: protective layer, 104: semiconductor region, 106: element isolation insulating layer, 108: gate insulating layer, 110: gate electrode, 112: insulating layer, 114: impurity region, 116: channel formation region, 118: sidewall insulating layer, 120: high-concentration impurity region, 122: metal layer, 124: metal compound region, 126: interlayer insulating layer, 128: interlayer insulating layer, 130a: source or drain electrode, 130b: source or drain electrode, 130c: electrode, 132: insulating layer, 134: conductive layer, 136a: electrode, 136b: electrode, 136c: electrode, 136d: gate electrode, 138: gate insulating layer, 140: oxide semiconductor layer, 142a: source or drain electrode, 142b: source or drain electrode, 144: protective insulating layer, 146: interlayer insulating layer, 148: conductive layer, 150a: electrode, 150b: electrode, 150c: electrode, 150d: electrode, 150e: electrode, 152: insulating layer, 154a: electrode, 154b: electrode, 154c: electrode, 154d: electrode, 160: transistor, 162: transistor, 200: memory cell, 201: transistor, 202: transistor, 203: transistor, 204: capacitor, 205: capacitor, 210: memory cell array, 211: reading circuit, 212: driver circuit for a first signal line, 213: driver circuit for a second signal line and a word line, 214: potential generating circuit, 215: transistor, 216: driver circuit for a selection line, 217: driver circuit for a source line, 219: boosting circuit, 240: memory cell, 250: memory cell array, 251: reading circuit, 252: driver circuit for a first signal line, 253: driver circuit for a second signal line and a word line, 254: potential generating circuit, 255: transistor, 256: driver circuit for a selection line, 257: bias circuit, 301: main body, 302: housing, 303: display portion, 304: keyboard, 311: main body, 312: stylus, 313: display portion, 314: operation button, 315: external interface, 320: e-book reader, 321: housing, 323: housing, 325: display portion, 327: display portion, 331: power button, 333: operation key, 335: speaker, 337: hinge, 340: housing, 341: housing, 342: display panel, 343: speaker, 344: microphone, 345: operation key, 346: pointing device, 347: camera lens, 348: external connection terminal, 349: solar cell, 350: external memory slot, 361: main body, 363: eyepiece, 364: operation switch, 365: display portion (B), 366: battery, 367: display portion (A), 370: television set, 371: housing, 373: display portion, 375: stand, 377: display portion, 379: operation key, 380: remote controller, 402: first diode, 404: second diode, 406: third diode, 408: fourth diode, 410: fifth diode, 412: first capacitor, 414: second capacitor, 416: third capacitor, 418: fourth capacitor, 420: fifth capacitor.

The invention claimed is:

1. A semiconductor device comprising:
   a source line;
   a bit line;
   a first signal line;
   a plurality of second signal lines;
   a plurality of word lines;
   a plurality of memory cells connected in series between the source line and the bit line;
   a first driver circuit configured to drive the plurality of second signal lines and the plurality of word lines in such a manner that a memory cell is selected from the plurality of memory cells in accordance with an address signal input to the first driver circuit,
   a second driver circuit configured to select and output any of a plurality of writing potentials to the first signal line;
   a reading circuit supplied with a potential of the bit line and a plurality of reference potentials and comparing the potential of the bit line and the plurality of reference potentials to read data; and
   a potential generating circuit generating the plurality of writing potentials and the plurality of reference potentials and supplying the plurality of writing potentials and the plurality of reference potentials to the second driver circuit and the reading circuit,
   wherein one of the plurality of memory cells comprises:
      a first transistor including a first gate electrode, a first source electrode, and a first drain electrode;

a second transistor including a second gate electrode, a second source electrode, and a second drain electrode; and a third transistor including a third gate electrode, a third source electrode, and a third drain electrode, wherein the first transistor is provided over a substrate containing a semiconductor material, wherein the second transistor includes an oxide semiconductor layer, and wherein the first gate electrode and one of the second source electrode and the second drain electrode are electrically connected to each other, wherein the source line, the first source electrode, and the third source electrode are electrically connected to one another, wherein the bit line, the first drain electrode, and the third drain electrode are electrically connected to one another, wherein the first signal line and the other of the second source electrode and the second drain electrode are electrically connected to each other, wherein one of the plurality of second signal lines and the second gate electrode are electrically connected to each other, and wherein one of the plurality of word lines and the third gate electrode are electrically connected to each other.

2. The semiconductor device according to claim 1 further comprising a capacitor electrically connected to the first gate electrode and the one of the second source electrode and the second drain electrode.

3. A semiconductor device comprising:
a source line;
a bit line;
a first signal line;
a plurality of second signal lines;
a plurality of word lines;
a plurality of memory cells connected in series between the source line and the bit line;
a first driver circuit configured to drive the plurality of second signal lines and the plurality of word lines in such a manner that a memory cell is selected from the plurality of memory cells in accordance with an address signal input to the first driver circuit and any of a plurality of reference potentials input to the first driver circuit is selected and output to one selected word line;
a second driver circuit configured to select and output any of a plurality of writing potentials to the first signal line;
a reading circuit connected to the bit line configured to read data by reading conductance of the selected memory cell; and
a potential generating circuit generating the plurality of writing potentials and the plurality of reference potentials and supplying the plurality of writing potentials and the plurality of reference potentials to the second driver circuit,
wherein one of the plurality of memory cells comprises:
a first transistor having a first gate electrode, a first source electrode, and a first drain electrode;
a second transistor having a second gate electrode, a second source electrode, and a second drain electrode; and
a capacitor,
wherein the first transistor is provided over a substrate containing a semiconductor material,
wherein the second transistor includes an oxide semiconductor layer, and wherein the first gate electrode, one of the second source electrode and the second drain electrode, and one of electrodes of the capacitor are electrically connected to one another, wherein the source line and the first source electrode are electrically connected to each other, wherein the bit line and the first drain electrode are electrically connected to each other, wherein the first signal line and the other of the second source electrode and the second drain electrode are electrically connected to each other, wherein one of the plurality of second signal lines and the second gate electrode are electrically connected to each other, and wherein one of the plurality of word lines and the other of the electrodes of the capacitor are electrically connected to each other.

4. The semiconductor device according to claim 1 further comprising a boosting circuit supplying a potential to the potential generating circuit.

5. The semiconductor device according to claim 3 further comprising a boosting circuit supplying a potential to the potential generating circuit.

6. The semiconductor device according to claim 1 further comprising:
a first selection line;
a second selection line;
a fourth transistor including a fourth gate electrode and being electrically connected to the first selection line at the fourth gate electrode; and
a fifth transistor including a fifth gate electrode and being electrically connected to the second selection line at the fifth gate electrode,
wherein the bit line is electrically connected to the first drain electrode and the third drain electrode through the fourth transistor, and
wherein the source line is electrically connected to the first source electrode and the third source electrode through the fifth transistor.

7. The semiconductor device according to claim 3 further comprising:
a first selection line;
a second selection line;
a third transistor including a third gate electrode and being electrically connected to the first selection line at the third gate electrode; and
a fourth transistor including a fourth gate electrode and being electrically connected to the second selection line at the fourth gate electrode,
wherein the bit line is electrically connected to the first drain electrode through the third transistor, and
wherein the source line is electrically connected to the first source electrode through the fourth transistor.

8. The semiconductor device according to claim 1,
wherein the first transistor comprises:
a channel formation region provided in the substrate containing the semiconductor material;
impurity regions provided with the channel formation region sandwiched therebetween;
a first gate insulating layer over the channel formation region;
the first gate electrode over the first gate insulating layer; and
the first source electrode and the first drain electrode electrically connected to the impurity regions.

9. The semiconductor device according to claim 3,
wherein the first transistor comprises:
- a channel formation region provided in the substrate containing the semiconductor material;
- impurity regions provided with the channel formation region sandwiched therebetween;
- a first gate insulating layer over the channel formation region;
- the first gate electrode over the first gate insulating layer; and
- the first source electrode and the first drain electrode electrically connected to the impurity regions.

10. The semiconductor device according to claim 1,
wherein the second transistor comprises:
- the second gate electrode over the substrate containing the semiconductor material;
- a second gate insulating layer over the second gate electrode;
- the oxide semiconductor layer over the second gate insulating layer; and
- the second source electrode and the second drain electrode electrically connected to the oxide semiconductor layer.

11. The semiconductor device according to claim 3,
wherein the second transistor comprises:
- the second gate electrode over the substrate containing the semiconductor material;
- a second gate insulating layer over the second gate electrode;
- the oxide semiconductor layer over the second gate insulating layer; and
- the second source electrode and the second drain electrode electrically connected to the oxide semiconductor layer.

12. The semiconductor device according to claim 1, wherein the substrate containing the semiconductor material is a single crystal semiconductor substrate or an SOI substrate.

13. The semiconductor device according to claim 3, wherein the substrate containing the semiconductor material is a single crystal semiconductor substrate or an SOI substrate.

14. The semiconductor device according to claim 1, wherein the semiconductor material is silicon.

15. The semiconductor device according to claim 3, wherein the semiconductor material is silicon.

16. The semiconductor device according to claim 1, wherein the oxide semiconductor layer contains an In—Ga—Zn—O-based oxide semiconductor material.

17. The semiconductor device according to claim 3, wherein the oxide semiconductor layer contains an In—Ga—Zn—O-based oxide semiconductor material.

18. The semiconductor device according to claim 1, wherein the oxide semiconductor layer contains a crystal of $In_2Ga_2ZnO_7$.

19. The semiconductor device according to claim 3, wherein the oxide semiconductor layer contains a crystal of $In_2Ga_2ZnO_7$.

20. The semiconductor device according to claim 1, wherein hydrogen concentration of the oxide semiconductor layer is less than or equal to $5 \times 10^{19}$ atoms/cm$^3$.

21. The semiconductor device according to claim 3, wherein hydrogen concentration of the oxide semiconductor layer is less than or equal to $5 \times 10^{19}$ atoms/cm$^3$.

22. The semiconductor device according to claim 1, wherein off-state current of the second transistor is less than or equal to $1 \times 10^{-13}$ A.

23. The semiconductor device according to claim 3, wherein off-state current of the second transistor is less than or equal to $1 \times 10^{-13}$ A.

* * * * *

UNITED STATES PATENT AND TRADEMARK OFFICE
CERTIFICATE OF CORRECTION

PATENT NO. : 8,363,452 B2
APPLICATION NO. : 12/917564
DATED : January 29, 2013
INVENTOR(S) : Shunpei Yamazaki et al.

It is certified that error appears in the above-identified patent and that said Letters Patent is hereby corrected as shown below:

In the Specifications:

Column 13, line 9, replace "1306" with --130b--; and

Column 42, line 11, replace "V" with --$V_S$--.

Signed and Sealed this
Fourteenth Day of May, 2013

Teresa Stanek Rea
*Acting Director of the United States Patent and Trademark Office*